(12) United States Patent
Shibayama et al.

(10) Patent No.: US 7,810,740 B2
(45) Date of Patent: Oct. 12, 2010

(54) BACK ILLUMINATED PHOTODIODE ARRAY, MANUFACTURING METHOD AND SEMICONDUCTOR DEVICE THEREOF

(75) Inventors: Katsumi Shibayama, Hamamatsu (JP); Masayuki Ishida, Hamamatsu (JP); Takafumi Yokino, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/715,118

(22) Filed: Nov. 18, 2003

(65) Prior Publication Data
US 2004/0113185 A1   Jun. 17, 2004

Related U.S. Application Data

(60) Provisional application No. 60/430,670, filed on Dec. 4, 2002.

(30) Foreign Application Priority Data
Nov. 18, 2002   (JP) .......................... P2002-334326

(51) Int. Cl.
*H01L 27/15* (2006.01)
(52) U.S. Cl. ..................... 237/70; 257/98; 250/370.11
(58) Field of Classification Search .............. 378/19, 378/98.8; 257/79, 88; 250/370.11, 370.09
See application file for complete search history.

(56) References Cited

U.S. PATENT DOCUMENTS

| 4,814,847 | A | 3/1989 | Tabatabaie | 357/30 |
| 6,426,991 | B1 | 7/2002 | Mattson et al. | 378/19 |
| 6,510,195 | B1* | 1/2003 | Chappo et al. | 378/19 |
| 6,819,378 | B2* | 11/2004 | Yamazaki et al. | 349/113 |
| 2002/0011640 | A1* | 1/2002 | Bauer et al. | 257/443 |

FOREIGN PATENT DOCUMENTS

| EP | 1 548 836 | 6/2005 |
| JP | 64-061964 | 3/1989 |
| JP | 02-065181 | 3/1990 |
| JP | 05-150049 | 6/1993 |
| JP | 07-333348 | 12/1995 |
| JP | 10-223873 | 8/1998 |
| JP | 2000-138365 | 5/2000 |
| JP | 2001-291892 | 10/2001 |

OTHER PUBLICATIONS

B.F. Levine et al., 20 GHz high performance planar Si/InGaAs p-i-n photodetector, *Applied Physics Letters*, AIP, American Institute of Physics, Melville, NY, vol. 70, No. 18, May 5, 1997, pp. 2449-2451.
Office Action in a Related Korean Application, dated Mar. 23, 2010, 5 pages.

* cited by examiner

*Primary Examiner*—Long Pham
*Assistant Examiner*—Steven H Rao
(74) *Attorney, Agent, or Firm*—Drinker Biddle & Reath LLP

(57) ABSTRACT

A plurality of the recessed portions are formed in an array on the opposite surface side of the semiconductor substrate and a second conductive type semiconductor region composed of a second conductive type semiconductor is formed at bottoms of a plurality of the recessed portions to obtain photodiode arrays arranged in an array.

27 Claims, 42 Drawing Sheets

US 7,810,740 B2

BACK ILLUMINATED PHOTODIODE ARRAY, MANUFACTURING METHOD AND SEMICONDUCTOR DEVICE THEREOF

CROSS-REFERENCE TO RELATED APPLICATION

This application claims priority to Provisional Application Ser. No. 60/430,670 filed Dec. 4, 2002, which is hereby incorporated by reference in its entirety.

BACKGROUND OF THE INVENTION

1. Field of the Invention

The present invention relates to a back illuminated photodiode array, the manufacturing method and semiconductor device such as a radiation detector provided with back illuminated photodiode arrays.

2. Related Background Art

A CT (computed tomography) device is provided with a plurality of back illuminated photodiode arrays. A back illuminated photodiode array can be increased in the density per unit area when an electronic circuit for the back illuminated photodiode array is placed in an extended thickness direction of a semiconductor substrate in arranging a plurality of back illuminated photodiode arrays.

More particularly, when back illuminated photodiode arrays for CT are mounted, they must be mounted in a three dimensional manner. Thus, in mounting the arrays in a three dimensional manner, an output signal must be output from the surface opposite to the light-incident surface.

A back illuminated photodiode array is provided with a semiconductor substrate having a back surface acting as a light-incident surface, a plurality of pn junctions formed inside the semiconductor substrate and an electrode formed on the front surface of the semiconductor substrate.

Carriers generated inside the semiconductor substrate move toward each pn junction and is taken out through the electrode. In this instance, where a distance is great between each pn junction and the light-incident surface, a carriers generated inside the semiconductor substrate undergo recombination during a transferring process to the pn junction and cannot be taken out as a signal. Therefore, it is preferable to maintain as small as possible a distance between the pn junction and the light-incident surface.

FIG. 42 is a schematic view showing the cross sectional configuration of a conventional back illuminated photodiode array.

The back illuminated photodiode array has been described, for example, in Japanese Unexamined Patent Publication No. 7-333348. This back illuminated photodiode array is provided with a rectangular column-shaped p-type diffusion region 105 formed inside an n-type semiconductor substrate, and a p-type diffusion region 105 extends in the direction from the front surface of the semiconductor substrate to the back surface. Therefore, a boundary surface (pn junction) with the p-type diffusion region 105 and n-type layer 103 is closer to the back surface (light-incident surface) of the semiconductor substrate, thereby making smaller the distance between the light-incident surface and the pn junction.

SUMMARY OF THE INVENTION

However, since the p-type diffusion region 105 is formed by injecting impurities, it is difficult to form the p-type diffusion region 105 uniformly until such thickness can be obtained that provides a sufficient sensitivity. Thus, a drawback resulted in that it was difficult to manufacture the above-described back illuminated photodiode array.

The invention has been carried out in consideration of the problems and to provide a back illuminated photodiode array that can be manufactured easily while a high detection sensitivity is maintained, the manufacturing method and semiconductor device such as a radiation detector. In order to solve the above-described problems, the back illuminated photodiode array of the invention is provided with a first conductive type semiconductor substrate (for example, n-type) having a light-incident surface (back surface) and an opposite surface positioned on the opposite side of the light-incident surface and having a plurality of recessed portions as well as a plurality of second conductive type (for example, p-type) semiconductor regions (semiconductor layers) separated spatially at each bottom of the recessed portions. Furthermore, the junction is composed from the second conductive type semiconductor region and the first conductive type semiconductor substrate.

Since the back illuminated photodiode array of the invention is provided with the second conductive type semiconductor regions at the bottom of the recessed portions formed on an opposite surface, it is possible to make a distance between the light-incident surface of the semiconductor substrates and the semiconductor regions shorter, thereby it is possible to inhibit a phenomenon that a carrier generated by incident light that undergoes recombination during a transferring process, then a higher detection sensitivity is kept on. Furthermore, the recessed portions can be formed in an array.

Semiconductor substrate regions between a plurality of recessed portions constitute a frame part having a greater thickness than the recessed portions. In other words, a plurality of recessed portions are formed in an array on the opposite surface to the semiconductor substrates, and, therefore, each recessed portion is surrounded by the semiconductor substrates (frame part) which are thicker than the semiconductor substrates of the recessed portion. The presence of the frame part makes the mechanical strength sufficiently practical for the back illuminated photodiode array.

In addition, the semiconductor substrate may be made with a single semiconductor substrate, which can be manufactured easily since a plurality of semiconductor substrates are not needed.

However, where a semiconductor substrate is provided with a first semiconductor substrate having a light-incidence surface and a second semiconductor substrate which is bonded to the first semiconductor substrate and has side walls of the recessed portions, the first and second semiconductor substrates can be selected to make a precise formation of the recessed portions.

More particularly, a distance between the light-incident surface and the second conductive type semiconductor region, i.e., the surface where photodiodes are arranged is determined by the thickness of the first semiconductor substrate. Since the first semiconductor substrate can be made thinner by the existence of the frame part surrounded by the recessed portions, while it keeps the mechanical strength carrier generated inside the semiconductor substrate will move at a shorter distance. Thus, the recombination of carriers are inhibited to maintain a higher detection sensitivity of the back illuminated photodiode array.

A single first semiconductor substrate would not give sufficient mechanical strength to the back illuminated photodiode array. Therefore, the first semiconductor substrate is bonded with the second semiconductor substrate, together with necessary and sufficient etching, thereby allowing the second conductive type semiconductor regions to expose and surround the second conductive type semiconductor regions with a frame part composed of second semiconductor substrates to give a mechanical strength sufficiently practical to the back illuminated photodiode array.

Furthermore, since the second conductive type semiconductor regions can be made thinner than semiconductor regions produced by the above conventional method, the second conductive type semiconductor regions can be made easily by diffusion of second conductive type impurities. Therefore, back illuminated photodiode arrays can be made more easily and more precisely than those by the conventional method.

Where a back illuminated photodiode array has an additional etching stop layer or an additional insulation layer, which is between a first semiconductor substrate and a second semiconductor substrate, and which has resistance to a specific etching agent in relation to the second semiconductor substrate, these layers will stop the progress of etching. Therefore, depth of the recessed portions can be controlled precisely.

In other words, it is preferable that a semiconductor substrate has an etching stop layer or an insulation layer at a certain depth from the opposite surface and the recessed portions are formed by etching the semiconductor substrate at least up to the etching stop layer or the insulation layer from the opposite surface. Herein, depth of the recessed portions can be controlled easily since etching can be stopped on the etching stop layer or the insulation layer when the recessed portions are formed.

When a back illuminated photodiode array is mounted on a wiring board, the semiconductor substrate may easily undergo mechanical damage. However, where back illuminated photodiode arrays are provided with a plurality of electrode pads at the top surface of the frame part electrically and individually connected to the second conductive semiconductor regions, these back illuminated photodiode arrays are less likely to undergo breakage. Namely, the frame part is high in mechanical strength, and even where stress is given to the electrode pads in connection to a wiring board (on mounting), these back illuminated photodiode arrays are less likely to undergo breakage.

Furthermore, since the back illuminated photodiode array and the wiring board are electrically connected with electrode pads, it is possible to take out detected signals from the back illuminated photodiode array through the wiring board.

Such connection can be made by several methods. One method is to use a back illuminated photodiode array that is additionally provided with an electric insulation layer made on a frame part and a conductive member that is made on the electric insulation layer and electrically connects a second conductive type semiconductor region with an electrode pad. The electric insulation layer maintains a conductive member and a coated substrate in an electrically isolated state, and the conductive member connects the electrode pad with the second conductive type semiconductor region. Such connection can eliminate the necessity for forming electrode pads at recessed portions lower in mechanical strength, thus making it possible to protect the bottom of the recessed portions from mechanical damage.

It is also preferable that an electric insulation layer is provided with a contact hole for connecting an end of the conductive member with a second conductive type semiconductor region. The conductive member extends from an electrode pad to a vicinity of the second conductive type semiconductor region in a state where insulation with the substrate is achieved, connecting with the second conductive type semiconductor region through the contact hole. Signals from photodiodes are transmitted from the second conductive type semiconductor region to the electrode pad through a conductive member (for example, aluminum wiring, etc.) and output through the electrode pad.

Furthermore, it is preferable that the second conductive type semiconductor region extends from the bottom to the side surface of the recessed portions. Namely, the second conductive type semi conductor region is provided in a manner extended from the bottom to a border area between the recessed portions and the frame part. In this instance, extension to the side surface of the recessed portion makes the area larger. Thus, an area for receiving a carrier generated inside the semiconductor substrate is enlarged, thus giving a higher detection sensitivity to the photodiode.

In addition, such a configuration makes it possible to extend the second conductive type semiconductor region up to a border area (edge area) between the recessed portions and the frame part. This border area easily undergoes stress on etching for forming the recessed portions. The frame part projected convexly also easily undergoes mechanical damage on mounting, resulting in a source of an unnecessary carrier.

Since the second conductive type semiconductor region is provided in a manner extended up to a border area, it is possible to trap an unnecessary carrier at the second conductive type semiconductor region.

Furthermore, since in this configuration a conductive member that electrically connects an electrode pad with a second conductive type semiconductor region may be provided only in the frame part, the recessed portions low in mechanical strength can be protected and a step for forming a conductive member can be facilitated.

In addition, it is preferable that the second conductive type semiconductor region extend from the bottom over the side surface of the recessed portions up to the top surface of the frame part. Namely, the second conductive type semiconductor region reaches a part of the frame part.

In this instance, a back illuminated photodiode array is provided with an electric insulation layer made on the frame part and having a contact hole opposing the top surface as well as an electrode pad electrically connected to the second conductive type semiconductor region through the contact hole. Such a configuration makes it possible to electrically connect the second conductive type semiconductor region with the electrode pad at the top surface of the frame part, thereby eliminating the necessity for providing wiring to the bottom or side walls of the recessed portions. Namely, the wiring step can be simplified since it is sufficient to provide wiring to the frame part alone. It is also preferable that the frame part has a first conductive type separation region higher in concentration of impurity than the semiconductor substrate. Such a configuration can cause an electric separation among photodiodes formed in the recessed portions, thereby making it possible to reduce cross talk among the photodiodes.

It is preferable that an opening size of the recessed portions is smaller at a deeper position of the recessed portions. In other words, the recessed portions are formed so that the opening is gradually reduced in size from the opposite surface to the light-incident surface. Such a configuration makes it possible that a slant surface crossing at a slant angle to the bottom is formed on the side surface of the recessed portions. Therefore, the semiconductor region and the second conductive type conductive member can be easily formed on the side surface of the recessed portions.

It is preferable that the light-incident surface of the semiconductor substrate is provided with a first conductive type accumulation layer which is higher in impurity concentration than the semiconductor substrate. Such a configuration makes it possible to inhibit a signal carrier generated in the vicinity of the light-incident surface from being trapped at a boundary surface with an AR coat since light (in particular, short-wavelength light) is made incident on the light-incident surface of the semiconductor substrate. Thus, a high detection sensitivity is given to the back illuminated photodiode array.

Furthermore, it is preferable that surfaces wherein a first semiconductor substrate and a second semiconductor substrate oppose each other are different in crystal plane orientation. In this instance, since etching speed for forming the recessed portions varies depending on the plane orientation, the recessed portions can be precisely controlled for depth.

In other words, two semiconductor substrates have the different crystal orientations between a part of the light-incidence surface, which is of a first semiconductor substrate and a part of the opposite surface, which os of a second semiconductor substrate, at a certain depth from the opposite surface, and the recessed portions are formed by etching the semiconductor substrate to an extent that a surface, wherein the crystal orientation is different is least exposed from the opposite surface. When etching can be stopped on a surface wherein crystal orientation is different and the recessed portions are formed, thereby easily controlling the depth of the recessed portions.

The semiconductor device of the invention comprises the above-mentioned back illuminated photodiode array and wiring board supporting the back illuminated photodiode array, wherein wiring board is electrically connected with the back illuminated photodiode array through electrode pads.

In this instance, detected signals from the electrode pads can be transmitted to the wiring board.

The semiconductor device of the invention such as a radiation detector comprises a scintillator placed on the light-incident surface side of a semiconductor substrate. In this instance, since the scintillator is placed on the light-incident surface side of the semiconductor substrate, the semiconductor substrate is reinforced mechanically to prevent warp or distortion of the semiconductor substrate. Here, it is preferable that the wiring board is electrically connected to the back illuminated photodiode array through electrode pads made on the frame part. Fluorescences produced at the scintillator are converted into electronic signals through the photodiode array and the electronic signals are transmitted through the electrode pads to the wiring board.

It is also preferable that a space between the wiring board and the opposite surface of the semiconductor substrate is filled with resin or air. Bonding the opposite surface of the semiconductor substrate to the wiring board with resin makes it possible to improve the mechanical strength of the semiconductor substrate, thereby preventing warp or distortion of the semiconductor substrate.

When the space is made between the wiring board and the opposite surface of the semiconductor substrate an air space, the better heat insulation between the wiring board and the semiconductor substrate becomes, thus it is possible to inhibit heat conduction from the board into the semiconductor substrate.

A manufacturing method for the back illuminated photodiode of the invention comprises a step for forming a plurality of recessed portions in an array by thinning the surface opposite to the light-incident surface of a first conductive type semiconductor substrate and a step for forming a second conductive type semiconductor region at the bottom of the recessed portions. It is preferable that a manufacturing method for the semiconductor substrate having first and second semiconductor substrates should include the following steps.

First, the manufacturing method is provided with a step for bonding a first semiconductor substrate to a second semiconductor substrate. As described above, such bonding can attain a precise control of the recessed portions. This manufacturing method is also provided with a step for forming the recessed portions by etching for forming the recessed portion corresponding region on the opposite surface of the second semiconductor substrate.

This step makes it possible to form a plurality of recessed portions in an array on the second semiconductor substrate. Thus, the second conductive type semiconductor region is surrounded with a frame part composed of the second semiconductor substrate to give a mechanical strength sufficiently practical to the back illuminated photodiode array. Furthermore, this method is able to make the second conductive semiconductor region thinner than that attained by conventional methods, then it is possible to form the second conduction semiconductor region easily by thermally diffusing the second conductive type impurity, thus it is possible to manufacture the back illuminated photodiode array more easily.

Etching at the recessed portion formation step will be carried out until an etching stop layer or an insulation layer existing between the first and second semiconductor substrates is exposed, thereby it is possible to precisely control the depth of the etching.

Furthermore, in the above-described bonding step if an etching stop layer is provided between the first semiconductor substrate and the second semiconductor substrate, etching can be stopped on the etching stop layer to easily control the step. In this instance, etching will be carried out until at least the etching stop layer is exposed.

In the above-described bonding step, providing an insulation layer between the first semiconductor substrate and the second semiconductor substrate can complete etching on this insulation layer, thus making it possible to control the step easily. In this instance, etching will be carried out until at least the insulation layer is exposed.

At the bottom of the recessed portions, a second conductive type semiconductor region is formed.

Where the surfaces wherein the first semiconductor substrate and the second semiconductor substrate oppose each other are different in crystal plane orientation, the recessed portion forming step comprises etching which is carried out until at least the surface opposite the first semiconductor substrate is exposed. In this instance, etching depth can be controlled precisely since etching speed varies depending on the crystal plane orientation.

In other words, where both the semiconductor substrates are bonded so that the first semiconductor substrate and the second semiconductor substrate are different for crystal orientation at a bonding step, etching can be stopped on a bonding surface (surface where the crystal orientation is different) of the first semiconductor substrate from the second semiconductor substrate at a step of exposing the second conductive type semiconductor region through etching of the second semiconductor substrate, thus attaining an easy control of the step. The second semiconductor substrate is different in crystal orientation from the first semiconductor substrate and greater in etching speed than the first semiconductor substrate.

Furthermore, a step for forming a second conductive type semiconductor region can be carried out before or after the recessed portion forming step. Namely, a manufacturing method for the back illuminated photodiode array of the invention comprises any one of the following steps: post doping step for forming a second conductive type semiconductor region by doping impurities to the bottom of the recessed portions after the recessed portion forming step, or previous doping step for doping previously impurities to the opposite surface to the first semiconductor substrate before the recessed portion forming step.

A manufacturing method having the previous addition step is provided with a step for preparing the first conductive type first semiconductor substrate formed by arranging a plurality of second conductive type semiconductor regions in an array on the surface opposite to the light-incident surface, a step for bonding the first conductive type second semiconductor substrate to the opposite surface, and a step for exposing the second conductive type semiconductor region by etching an region (recessed portion corresponding region) corresponding to the second conductive type semiconductor region in the second semiconductor substrate.

A manufacturing method for the back illuminated photodiode array is also provided with a step for forming the foregoing accumulation layer higher in impurity concentration than the semiconductor substrate on the light-incident surface. In this instance, the accumulation layer can perform the above function.

DESCRIPTION OF THE PREFERRED EMBODIMENT

The following is an explanation of the embodiments of the present invention. In the following drawings, the same symbols will be provided for the same elements and overlapping description will be omitted.

First Embodiment

Figure 1:
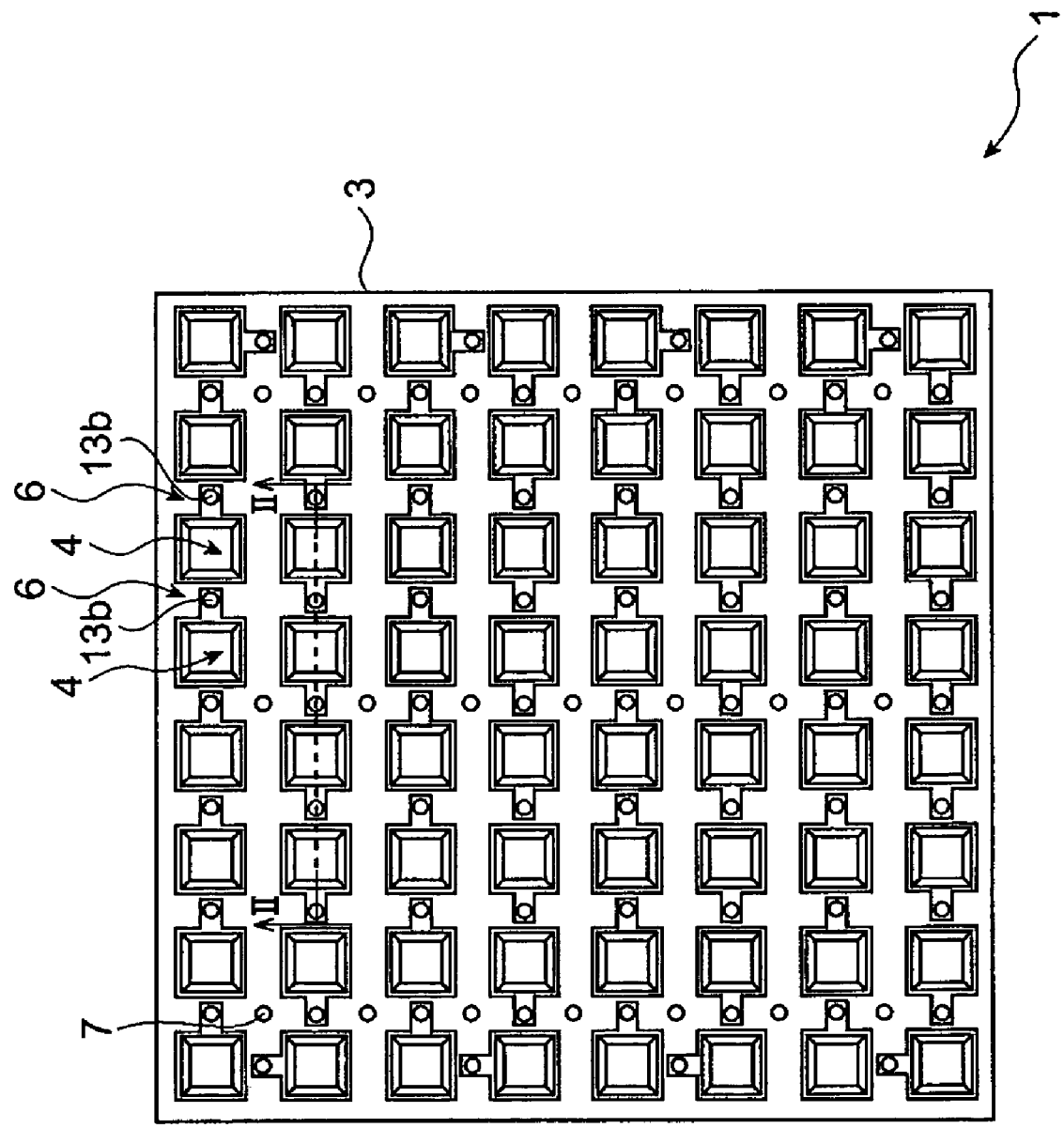
FIG. 1 is a plan view showing the back illuminated photodiode array according to the first embodiment.

FIG. 1 is a plan view showing the back illuminated photodiode array 1 according to the first embodiment. The back illuminated photodiode array 1 is provided with "a light-incidence surface (back surface)" and "an opposite surface (front surface)" at the opposite side of the light-incident surface, and the figure shows the back illuminated photodiode array 1 when viewed from the opposite surface side.

The back illuminated photodiode array 1 is provided with n-type semiconductor substrate 3. The opposite surface of the semiconductor substrate 3 is provided with a plurality of recessed portions 4 which are arranged in a regular array. A region around individual recessed portions 4 in the semiconductor substrate 3 constitute the frame parts 6, and these frame parts 6 support the mechanical strength of the semiconductor substrate 3. At the bottom of individual recessed portions 4, pn junctions are provided. On the individual frame parts 6, provided are electrode pads (bump electrodes) 13b connected electrically with the corresponding pn junctions.

Figure 2:
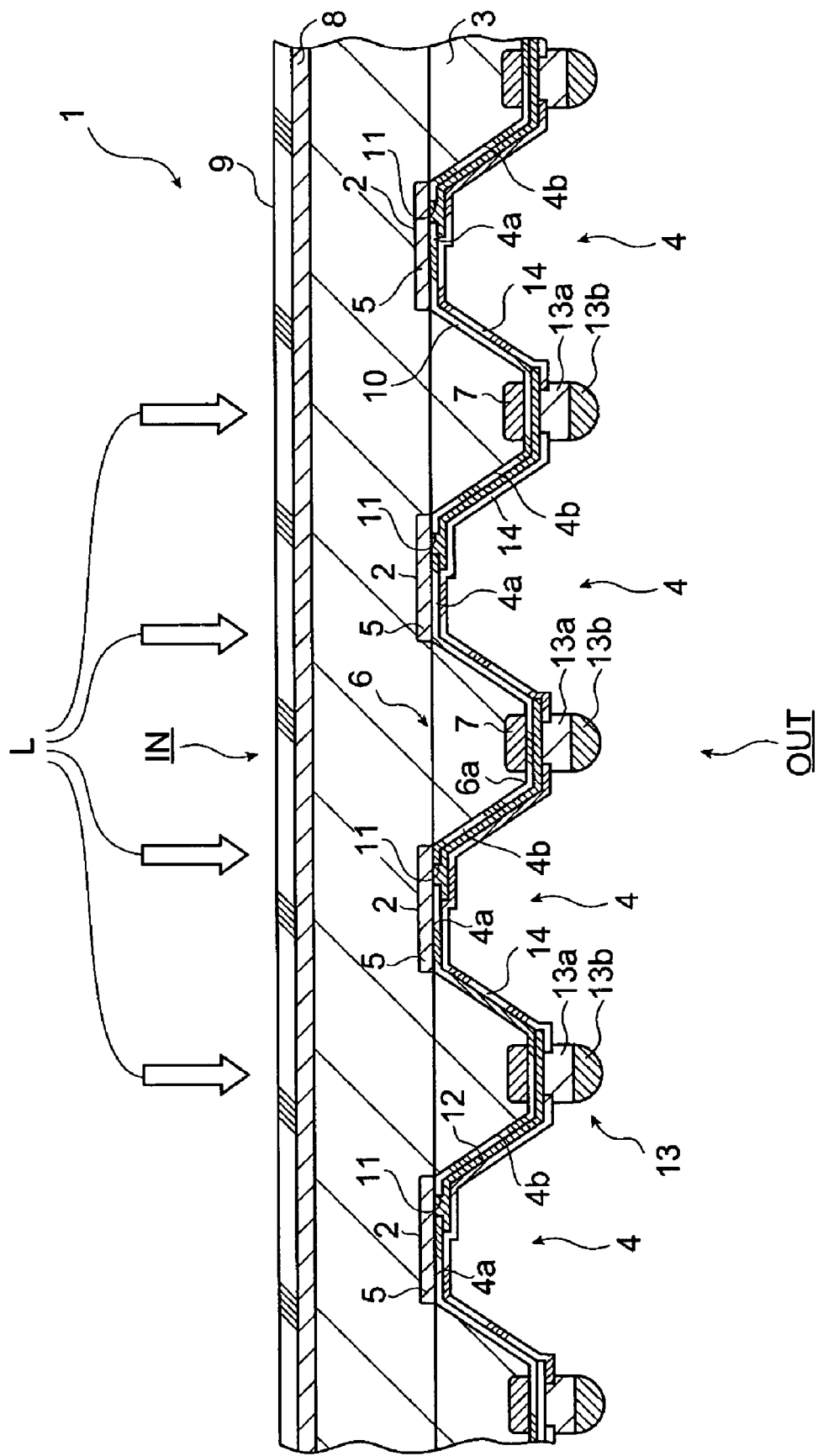
FIG. 2 is a schematic view showing the configuration of cross section taken along line II-II of FIG. 1.

FIG. 2 is a cross sectional view (arrow II-II) of the back illuminated photodiode array 1 shown in FIG. 1. As illustrated in FIG. 2, light L is made incident on the light-incident surface IN of the semiconductor substrate 3 and a carrier generated inside the semiconductor substrate 3 is detected at individual pn junction 2 formed on the opposite surface OUT side.

In other words, pn junctions (photodiodes) 2 are individually formed at each bottom 4a of these recessed portions 4, and these photodiodes are spatially separated. Since the photodiodes are formed at each recessed portion 4, a plurality of photodiodes arranged in a two-dimensional manner constitute the back illuminated photodiode array 1 as a whole.

The semiconductor substrate 3 has an impurity (n-type) a concentration of about $1 \times 10^{12}$ to $1 \times 10^{15}/cm^3$ and with a thickness ranging about 100 to 350 μm.

An accumulation layer 8 is formed on the light-incident surface IN side of the semiconductor substrate 3. The accumulation layer 8 has an n-type impurity concentrations ranging from $1 \times 10^{15}$ to $1 \times 10^{20}/cm^3$. Concentration of the n-type impurity inside the accumulation layer 8 is established higher than that of the n-type impurity of the semiconductor substrate 3.

The thickness of the accumulation layer 8 may be established, for example, to be about 0.1 to several μm.

An anti-reflective (AR) film 9 for inhibiting the reflection of incident light L is formed on the light-incident surface IN side of the semiconductor substrate 3. The AR film 9 coats the accumulation layer 8. As a material for the AR film 9, $SiO_2$ or $SiN_x$ may be used. The AR film 9 may be comprised of a single film of $SiO_2$ or $SiN_x$ or a multi-layer laminated film of these films.

A $p^+$ type impurity diffusion region is formed on the opposite surface OUT side of the semiconductor substrate 3. A plurality of second conductive type semiconductor regions 5 are spatially separated at each bottom 4a of the recessed portions 4.

These recessed portions 4 are provided with an opening, dimension of which is, for example, up to about 1 mm×1 mm, and formed so that the opening can be gradually reduced in size from the opposite surface OUT side to the light-incident surface IN side. In this configuration, the recessed portions 4 have side surfaces 4b. The side surfaces 4b of the recessed portions 4 are slant surfaces, which constitute truncated pyramid, thus making it easy to form a second conductive type semiconductor region 5 along the side surfaces 4b of the recessed portions 4 or form a conductive member on the side surfaces 4b.

The individual recessed portions 4 are 2 μm or greater in depth and spaced, for example, about 1.5 mm apart from an adjacent recessed portion 4. $p^+$ type impurity diffusion region 5 is provided at each bottom 4a of these recessed portions 4, and pn junction (photodiode) 2 is constituted by the boundary surface between $p^+$ type impurity diffusion region (the second conductive type semiconductor region) 5 and n-type-semiconductor substrate (the first conductive type semiconductor substrate) 3.

The concentration of an impurity in $p^+$ type impurity diffusion region 5 ranges about $1 \times 10^{15}$ to $1 \times 10^{20}/cm^3$. In this instance, a distance between the light-incident surface IN of the semiconductor substrate 3 and the above boundary surface of pn junction 2 made at the bottom 4a of the recessed portions 4 is about 10 to 100 μm.

A frame part 6 surrounding the individual recessed portions 4 is thicker than the semiconductor substrate 3 at each bottom 4a of these recessed portions 4. An $n^+$ type separation region 7 that gives an electric separation to each photodiode is provided inside the frame part 6. The concentration of an impurity inside the separation region 7 is set to be about $1 \times 10^{15}$ to $1 \times 10^{20}/cm^3$ and the depth of the separation region 7 is to be, for example, 1 to several μm.

As described above, the $p^+$ type impurity diffusion region 5, the n-type semiconductor substrate 3 and the $n^+$ type accumulation layer 8 are positioned sequentially along the thickness direction of the substrate. The n-type semiconductor substrate 3 is electrically connected with the $n^+$ type separation region 7. Therefore, in order to apply reverse bias voltage to pn junction 2, it is necessary to give a negative potential to the $p^+$ type impurity diffusion region 5 and also give a positive potential to n-type regions having an electrical connection relation with the semiconductor substrate 3 such as the separation region 7 and/or the accumulation layer 8. Furthermore, terms of negative potential and positive potential are used to prescribe a relative potential.

A greater depth of the separation region 7 and an electric connection of the separation region 7 to the accumulation layer 8 allow the semiconductor substrate 3 to function as n-type with low impurity concentrations and also allow the photodiodes to function as PIN photodiodes. In this instance, the PIN photodiodes function better in that additional region is formed uniformly inside the semiconductor substrate 3.

The opposite surface OUT of the semiconductor substrate 3 is covered with an insulation film, $SiO_2$ film (electric insulation layer) 10. An electrode pad 13 for outputting signals outside from the photodiodes is provided on the frame part 6 in a state electrically insulated from the semiconductor substrate 3, that is, through the SiO$_2$ film 10. The electrode pad 13 is composed of under bump metal (hereinafter referred to as UBM) 13a and bump electrode 13b. An aluminum wiring 12 is provided on the SiO$_2$ film 10 made on the opposite surface OUT of the semiconductor substrate 3. The SiO$_2$ film 10 gives electric insulation to the aluminum wiring 12 and the semiconductor substrate 3 in a channel between the p$^+$ type impurity diffusion region 5 and the electrode pad 13.

A contact hole 11 is formed at a part for coating the bottom 4a of the recessed portions 4 at the SiO$_2$ film 10. One end of the aluminum wiring 12 is electrically connected with the p$^+$ type impurity diffusion region 5 through the contact hole 11. The aluminum wiring 12 is provided in a manner extended on a part for covering the bottom 4a and side surface 4b of the recessed portions 4 at the SiO$_2$ film 10, and the other end of the aluminum wiring 12 is electrically connected with the electrode pad 13.

As described above, the aluminum wiring 12 as a conductive member gives an electric connection between the p$^+$ type impurity diffusion region 5 and the electrode pad 13. An electrode for adding bias potential to the n-type semiconductor substrate 3 is also formed on the frame part 6, which is, however, not illustrated.

Except a region where the electrode pad 13 is provided, a passivation film 14 composed of SiO$_2$, SiN$_x$, polyimide, acrylate or epoxy resin is formed on the opposite surface OUT of the semiconductor substrate 3.

Since the back illuminated photodiode array 1 according to the first embodiment is provided with the p$^+$ type impurity diffusion region 5 at the bottom 4a of the recessed portions 4 formed on the opposite surface OUT side, it is possible to make shorter a distance between the light-incident surface IN of the n-type semiconductor substrate 3 and the boundary surface with pn junction 2 of the photodiode (for example, 10 to 100 µm). Therefore, inhibition is provided to a phenomenon that carriers generated by incident light L undergo recombination during a transferring process, thus maintaining a higher detection sensitivity of the back illuminated photodiode array 1.

Furthermore, since the p$^+$ type impurity diffusion region 5 can be made thinner than that produced conventionally, the p$^+$ type impurity diffusion region 5 can be formed easily by various methods such as thermal diffusion and ion implantation of p-type impurities, thus making it possible to manufacture the back illuminated photodiode array 1 more easily than by conventional methods.

Since the frame part 6 is thicker than the n-type semiconductor substrate 3 at the bottom 4a of the recessed portions 4, the back illuminated photodiode array 1 can be given a sufficiently practical mechanical strength.

Furthermore, the presence of the accumulation layer 8 can inhibit carriers generated in the vicinity of light-incident surface from being trapped by the boundary surface with the AR coat, thus allowing the carrier to effectively move toward pn junctions 2. It is therefore possible to maintain a higher detection sensitivity of the back illuminated photodiode array 1. The back illuminated photodiode array 1 has a detection sensitivity that is acceptable for practical use, even when no accumulation layer 8 is provided.

Furthermore, formation of the separation region 7 on the frame part 6 causes an electric separation among photodiodes made on the individual recessed portions 4, resulting in a decrease in cross talk among the photodiodes. Even an absence of the separation region 7 will provide the back illuminated photodiode array 1 with a practical detection sensitivity.

Figure 3:
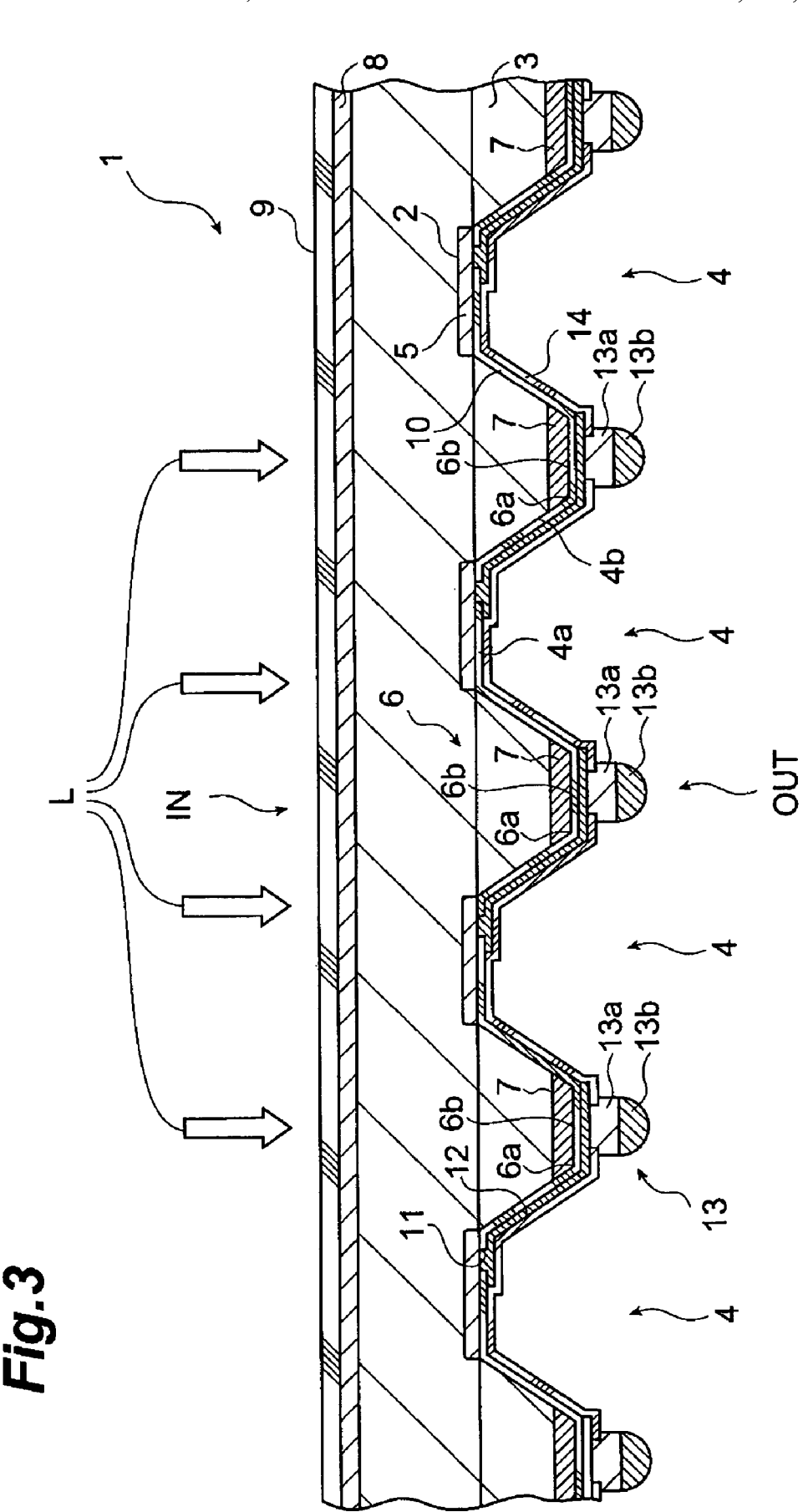
FIG. 3 is a schematic view showing the cross sectional configuration of the first modification example according to the first embodiment.

FIG. 3 is a partially sectional view of the back illuminated photodiode array 1, which is the first modification example of the back illuminated photodiode array 1 according to the first embodiment. In this example, the separation region 7 is provided all along the top surface 6b of the frame part 6.

Where the back illuminated photodiode array 1 is mounted on a circuit board, the frame part 6 may easily undergo a mechanical stress through the electrode pads 13. Furthermore, a border area (hereinafter referred to as edge part 6a) between the recessed portions 4 and the frame part 6 may easily undergo stress on etching for forming the recessed portions 4. Such stress may easily result in production of an unnecessary carrier.

However, where the separation region 7 covers all over the top surface 6b of the frame part 6, that is, the separation region 7 includes the edge part of the frame part 6, the separation region 7 is able to trap the above-described unnecessary carrier resulting from the stress to inhibit production of dark current.

Figure 4:
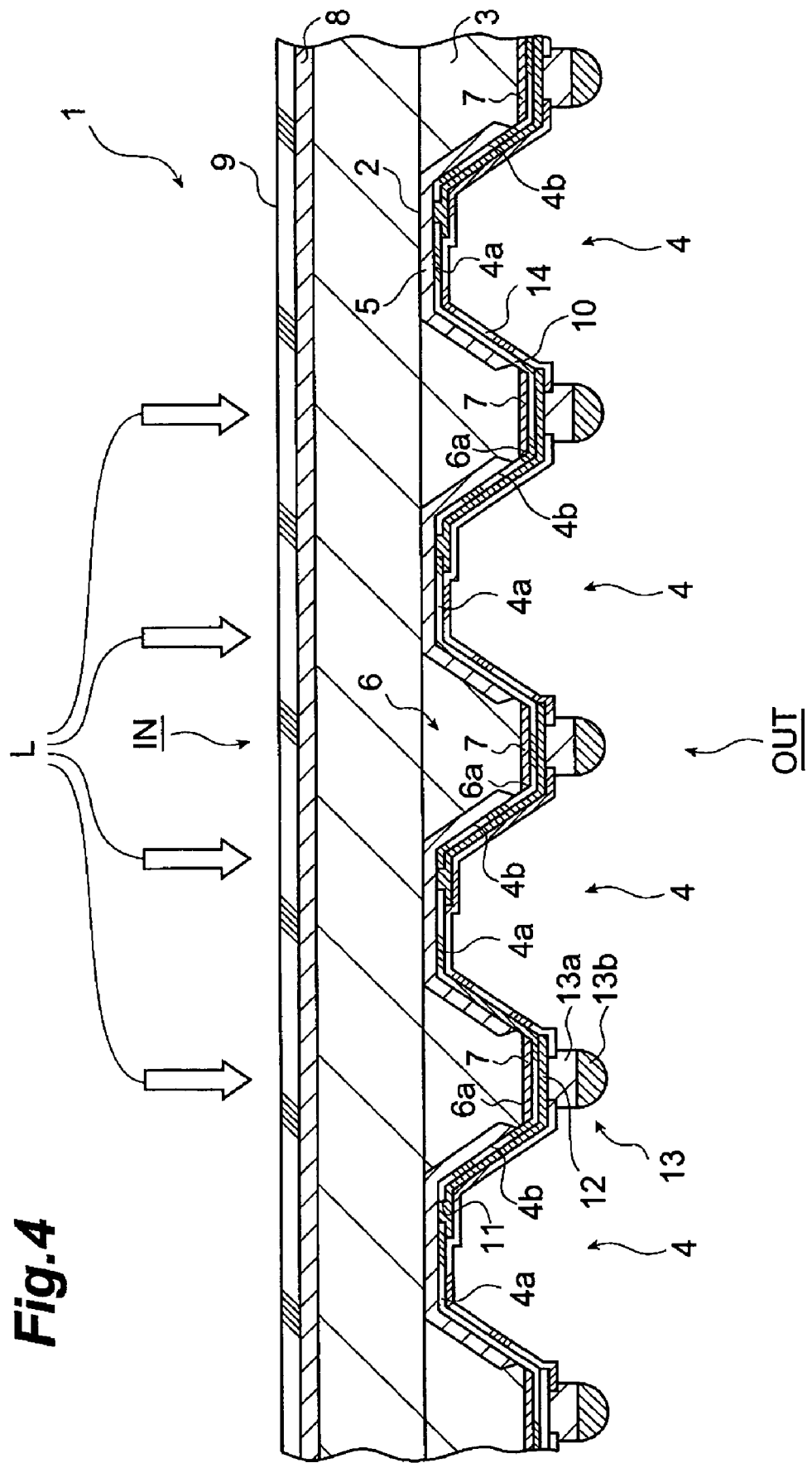
FIG. 4 is a schematic view showing the cross sectional configuration of the second modification example according to the first embodiment.

FIG. 4 is a partially sectional view of the back illuminated photodiode array 1, which is the second modification example of the back illuminated photodiode array 1 according to the first embodiment.

The back illuminated photodiode array 1 according to the second modification example is similar in configuration to the back illuminated photodiode array 1 given in FIG. 3, except for a greater area of the p$^+$ type impurity diffusion region 5. The p$^+$ impurity diffusion region 5 extends up to the side surface 4b of the recessed portions 4 from the bottom 4a of the recessed portions 4 to an extent not to overlap the separation region 7. Namely, the impurity diffusion region 5 is formed also under the side surface (slant surface) 4b of the recessed portions 4.

Since this back illuminated photodiode array 1 can be provided with an enlarged area of the p$^+$ impurity diffusion region 5, an area for receiving carriers generated by incident light L can be enlarged accordingly to increase the detection sensitivity of the photodiodes. As with the first modification example, the separation region 7 traps an unnecessary carrier to inhibit production of dark current. Next, the back illuminated photodiode array 1 according to the first embodiment shown in FIG. 2 will be explained for the manufacturing method by referring to FIG. 5 through FIG. 9. The following steps of (1) through (6) will be carried out sequentially in the manufacturing method.

(1) Substrate Preparing Step

Figure 5:
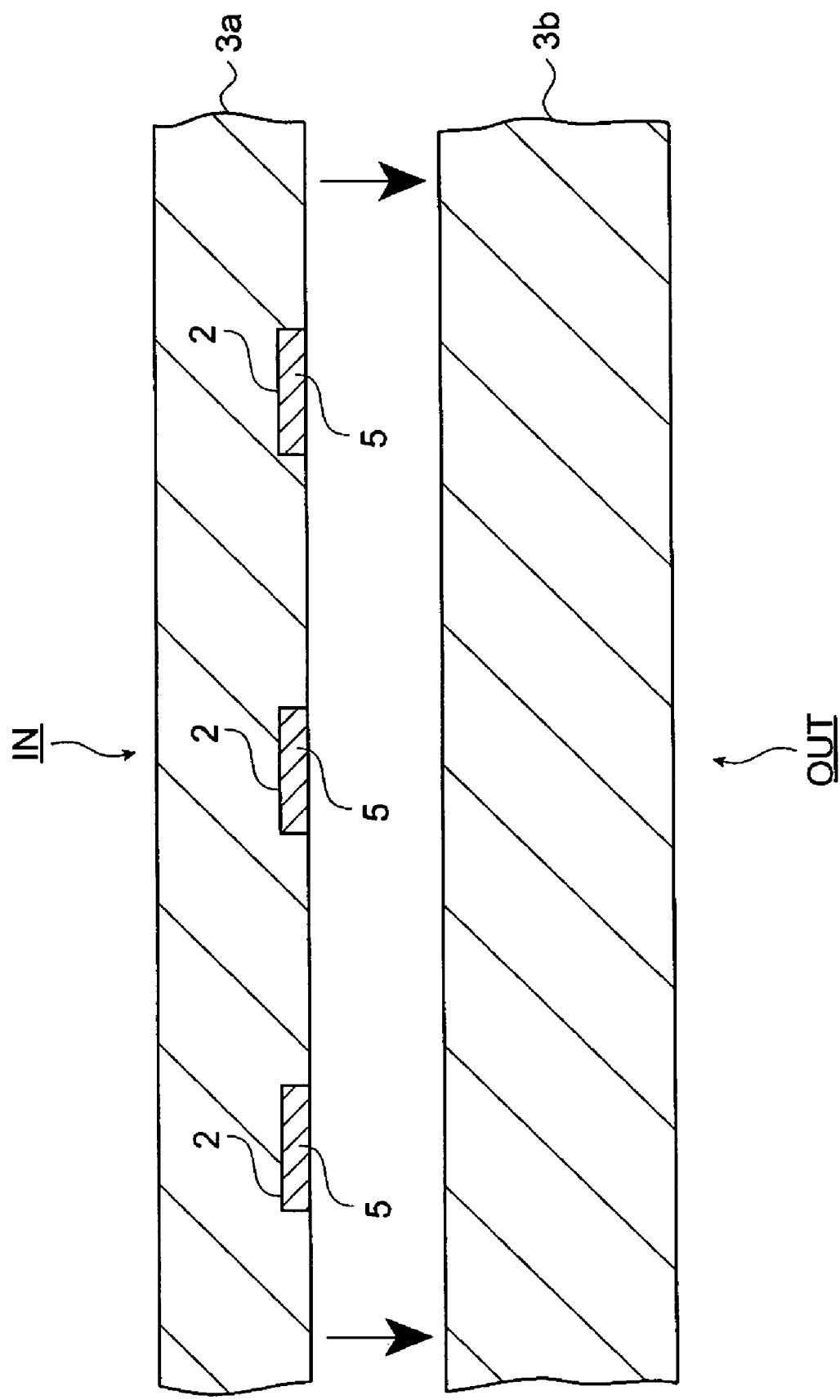
FIG. 5 is a flow sheet showing a manufacturing method for the back illuminated photodiode array according to the first embodiment.

FIG. 5 shows a manufacturing method for the back illuminated photodiode array according to the first embodiment.

First, a first semiconductor substrate 3a is prepared. The conductive type of a first semiconductor substrate 3a is n-type and an impurity is about $1\times10^{12}$ to $1\times10^{15}/cm^3$ in concentration and about 10 to 200 µm in thickness. Next, p-type impurities such as boron are diffused on the opposite surface OUT side of the surface where the incident light L of the first semiconductor substrate 3a is made incident to form a p$^+$ type impurity diffusion region 5 in an array, by which a region of photodiodes, namely, a plurality of pn junctions 2 arranged in an array, is formed on the surface opposite to the surface where the incident light L is made incident.

As described above, since the p$^+$ type impurity diffusion region 5 can be made thinner according to the manufacturing method of the first embodiment than by conventional methods, the p$^+$ type impurity diffusion region 5 can be formed by thermal diffusion of p-type impurities or other methods, thus making it possible to manufacture the back illuminated photodiode array 1 more easily than by conventional methods.

Next, a second semiconductor substrate 3b is prepared. The conductive type of a second semiconductor substrate 3b is n-type and the impurity concentration is made similar to that of the first semiconductor substrate 3a (about $1\times10^{12}$ to $1\times10^{15}/cm^3$) and the thickness is about 2 to 500 μm. In this example, the impurity concentrations of the semiconductor substrates 3a and 3b are fundamentally the same.

Next, a surface where the $p^+$ type impurity diffusion region 5 is formed in the first semiconductor substrate 3a is bonded to the second n-type semiconductor substrate 3b (refer to FIG. 5). In this instance, the respective semiconductor substrates are given surface activation treatment and then bonded together.

(2) Substrate Bonding Step

Figure 6:
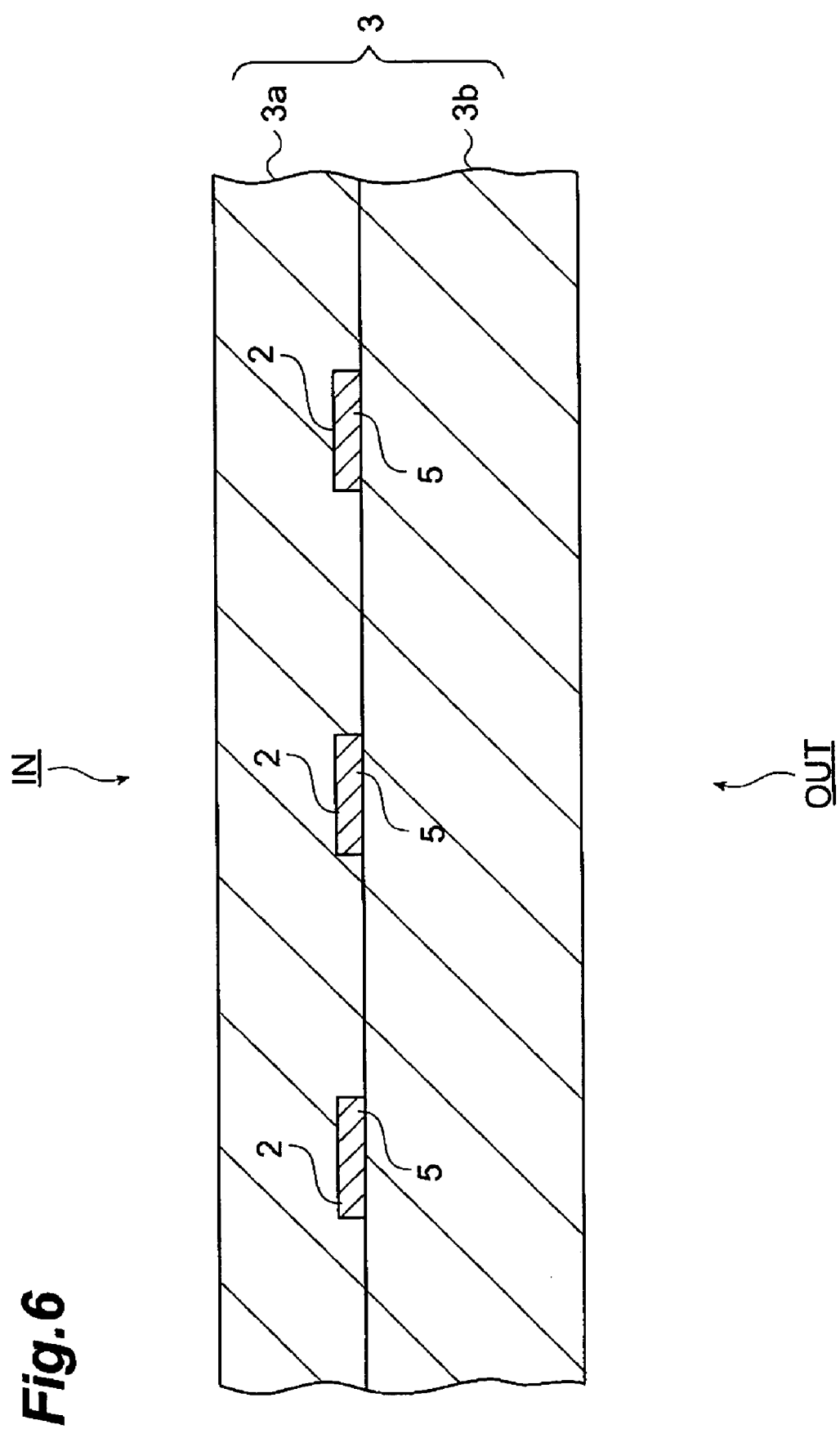
FIG. 6 is a flow sheet showing a manufacturing method for the back illuminated photodiode array according to the first embodiment.

FIG. 6 shows the back illuminated photodiode array after the semiconductor substrates are bonded.

The above bonding makes it possible to provide the n-type semiconductor substrate 3 composed of the first semiconductor substrate 3a and the second semiconductor substrate 3b. The n-type semiconductor substrate 3b can be made to a desired thickness by grinding or polishing after the bonding. In other words, the thickness of the semiconductor substrate 3b is set to such an extent that the depth of the recessed portions can reach the impurity diffusion region 5 on etching for forming the recessed portions.

(3) Recessed Portion Forming Step

Thereafter, etching is given to a region of the second semiconductor substrate 3b corresponding (opposing) to the $p^+$ type impurity diffusion region 5.

Figure 7:
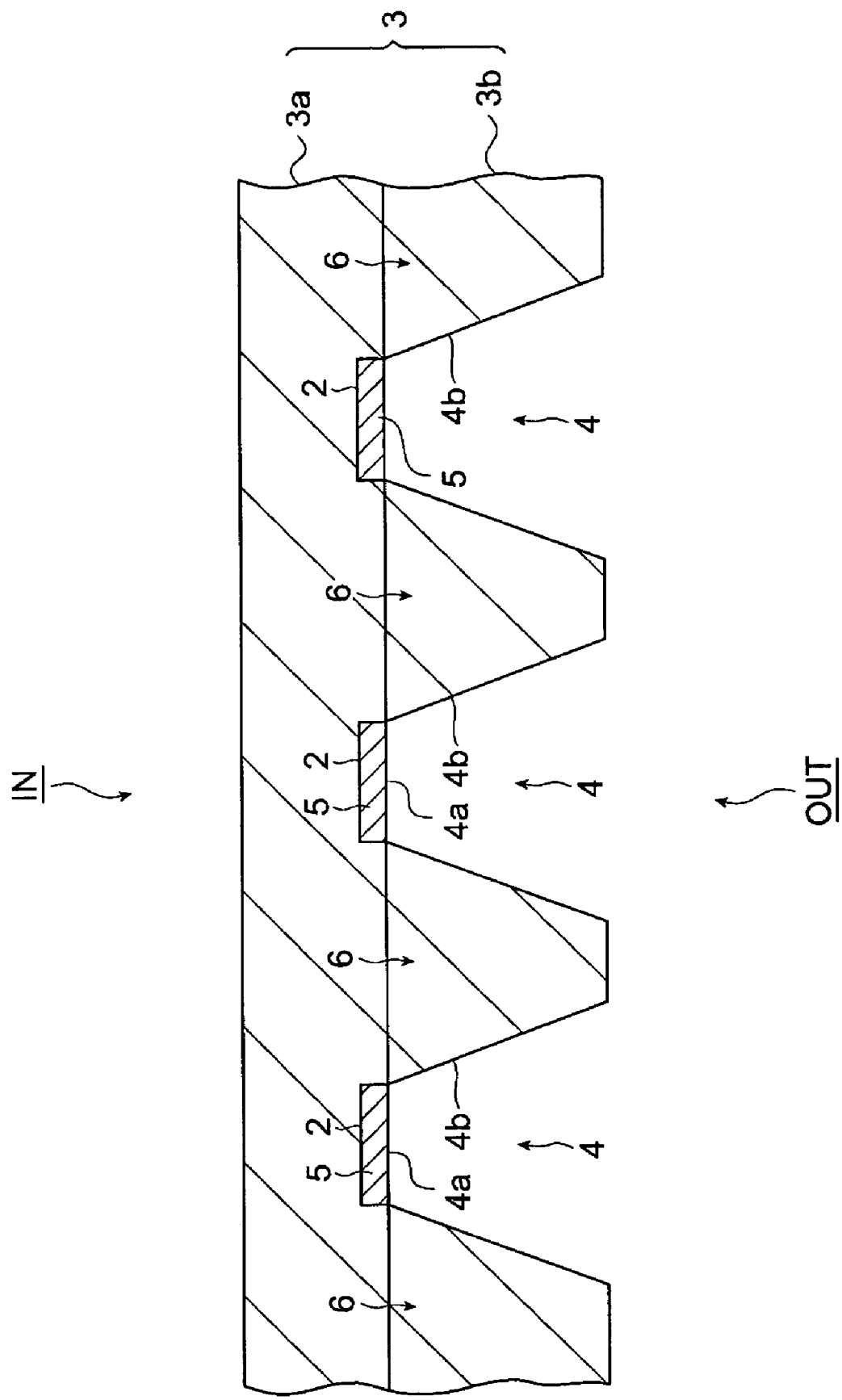
FIG. 7 is a flow sheet showing a manufacturing method for the back illuminated photodiode array according to the first embodiment.

FIG. 7 shows the back illuminated photodiode array after etching.

The above etching provides the recessed portions 4 and allows the $p^+$ type impurity diffusion region 5 to be exposed. This etching step will be described in detail.

First, etching mask (SiN, film) is formed on the front surface (opposite surface OUT of the surface where light L is made incident) of the second semiconductor substrate 3b by methods such as plasma CVD (chemical vapor deposition) and low pressure CVD (LP-CVD).

Next, etching is given to remove a region of the semiconductor substrate 3 opposing the impurity diffusion region 5 of $SiN_x$ film, thus forming an opening.

Then, an etching agent is brought into contact with the second semiconductor substrate 3b inside an opening of the etching mask, thus attaining etching of the second semiconductor substrate 3b. Alkaline etching agents such as potassium hydroxide (KOH) and tetramethyl ammonium hydroxide (TMAH) can be used as the etching agent. This alkaline etching gives (crystalline) anisotropic etching to the second semiconductor substrate 3b, resulting in exposure of the $p^+$ type impurity diffusion region 5.

After the treatment, this etching mask ($SiN_x$ film) is removed.

As described above, the recessed portions 4, the opening of which is gradually reduced in size from the opposite surface OUT side to the light-incident surface IN side, are formed in an array on the semiconductor substrate 3 (the second semiconductor substrate 3b). The $p^+$ type impurity diffusion region 5 is exposed at each bottom 4a of the recessed portions 4 and each space between these recessed portions 4 is constituted with the frame part 6.

(4) Separation Region and Coating Step

Then, coating such as the separation region 7 and insulation films are formed.

Figure 8:
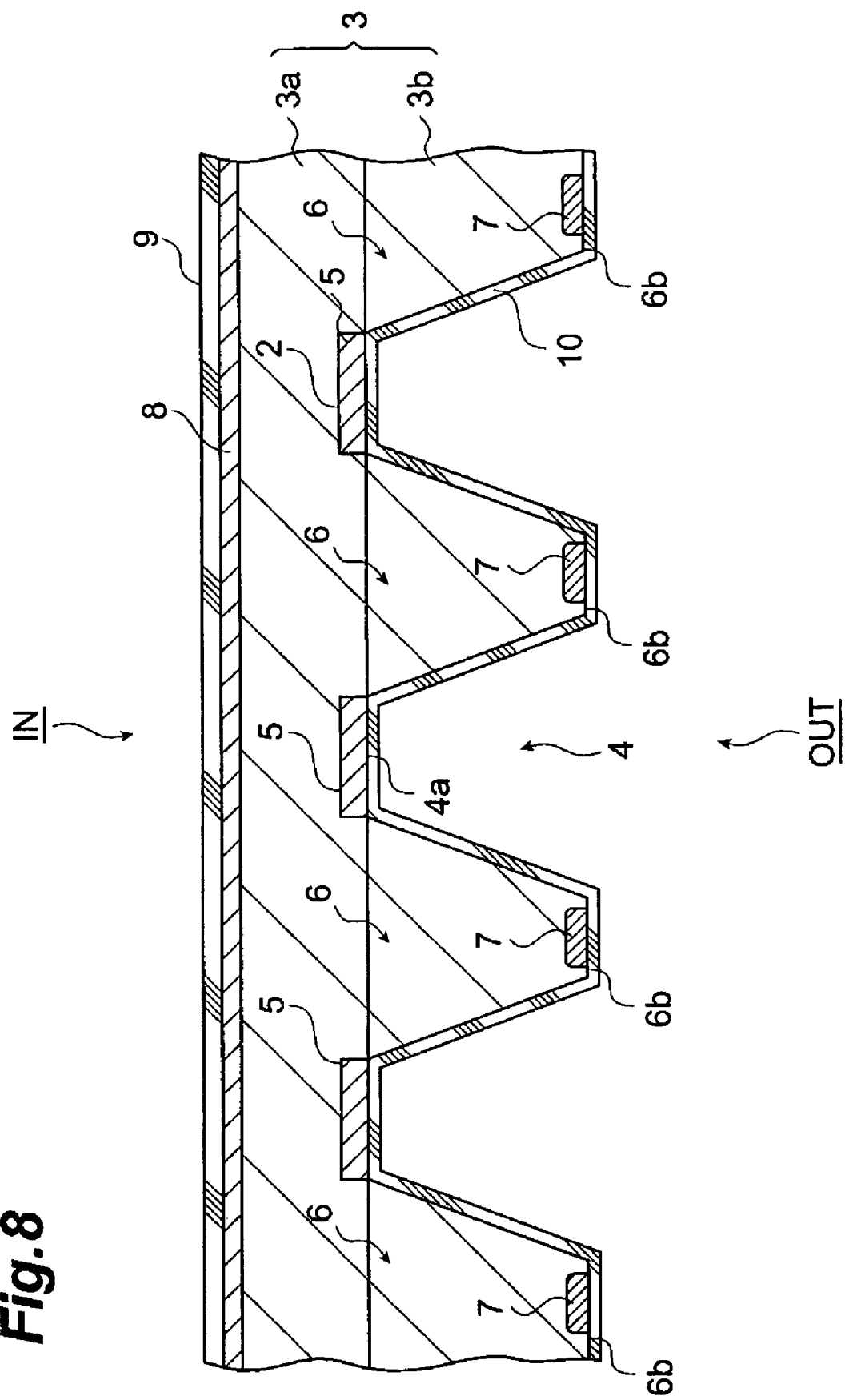
FIG. 8 is a flow sheet showing a manufacturing method for the back illuminated photodiode array according to the first embodiment.

FIG. 8 shows the back illuminated photodiode array in which the separation region 7 and coating are formed. First, n-type impurities such as phosphorus are introduced to a designated spot of the top surface 6b of the frame part 6 by thermal diffusion, ion implantation or other methods, thereby forming the separation region 7 for effecting an electric separation among individual photodiodes.

Next, after a thin thermally-oxidized film is formed, n-type impurities such as arsenic are diffused at a depth ranging from 0.1 to several μm so as to cover all the light-incident surface IN, thus forming an accumulation layer 8.

Thereafter, thermal oxidation or CVD is carried out to form an $SiO_2$ film (electric insulation layer) 10 acting as a protective film of the front surface on the opposite surface OUT of the semiconductor substrate 3. At the same time, an AR film 9 composed of $SiO_2$ film is formed on the light-incident surface IN of the semiconductor substrate 3.

(5) Wiring Step

Next, an aluminum wiring 12 is formed.

Figure 9:
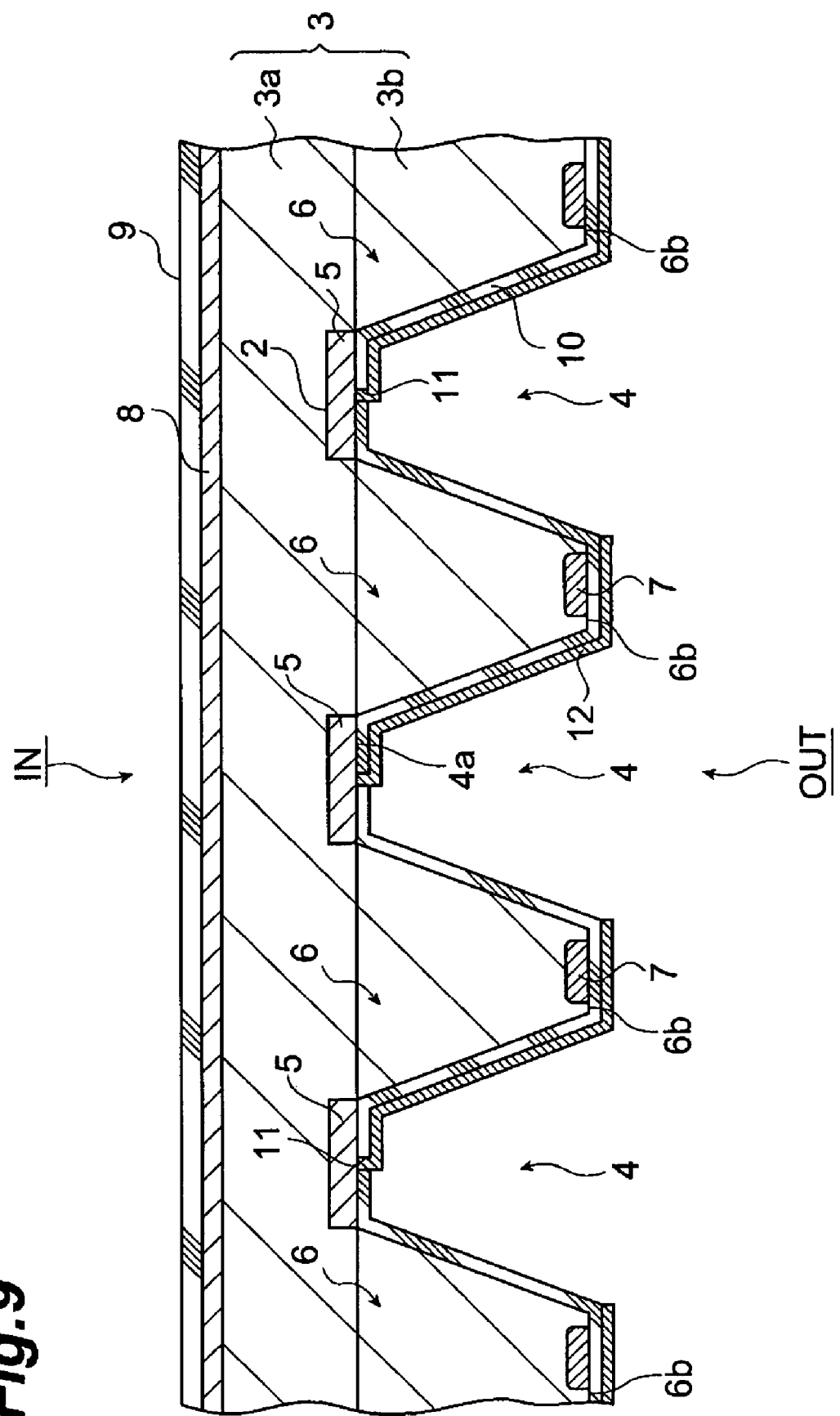
FIG. 9 is a flow sheet showing a manufacturing method for the back illuminated photodiode array according to the first embodiment.

FIG. 9 shows the back illuminated photodiode array in which the aluminum wiring 12 is formed.

First, $SiO_2$ film 10 present at the bottom 4a of the recessed portions 4 is partially removed to form a contact hole 11. Then, a step is carried out where the aluminum wiring 12 is formed on the $SiO_2$ film 10 made on the front surface side.

The aluminum wiring 12 is given such patterning that one end of the wiring extends to the bottom 4a of the recessed portions 4 and the side surface 4b of the recessed portions 4 in contact with the $p^+$ type impurity diffusion region 5 through the contact hole 11 while the other end extends to the top surface 6b of the frame part 6. In this instance, the conductive member is not limited to the aluminum wiring 12 but any wiring made of conductive materials may be used for this purpose, for example, copper wiring, and gold wiring.

(6) Electrode Pad Forming Step

Next, an electrode pad is formed.

FIG. 2 shows a back illuminated photodiode array wherein electrode pads are formed.

First, a passivation film 14 is formed on the opposite surface OUT of the n-type semiconductor substrate 3. The passivation film 14 used in this instance includes $SiN_x$ film, $SiO_2$ film formed by plasma CVD, or polyimide, acryl, epoxy, urethane or composite materials containing them.

Then, the passivation film 14 at a region where an electrode pad 13 of the frame part 6 is formed is removed to join an electrode pad 13 with the aluminum wiring 12. In other words, a UBM 13a is formed on the aluminum wiring 12 formed on the top surface 6b of the frame part 6 to form a bump electrode 13b on the UBM 13a (refer to FIG. 2). This step is carried out to obtain the back illuminated photodiode array 1 according to the first embodiment.

The UBM 13a is provided for improving the bonding property of the aluminum wiring 12 with the bump electrode 13b. In other words, the aluminum wiring 12 is joined with the bump electrode 13b through the UBM 13a, since soldering the bump electrode 13b renders bonding with the aluminum wiring 12 inferior. The UBM 13a is formed by production of Ni—Au by the electroless plating method or also by production of Ti—Pt—Au or Cr—Au by the lift off method.

Furthermore, the bump electrode 13b is obtained by the solder ball mounting method or printing method for forming solder at a site of the UBM 13a and effecting reflow. The bump electrode 13b includes conductive bumps including metals such as gold, nickel, copper and conductive resins, in addition to solder.

The Second Embodiment

Figure 10:
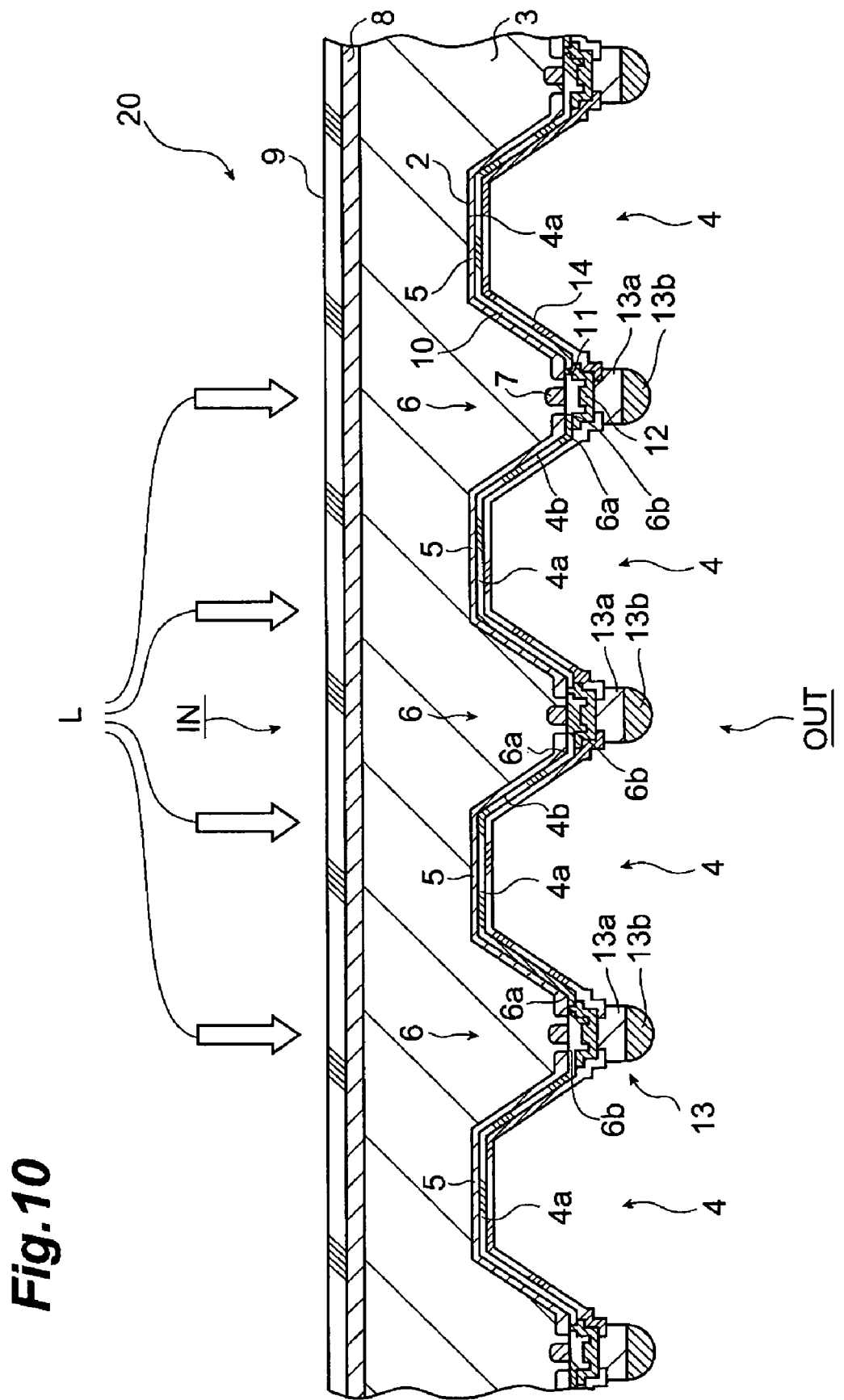
FIG. 10 is a schematic view showing the cross sectional configuration of the back illuminated photodiode array according to the second embodiment.

FIG. 10 is a schematic view showing a cross sectional configuration of the back illuminated photodiode array 20 according to the second embodiment.

Hereinafter, an explanation will be given about differences between the back illuminated photodiode array 20 according to the second embodiment and the back illuminated photodiode array 1 according to the first embodiment.

The back illuminated photodiode array 20 according to the second embodiment is different from that according to the first embodiment in that the p+ type impurity diffusion layer 5 extends from the bottom 4a of the recessed portions 4 through the side surface 4b of the recessed portions 4 up to the edge part 6a of the frame part 6 by using the side surface 4b of the recessed portions 4. Namely, in the case of the back illuminated photodiode array 20, the p+ type impurity diffusion region 5 extends from the bottom 4a to a part of the top surface 6b of the frame part 6, thus enlarging an area for receiving carriers generated inside the semiconductor substrate 3.

In the back illuminated photodiode array 20, the front surface is covered with $SiO_2$ film 10. The $SiO_2$ film 10 covering a part of p+ type impurity diffusion region 5 extended up to the edge part 6a of the frame part 6 is provided with a contact hole 11 leading to the p+ type impurity diffusion region 5. The aluminum wiring 12 as a conductive member for outputting signals outside from photodiodes is provided on the frame part 6 and connected electrically with the p+ type impurity diffusion region 5 via the contact hole 11. The aluminum wiring 12 exists between the electrode pad 13 made in the frame part 6 and the p+ type impurity diffusion region 5.

Other configurations given in the back illuminated photodiode array according to the second embodiment are the same as those given in the first embodiment.

As described above, since the back illuminated photodiode array 20 according to the second embodiment is provided with the p+ type impurity diffusion region 5 at a region including the bottom 4a of the recessed portions 4 formed on the front surface side, a distance can be made shorter between the light-incident surface of the n-type semiconductor substrate 3 where light L is made incident and pn junction 2 (boundary surface) of the photodiode. Therefore, inhibition is provided for a phenomenon where carriers generated by incident light L undergo recombination during a transferring process, maintaining a higher detection sensitivity of the back illuminated photodiode array 20.

Furthermore, since the p+ type impurity diffusion region 5 can be made thinner than that by conventional methods, the p+ type impurity diffusion region 5 can be formed by thermal diffusion of p-type impurities or other methods, thus it is possible to manufacture the back illuminated photodiode array 20 more easily than by conventional methods.

Furthermore, a plurality of recessed portions 4 are formed in an array on the front surface of n-type semiconductor substrate 3, and the recessed portions 4 are constituted with the frame part 6 which is thicker than the n-type semiconductor substrate 3 at the bottom 4a of the recessed portions 4. The presence of the frame part 6 gives a mechanical strength sufficiently practical to the back illuminated photodiode array 20.

Furthermore, the presence of the accumulation layer 8 can inhibit carriers generated in the vicinity of the back surface from being trapped by the boundary surface with an AR coat, thus effectively feeding the carrier toward pn junction 2 to maintain a higher detection sensitivity of the back illuminated photodiode array 20. The back illuminated photodiode array 1 has a detection sensitivity that is acceptable for practical use, even when no accumulation layer 8 is provided.

Furthermore, formation of the separation region 7 on the frame part 6 causes an electric separation among photodiodes made on the individual recessed portions 4, resulting in a decrease in cross talk among the photodiodes. Even an absence of the separation region 7 will provide the back illuminated photodiode array 1 with a practical use acceptable detection sensitivity.

Furthermore, since the p+ type impurity diffusion region 5 extends up to the edge part 6a of the frame part 6 and is formed on the top surface 6b, the contact hole 11 can be made on the top surface 6b of the frame part 6. Consequently, since there is no necessity for forming the aluminum wiring 12 connecting electrically p+ type impurity diffusion region 5 with the electrode pad 13 at the bottom 4a and the side wall 4b of the recessed portions 4, forming the wiring at only the frame part 6 would be sufficient to simplify the process for forming the aluminum wiring 12.

In the back illuminated photodiode array 20, the p+ type impurity diffusion region 5 is formed in such a manner that extends to the edge part 6a of the frame part 6 low in mechanical strength. For this reason, at the frame part 6 which may easily undergo mechanical stress via the electrode pad 13 on mounting or at the edge part of the frame part 6 which may easily undergo stress during etching, an unnecessary carrier tends to be generated due to these stresses. However, such stresses can be trapped to inhibit production of dark current.

Manufacturing Method for the Back Illuminated Photodiode Array According to the Second Embodiment Next, the back illuminated photodiode array 20 according to the second embodiment as given in FIG. 10 will be explained for the manufacturing method by referring to FIG. 11 through FIG. 18. The following steps of (1) through (9) will be carried out sequentially in the manufacturing method.

(1) Substrate Preparing Step

Figure 11:
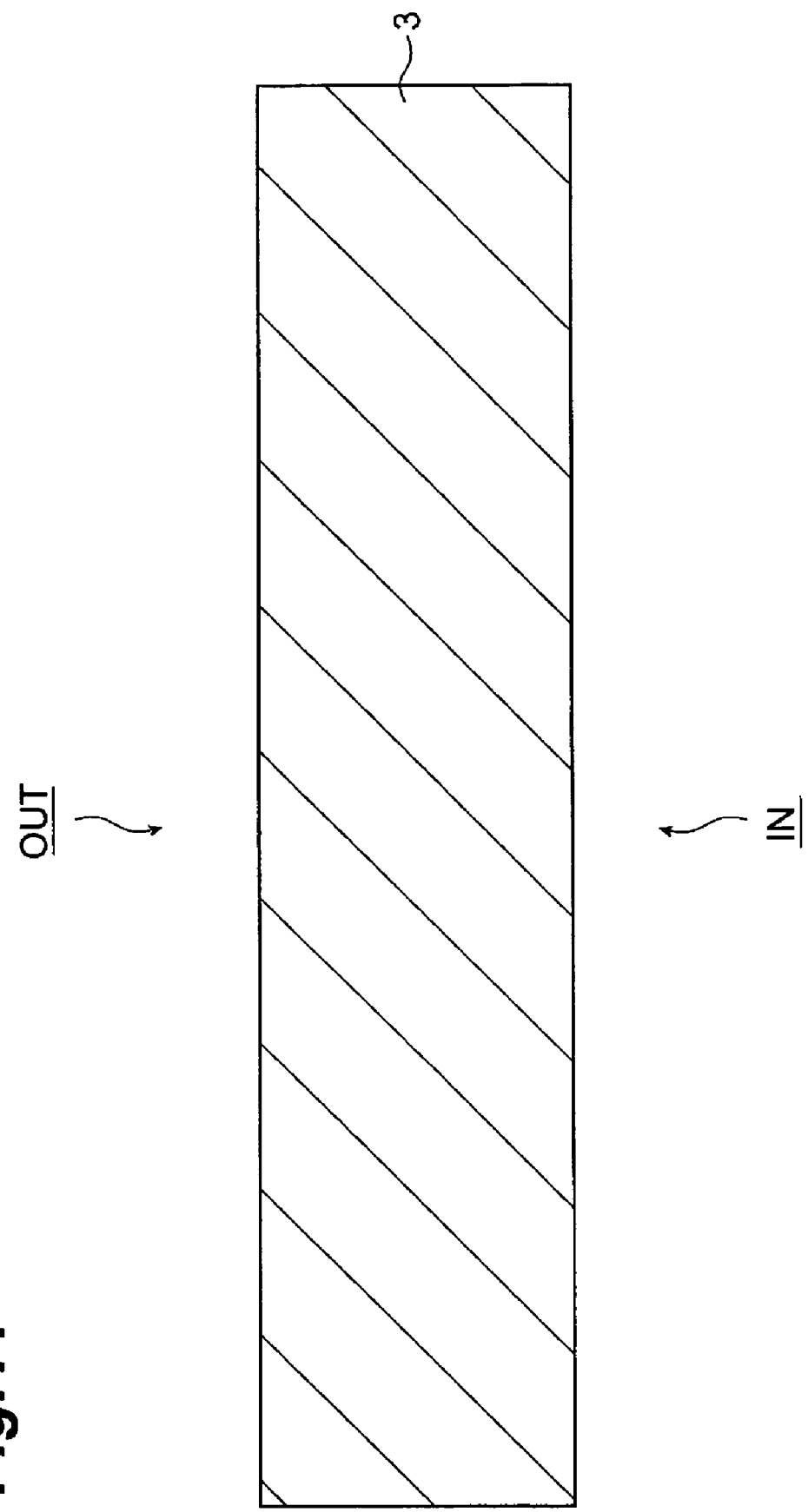
FIG. 11 is a flow sheet showing a manufacturing method for the back illuminated photodiode array according to the second embodiment.

FIG. 11 shows a semiconductor substrate. First, an n-type semiconductor substrate 3 is prepared, the impurity of which is about $1 \times 10^{12}$ to $1 \times 10^{15}/cm^3$ in concentration and about 300 to 600 μm in thickness.

(2) Insulation Film Forming Step

Figure 12:
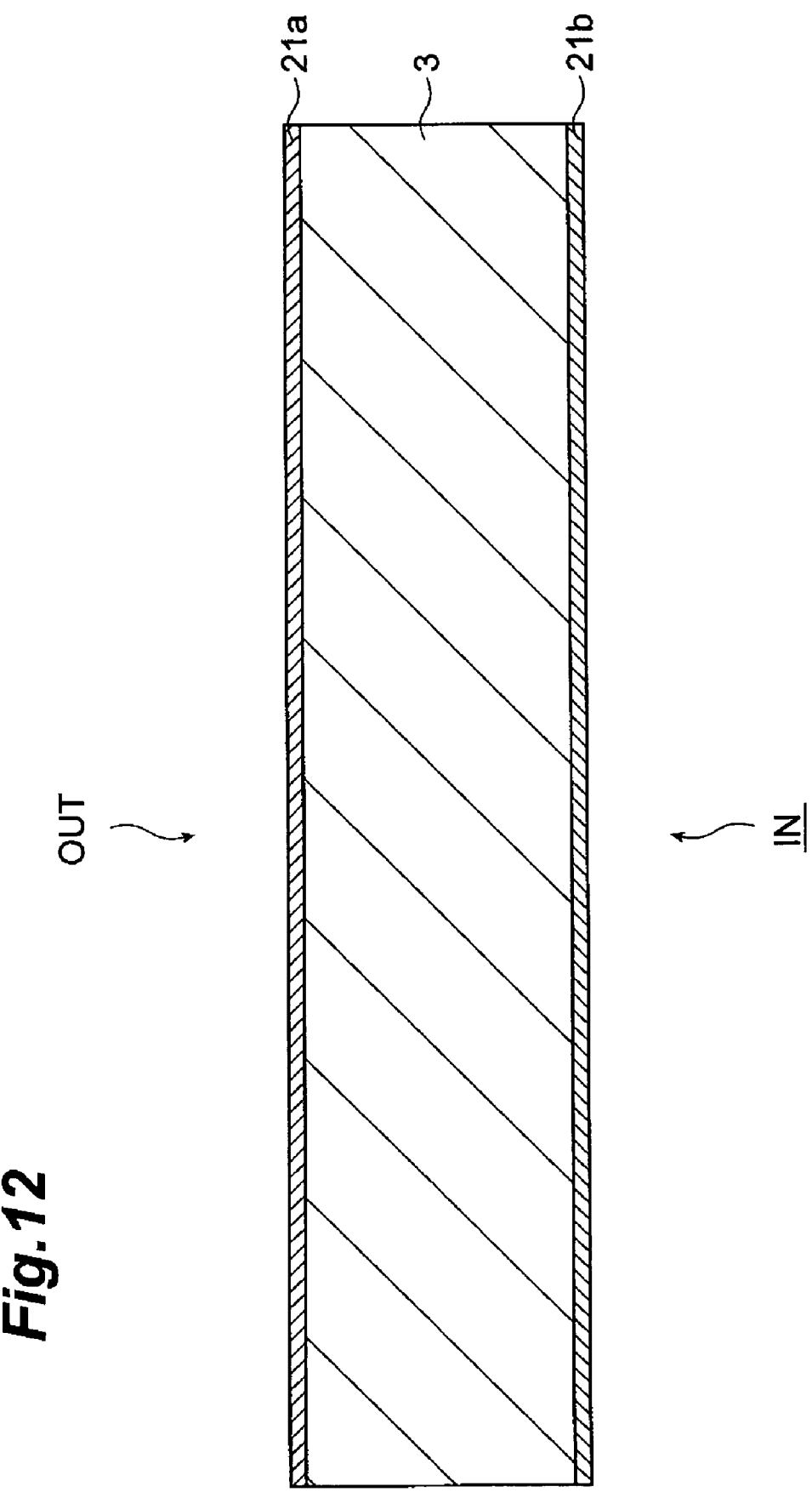
FIG. 12 is a flow sheet showing a manufacturing method for the back illuminated photodiode array according to the second embodiment.

FIG. 12 shows a semiconductor substrate where an insulation film is formed.

Next, then-type semiconductor substrate 3 is subjected to thermal oxidation to form insulation films ($SiO_2$ film) 21a and 21b respectively on the opposite surface OUT of the semiconductor substrate 3 and the light-incident surface IN. The insulation films 21a and 21b may be produced by the CVD or spatter method.

(3) Separation Region and Gettering Layer Forming Step

Figure 13:
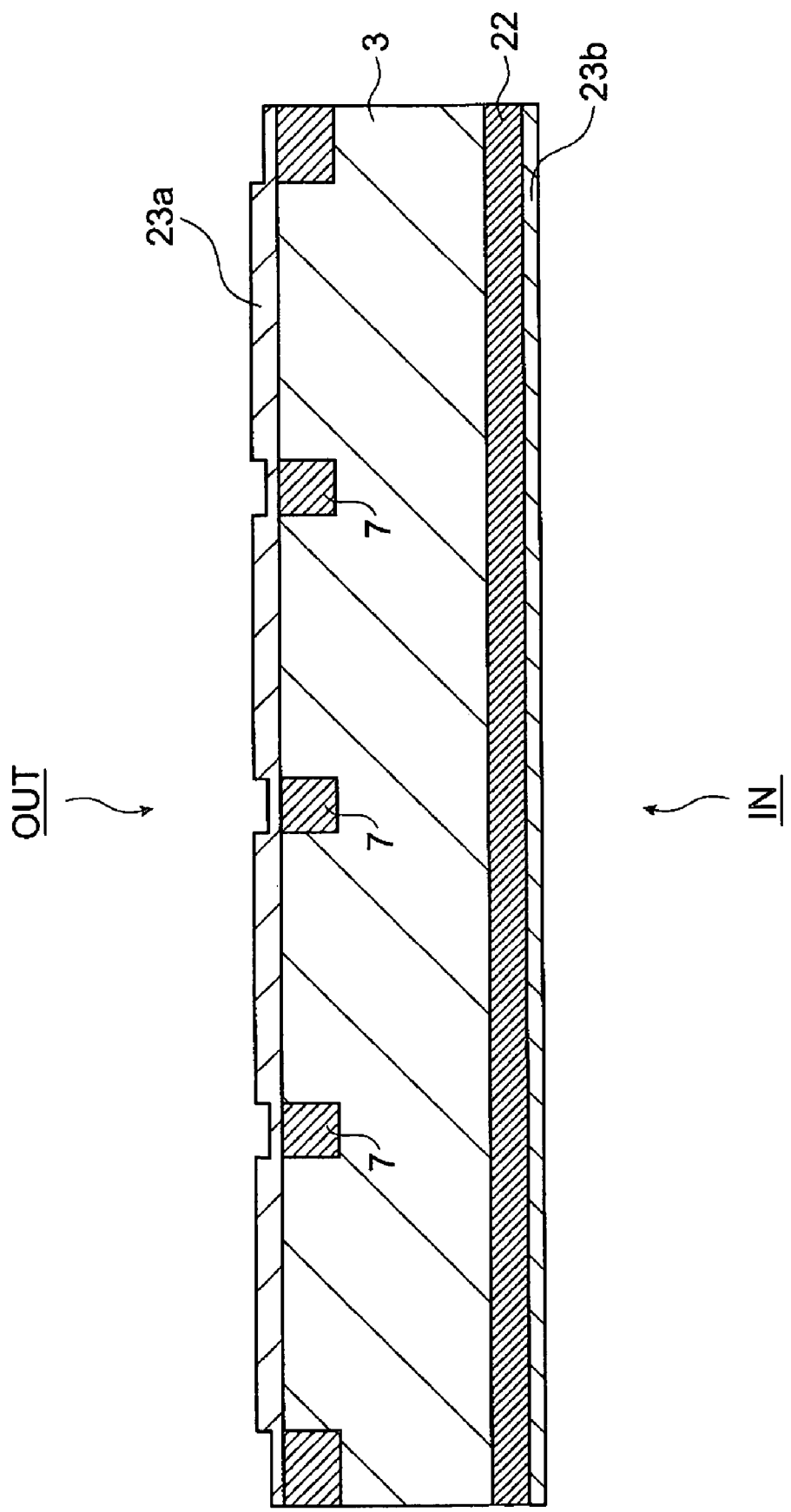
FIG. 13 is a flow sheet showing a manufacturing method for the back illuminated photodiode array according to the second embodiment.

FIG. 13 shows a semiconductor substrate where a separation region 7 and a gettering layer 22 are formed. First, the photo-lithography process is carried out to form an opening to a part of the $SiO_2$ film 21a (refer to FIG. 12) corresponding to the separation region 7 on the opposite surface OUT side of the n-type semiconductor substrate 3. Similarly, the $SiO_2$ film 21b is removed on the light-incident surface IN of the n-type semiconductor substrate 3 (refer to FIG. 12).

Next, phosphorus is thermally diffused at plural regions on the opposite surface OUT of the n-type semiconductor substrate 3 and all over on the light-incident surface IN to give the separation region 7 and the gettering layer 22, impurity concentration of which is about $1 \times 10^{15}$ to $1 \times 10^{20}/cm^3$. Furthermore, the semiconductor substrate 3 is thermally oxidized to form $SiO_2$ films, 23a and 23b respectively covering the opposite surface OUT of the separation region 7 and the light-incident surface IN of the gettering layer 22. In place of forming the gettering layer 22, a diffusion wafer may be used, in which an n-type impurity is previously diffused at about $1 \times 10^{15}$ to $1 \times 10^{20}/cm^3$ in concentration.

As described above, the separation region 7 for causing separation among the photodiodes is formed on the opposite surface OUT side of the n-type semiconductor substrate 3 whereas the gettering layer 22 for incorporating crystalline defects of the n-type semiconductor substrate 3 is formed on the light-incident surface IN side.

(4) Impurity Diffusion Region Forming Step

Figure 14:
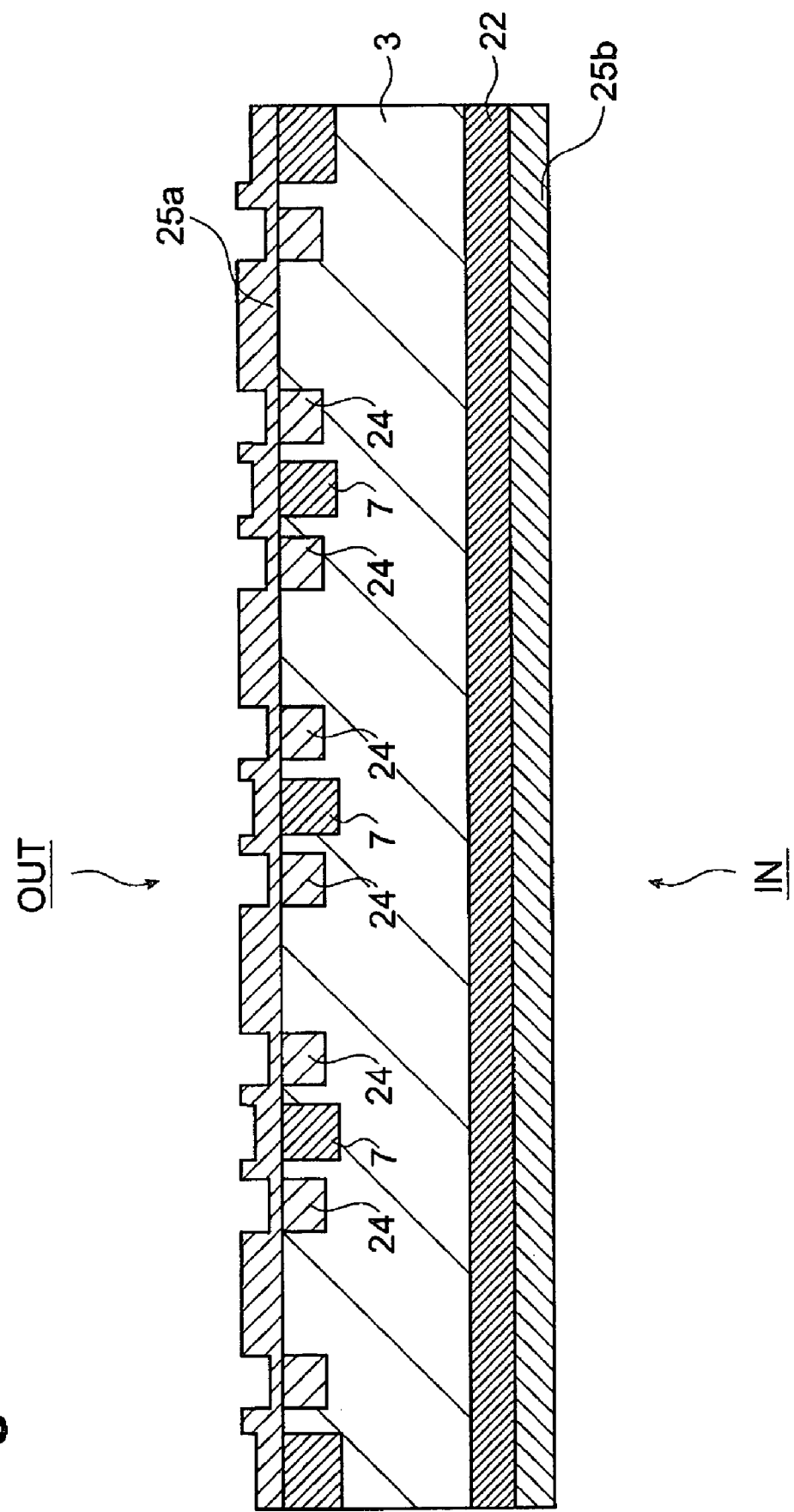
FIG. 14 is a flow sheet showing a manufacturing method for the back illuminated photodiode array according to the second embodiment.

FIG. 14 shows a semiconductor substrate where an impurity diffusion layer 24 is formed.

First, p type impurities such as boron are diffused on the opposite surface OUT side of the n-type semiconductor substrate 3 to form the $p^+$ type impurity diffusion region 24. The $p^+$ type impurity diffusion region 24 is formed with a certain space kept apart from the separation region 7. The impurity diffusion region 24 is subjected to etching at a subsequent step for forming the recessed portions 4 (refer to FIG. 16) to give the $p^+$ type impurity diffusion region 5 which covers a region from the side surface 4b of the recessed portions 4 to the edge part 6a of the frame part 6.

The specific manufacturing step will be described. The $SiO_2$ film 23a (refer to FIG. 13) is subjected to a photo lithography process on the opposite surface OUT side of the n-type semiconductor substrate 3 to form an opening for forming an impurity diffusion region. Through the opening, $p^+$ type impurities such as boron are diffused inside the semiconductor substrate 3 to form the p-type impurity diffusion region 24, the impurity concentration of which is about $1 \times 10^{15}$ to $1 \times 10^{20}/cm^3$, whereas the semiconductor substrate 3 is thermally oxidized to form $SiO_2$ films, 25a and 25b respectively covering the front surface of the impurity diffusion region 24 and the gettering layer 22.

Then, the light-incident surface IN side of the semiconductor substrate 3 is polished to remove the $SiO_2$ film 25b and the gettering layer 22.

(5) $SiN_x$ Film Forming Step

Figure 15:
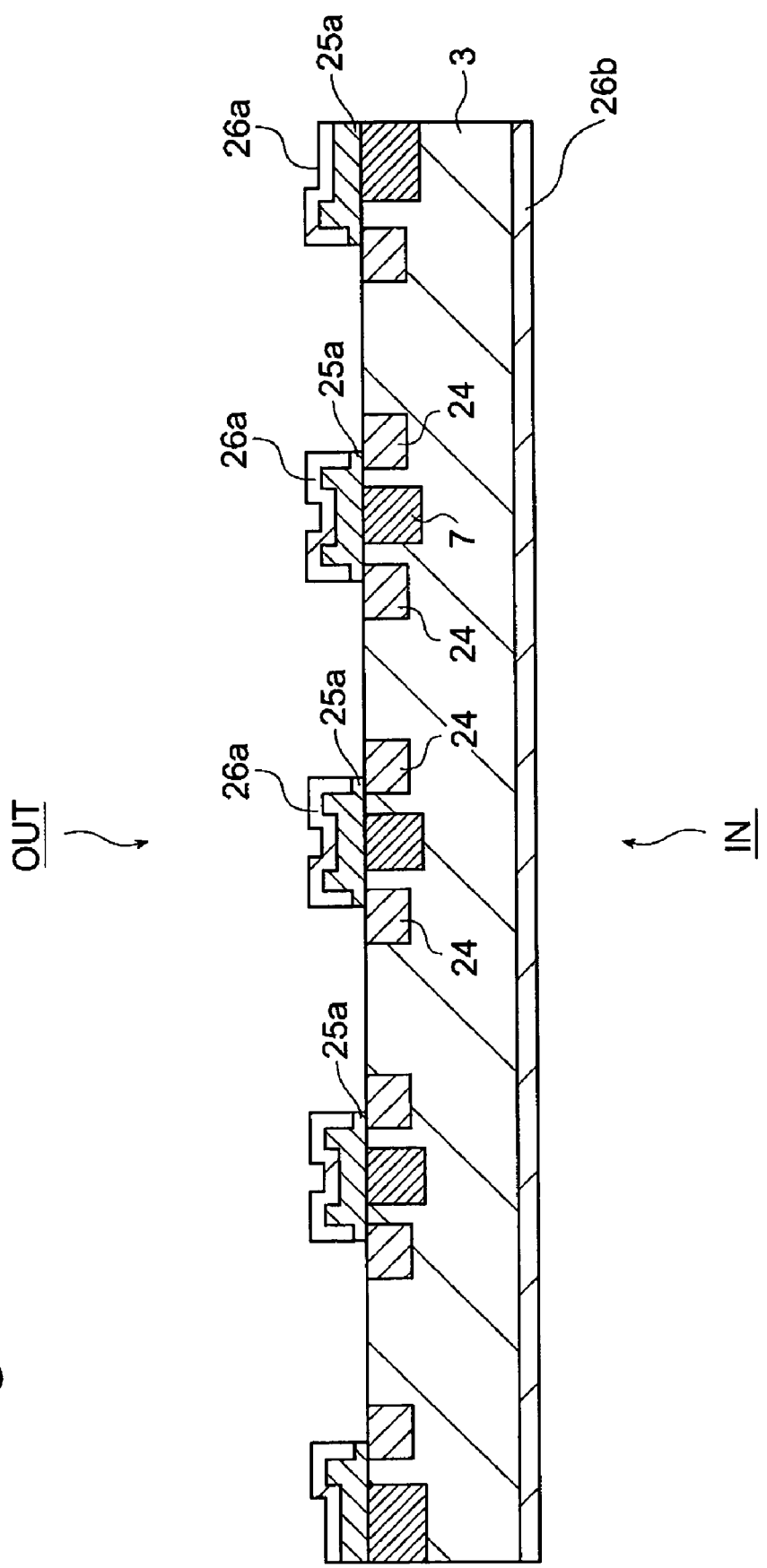
FIG. 15 is a flow sheet showing a manufacturing method for the back illuminated photodiode array according to the second embodiment.

FIG. 15 shows a semiconductor substrate where $SiN_x$ film 26a and 26b are formed.

First, the LP-CVD method is used to form $SiN_x$ films 26a and 26b respectively on the opposite surface OUT of the semiconductor substrate 3 and the light incident surface IN. Then, the etching process is carried out to remove $SiN_x$ film 26a and $SiO_2$ film 25a at a region which is to be made into the recessed portions 4 by the subsequent step (removal step).

(6) Recessed Portion Forming Step

Figure 16:
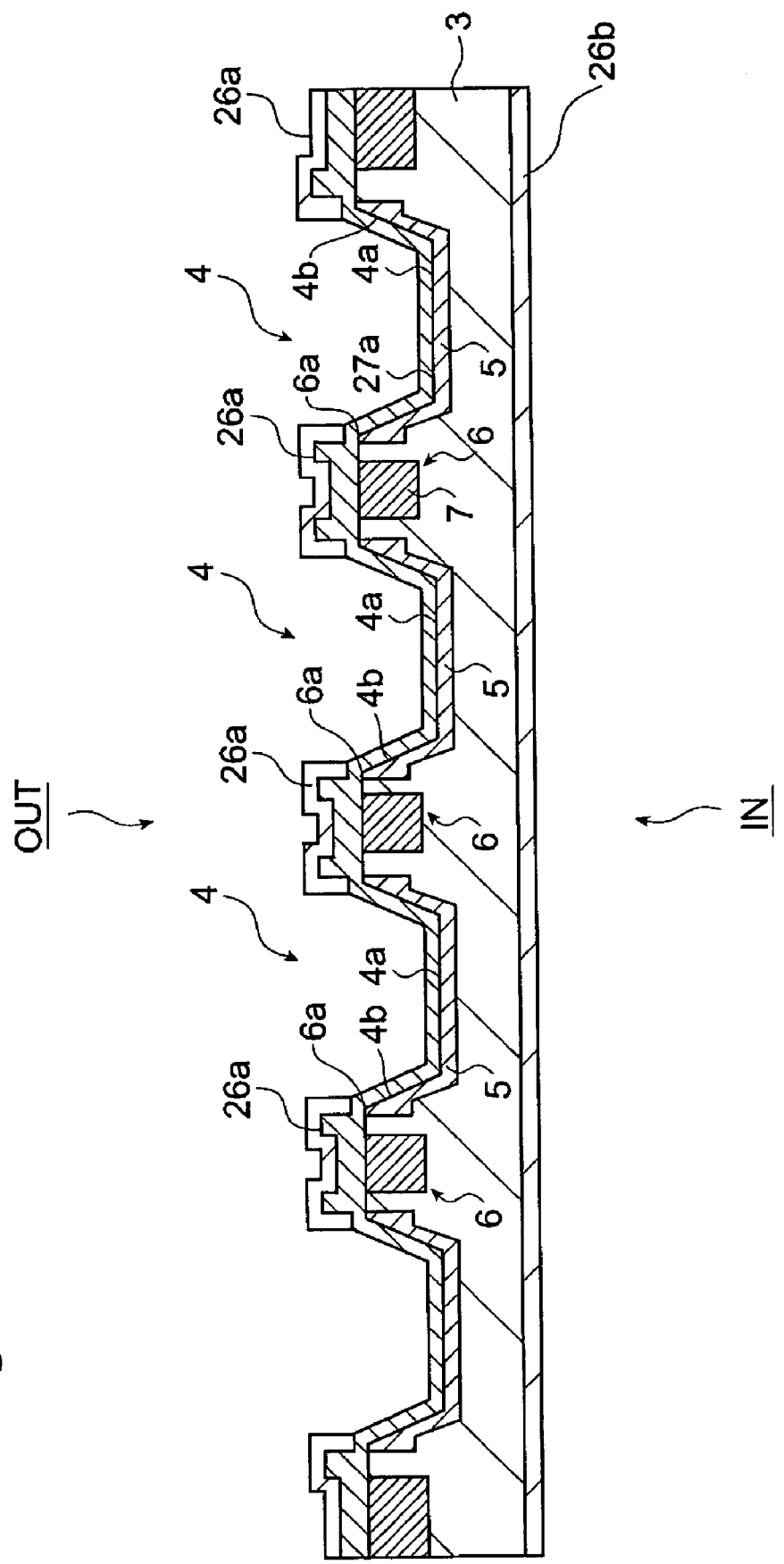
FIG. 16 is a flow sheet showing a method for the back illuminated photodiode array according to the second embodiment.

FIG. 16 shows a semiconductor substrate where the recessed portions 4 are formed.

First, anisotropic etching is given by an alkaline etching method using a potassium hydroxide solution and others to form the recessed portions 4 and the frame part 6 at a front surface region of the opposite surface OUT side of the semiconductor substrate 3 from which $SiN_x$ film 26a and $SiO_2$ film 25a have been removed in the removal step. In this instance, etching depth by anisotropic etching is set to be at least 2 μm.

The recessed portions 4, the opening of which is gradually reduced in size from the opposite surface OUT side to the light-incidence surface IN side, are formed on the opposite surface side of the semiconductor substrate 3 by this step.

Then, $p^+$ type impurities such as boron are diffused around the bottom 4a and side surface 4b of the recessed portions 4 exposed by anisotropic etching and followed by thermal oxidation. This step yields the p-type impurity diffusion region 5 around the bottom 4a of the recessed portions 4 through the edge part 6a of the frame part 6 and side surface 4b of the recessed portions 4, the front surface of which is covered with $SiO_2$ film 27a. Namely, this step provides a region that will be made into photodiodes.

As described above, at the frame part 6 which may easily undergo mechanical stress on mounting or at the edge part of the frame part 6 which may easily undergo stress on etching, an unnecessary carrier tends to be generated due to these stresses. However, since $p^+$ type impurity diffusion region 5 is provided in such a manner that extends from the bottom 4a to the edge part 6a bordering on the recessed portions 4 and frame part 6, an unnecessary carrier can be trapped to inhibit production of dark current.

Since the $p^+$ type impurity diffusion region 5 can be made thinner than that manufactured conventionally, the $p^+$ type impurity diffusion region 5 can be formed by thermal diffusion of p-type impurities or other methods, thus making it is possible to manufacture the back illuminated photodiode array 20 (refer to FIG. 10) more easily than by conventional methods.

(7) Accumulation Layer Forming Step

Figure 17:
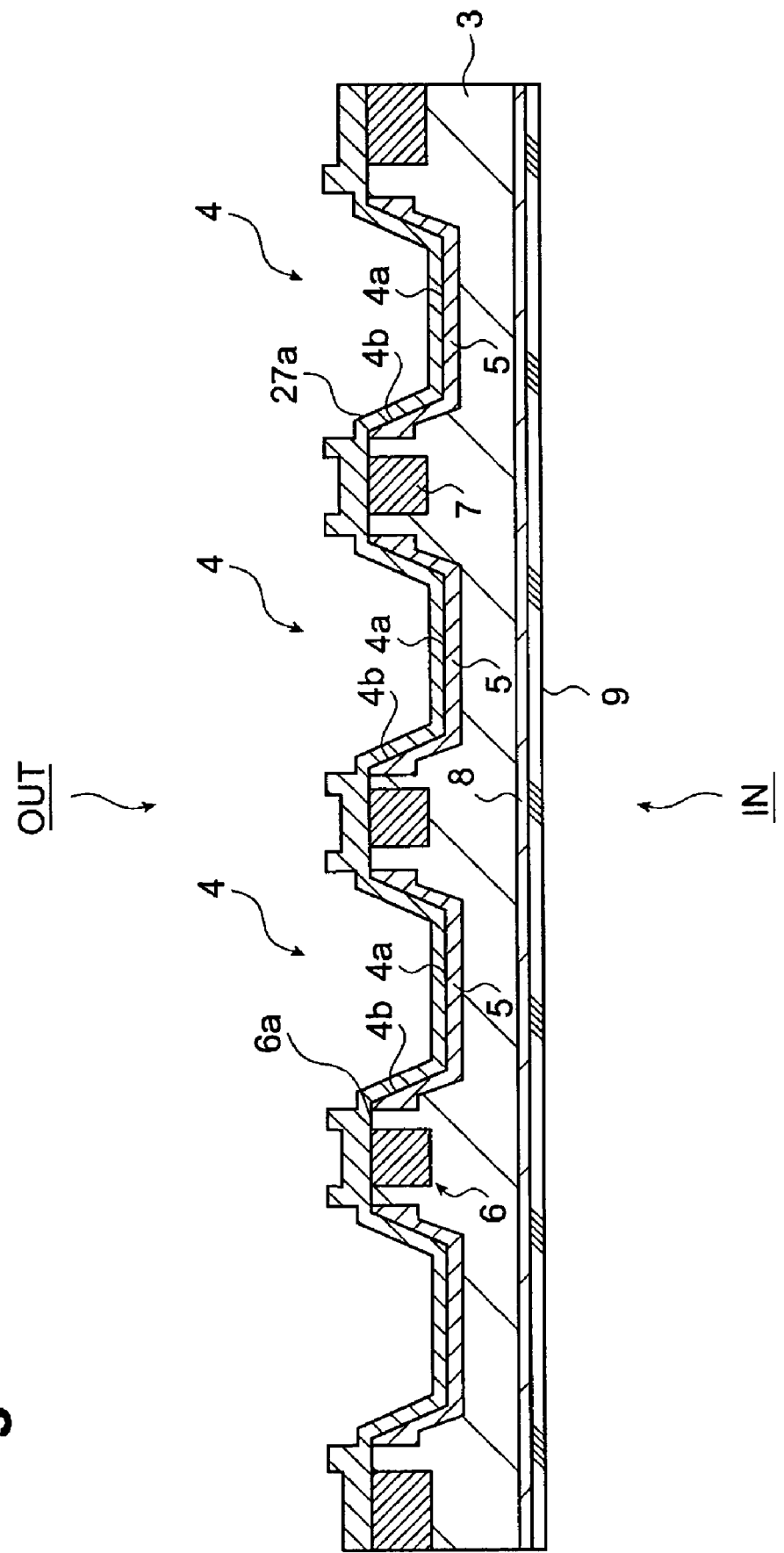
FIG. 17 is a flow sheet showing a manufacturing method for the back illuminated photodiode array according to the second embodiment.

FIG. 17 shows a semiconductor substrate 3 where an accumulation layer 8 is formed.

First, $SiN_x$ films 26a and 26b (refer to FIG. 16) used as an etching mask are removed to form an oxide film on the light-incident surface IN side of the n-type semiconductor substrate 3. Arsenic is implanted via this oxide film into the semiconductor substrate 3 and then the semiconductor substrate 3 is thermally oxidized. The accumulation layer 8 is formed through these steps.

Furthermore, after thermal oxidation is used to once remove the $SiO_2$ film formed on the light incidence surface IN side of the semiconductor substrate 3, the light-incident surface is again subjected to thermal oxidation to form an AR film 9 composed of $SiO_2$.

(8) Wiring Step

Figure 18:
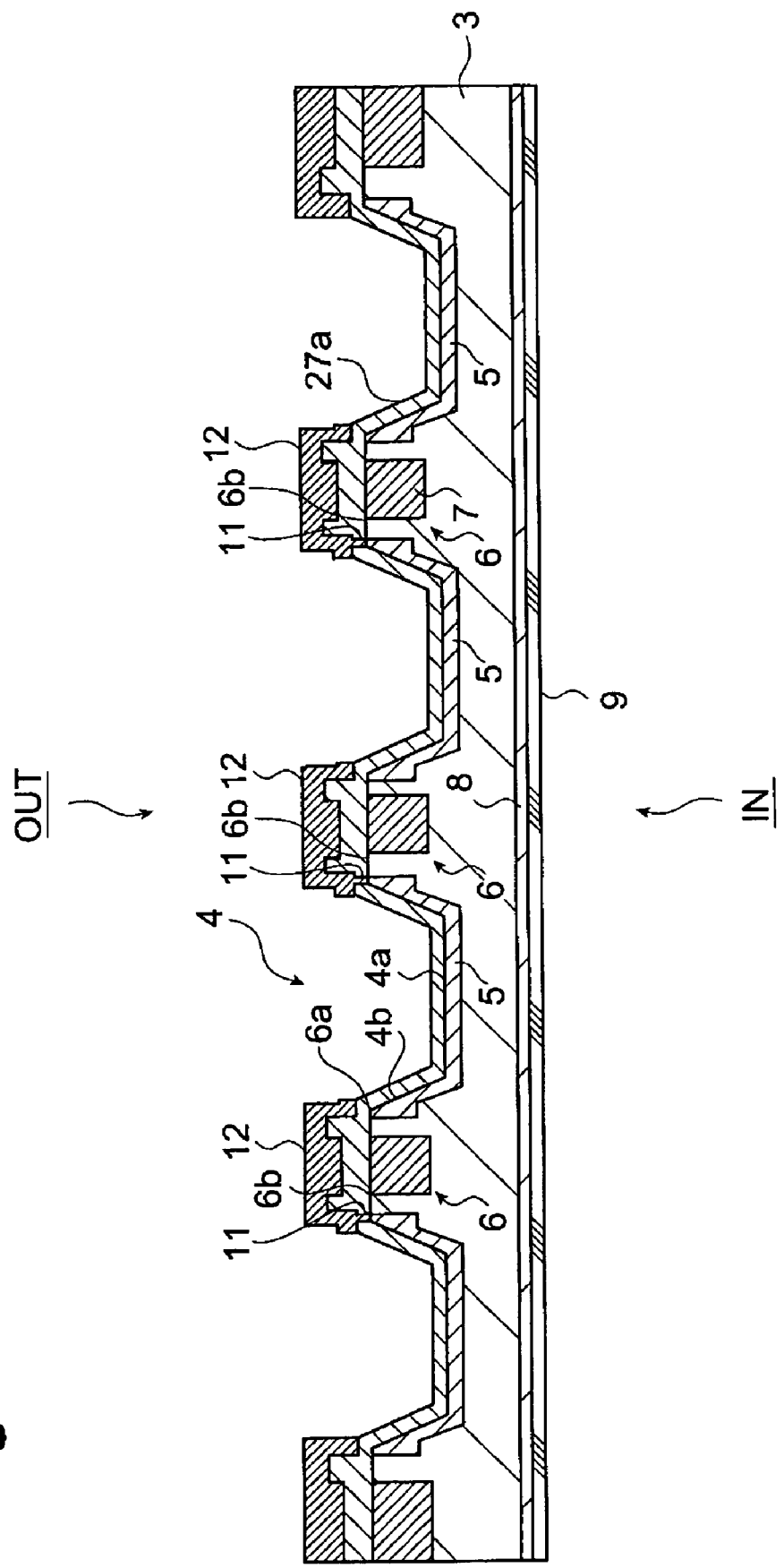
FIG. 18 is a flow sheet showing a manufacturing method for the back illuminated photodiode array according to the second embodiment.

FIG. 18 shows a semiconductor substrate where an aluminum wiring 12 is formed.

First, the contact hole 11 extending to the $p^+$ type impurity diffusion region 5 is formed at a region where the $SiO_2$ film 27a is at the top surface 6b of the frame part 6. Then, the aluminum wiring 12 is patterned on the frame part 6.

As described above, according to the manufacturing method of this embodiment, since the $p^+$ type impurity diffusion region 5 is provided in such a manner as to extend to the top surface 6b of the frame part 6, the contact hole 11 can be formed on the frame part 6. Patterning of the contact hole 11 and the aluminum wiring 12 can be given only to the frame part 6, thus eliminating the necessity for subjecting the bottom 4a and side surface 4b of the recessed portions 4 to photo-lithography process to simplify the process greatly.

Patterning to the recessed portions 4 lower in mechanical strength will be eliminated, thus resulting in reduced stress.

(9) Electrode Forming Step

Finally, as shown in FIG. 10, a passivation film 14 is formed on the opposite surface OUT side of the n-type semiconductor substrate 3, except at a region where a UBM 13a is formed. Then, the UBM 13a is formed on the aluminum wiring 12 made on the frame part 6 and a bump electrode 13b is formed on the UBM 13a to obtain the back illuminated photodiode array 20 according to the second embodiment.

Third Embodiment

The back illuminated photodiode array according to the third embodiment is similar to the back illuminated photodiode array 1 according to the first or second embodiment except that the semiconductor substrate 3 is composed of two layers of semiconductor substrates 3a and 3b. Namely, this is a back illuminated photodiode array where these semiconductor substrates 3a and 3b are bonded together so that the first n-type semiconductor substrate 3a and the second n-type semiconductor substrate 3b can be different from each other for their crystal orientation.

For example, an n-type first semiconductor substrate 3a of crystal plane (111) is prepared, and an n-type second semiconductor substrate 3b of crystal plane (100) or (110) is bonded to the n-type first semiconductor substrate 3a. Such a configuration makes it possible to stop etching easily at a stage where the $p^+$ type impurity diffusion region 5 formed on the n-type first semiconductor substrate 3a is exposed, since the plane (111) is quite slow in etching, as compared with the planes (100) and (110), in giving alkaline etching to the n-type second semiconductor substrate 3b.

In the photodiode according to the third embodiment, the n-type semiconductor substrate 3 has a different crystal orientation between the front surface side and the back surface side at a designated depth from the front surface. The n-type semiconductor substrate 3 is subjected to etching from the front surface side of the recessed portions 4 and then a similar step is carried out to provide the back illuminated photodiode array 1.

Namely, the third embodiment is different from the first embodiment in that the two semiconductor substrates 3a and 3b have a different plane orientation Furthermore, in the third embodiment, the single semiconductor substrate 3 of the second embodiment consists of two semiconductors, and in the manufacturing method for the back illuminated photodiode array 20, a silicon-bonded substrate as shown in the first embodiment can be used as a silicon substrate. The manufacturing method according to the third embodiment can achieve easy control of etching depth, basically as with the first embodiment. However, where a semiconductor substrate different in plane orientation is applied to the first embodiment, a semiconductor substrate with previously formed pn junctions 2 is bonded. In contrast, where a semiconductor substrate different in plane orientation is applied to the second embodiment, after both substrates are bonded, the recessed portions 4 are formed by etching and followed by formation of the $p^+$ type impurity diffusion region 5.

For example, bonding with an SOI (silicon on insulator) wafer, SOS (Silicon on silicon) wafer or crystal orientation-different silicon wafer, or bonding of a silicon epi-wafer with a silicon wafer can be used as the silicon-bonded substrate.

In the back illuminated photodiode array according to the first embodiment where the semiconductor substrate is constituted with two semiconductor substrates as described above, the only difference in the manufacturing method for the back illuminated photodiode array is that the semiconductor substrates 3a and 3b are made different in plane orientation.

A manufacturing method for the back illuminated photodiode array in the case where a semiconductor substrate used in the back illuminated photodiode array according to the second embodiment is constituted with two semiconductor substrates as described above will be explained by referring to FIG. 19 through FIG. 26. The following steps of (1) to (9) will be sequentially carried out in the manufacturing method.

(1) Substrate Preparing Step

Figure 19:
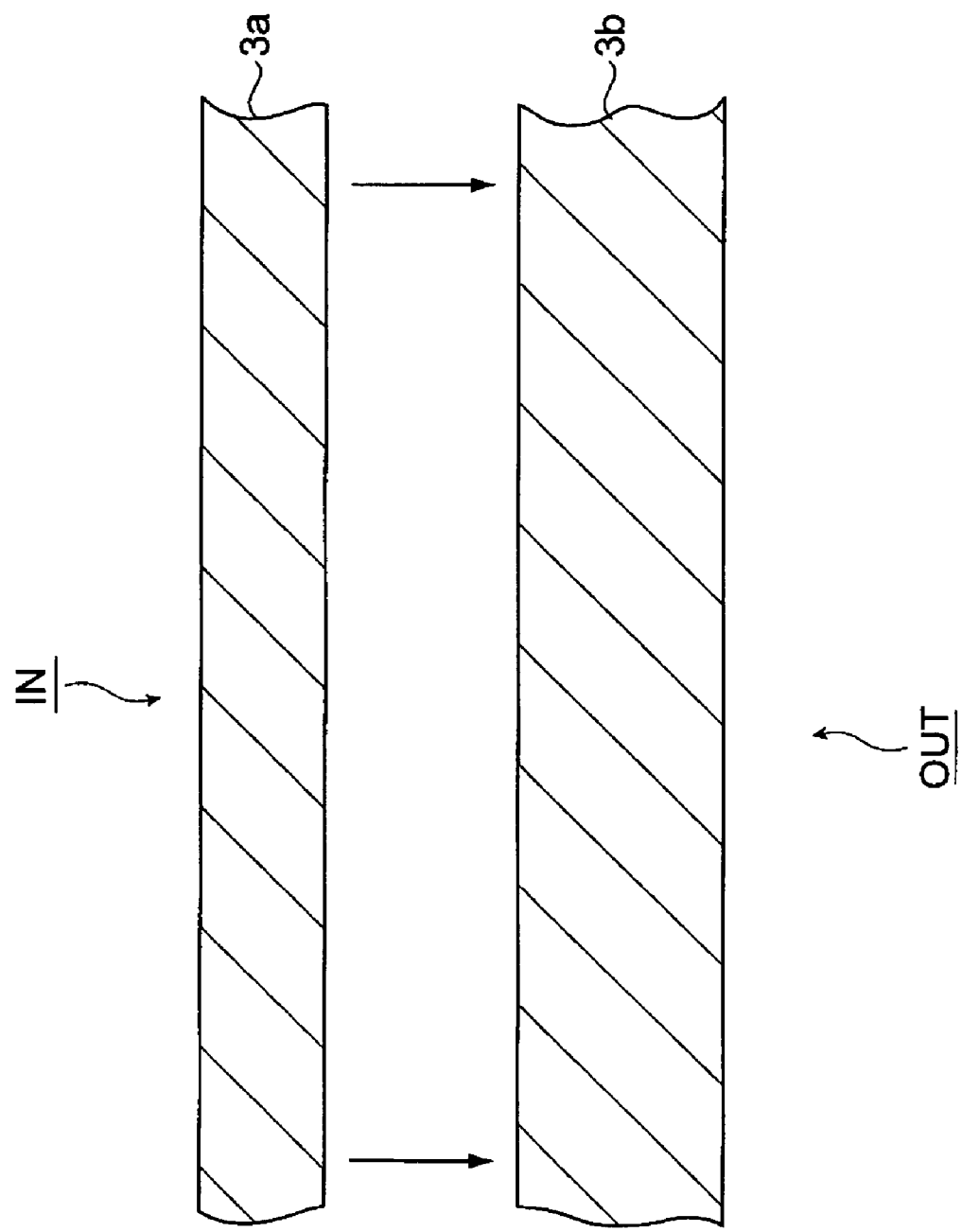
FIG. 19 is a view explaining a manufacturing method for the back illuminated photodiode array according to the third embodiment.

FIG. 19 is a view for explaining the manufacturing method for the back illuminated photodiode array according to the third embodiment.

First, first and second semiconductor substrates 3a and 3b are prepared. The first semiconductor substrate 3a is an n-type (111) silicon substrate, while the second semiconductor substrate 3b is an n-type (100) silicon substrate. Namely, these semiconductor substrates 3a and 3b are different in the crystal plane orientation of mutually opposing surfaces.

(2) Substrate Bonding Step

Figure 20:
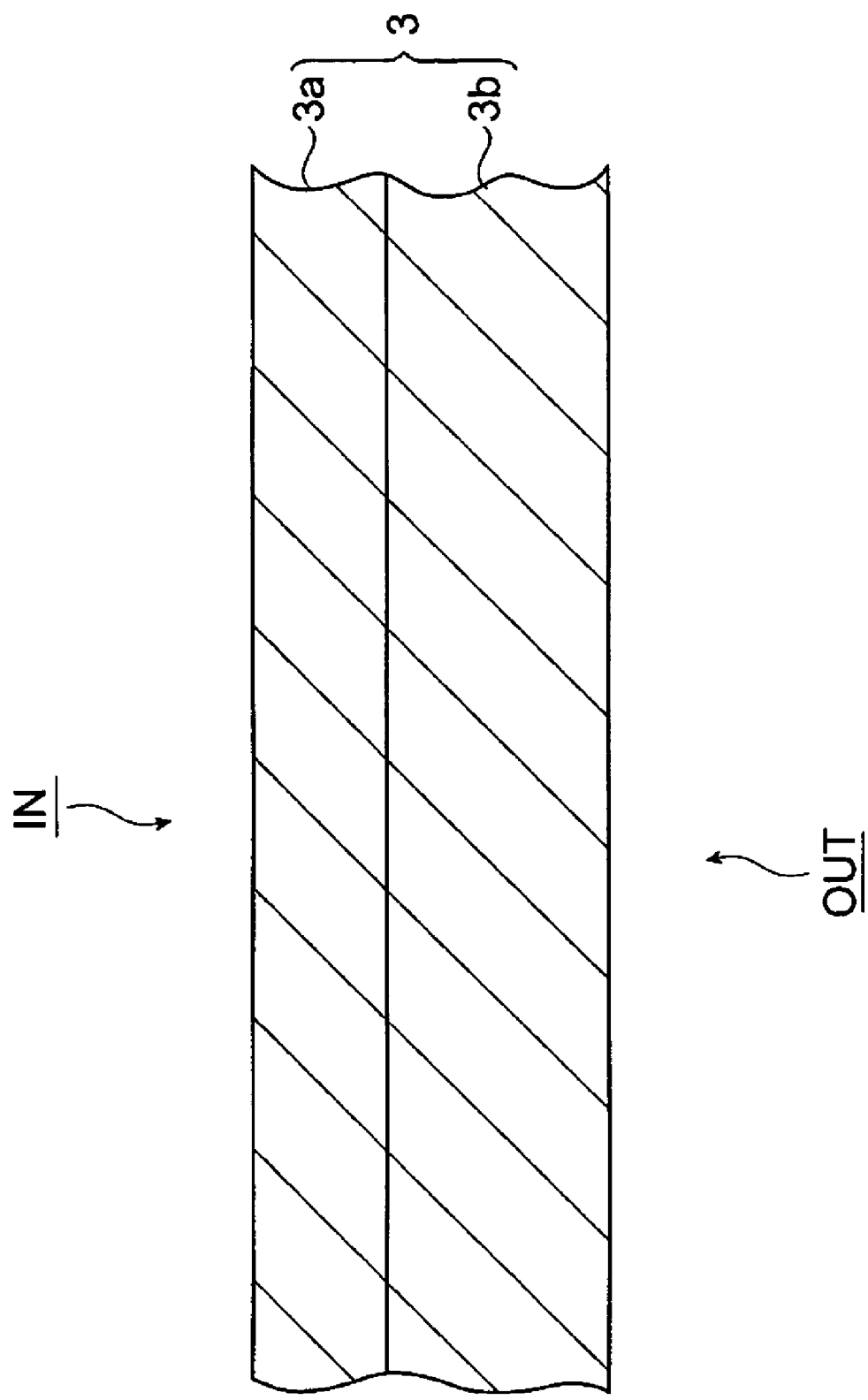
FIG. 20 is a view explaining a manufacturing method for the back illuminated photodiode array according to the third embodiment.

FIG. 20 shows a semiconductor substrate 3 composed of semiconductor substrates 3a and 3b.

After the opposing surfaces of the first and second semiconductor substrates 3a and 3b are activated, the first and second semiconductor substrates 3a and 3b are heated, whenever necessary, and bonded together, while pressure is given to the thickness direction.

The surface activation can be achieved by irradiating ions to the opposing surface of the semiconductor substrate in a vacuum. Etching the substrate front surface by using beams of inert gases such as argon (Ar) in vacuum makes it possible to remove a front surface layer of the substrate. A new surface of the semiconductor substrate from which the front surface layer is removed is maintained strongly bonded with other atoms. Bonding can be made by putting a front surface of the first semiconductor substrate with that of the second semiconductor substrate in vacuum. Such a bonding method is called surface activated bonding (SAB).

(3) Separation Region and Impurity Diffusion Region Forming Step

Figure 21:
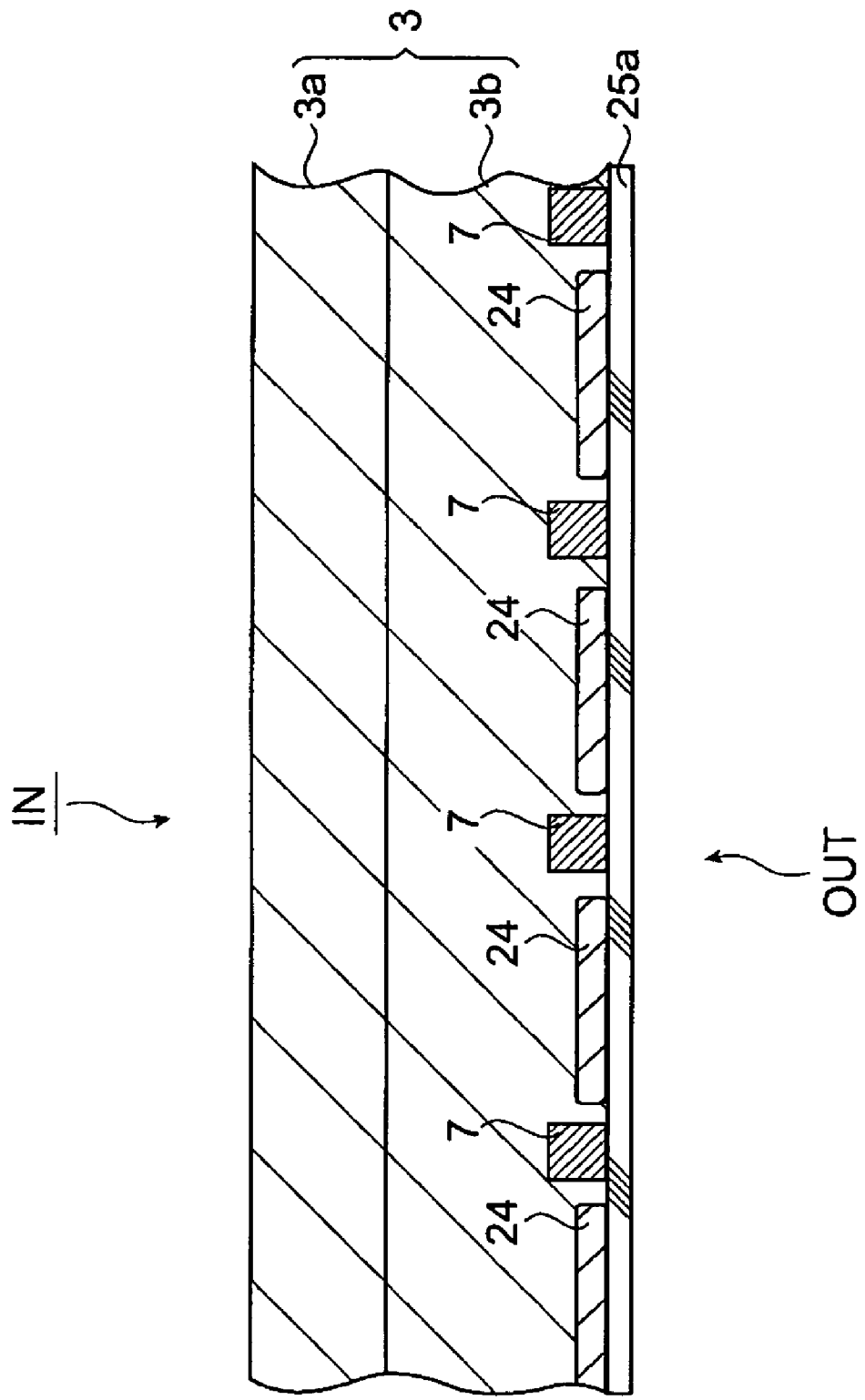
FIG. 21 is a view explaining a manufacturing method for the back illuminated photodiode array according to the third embodiment.

FIG. 21 shows a semiconductor substrate where a separation region and an impurity diffusion region are formed. An n-type separation region 7 is formed on the opposite surface OUT side of the semiconductor substrate 3. On the opposite surface OUT side of the n-type semiconductor substrate 3, an opening is given by a photolithography etching process to an $SiO_2$ film at a region corresponding to the separation region 7. Similarly, the $SiO_2$ film is removed on the light-incident surface IN side of the n-type semiconductor substrate 3. Then, on the opposite surface OUT side of the n-type semiconductor substrate 3, phosphorus is thermally diffused to form the separation region 7 with impurity concentrations of about $1\times10^{15}$ to $1\times10^{20}/cm^3$, and the semiconductor substrate 3 is further thermally oxidized to form an $SiO_2$ film which covers the opposite surface OUT of the substrate on the separation region 7 side.

Thereafter, a designated region of this $SiO_2$ film is subjected to etching, which is used as a mask to form a $p^+$ type impurity diffusion region 24 and then polish the light-incident surface. The separation region 7 is electrically separated from adjacent impurity diffusion regions 24. In other words, p-type impurities such as boron are diffused on the opposite surface OUT side of the n-type semiconductor substrate 3 to form the $p^+$ type impurity diffusion region 24. The $p^+$ type impurity diffusion region 24 is formed adjacently and spaced at a certain interval from the separation region 7. Thereafter, annealing or thermal diffusion is carried out to form an SiO$_2$ film 25a on the opposite surface OUT.

(4) SiN$_x$ Film Forming Step

Figure 22:
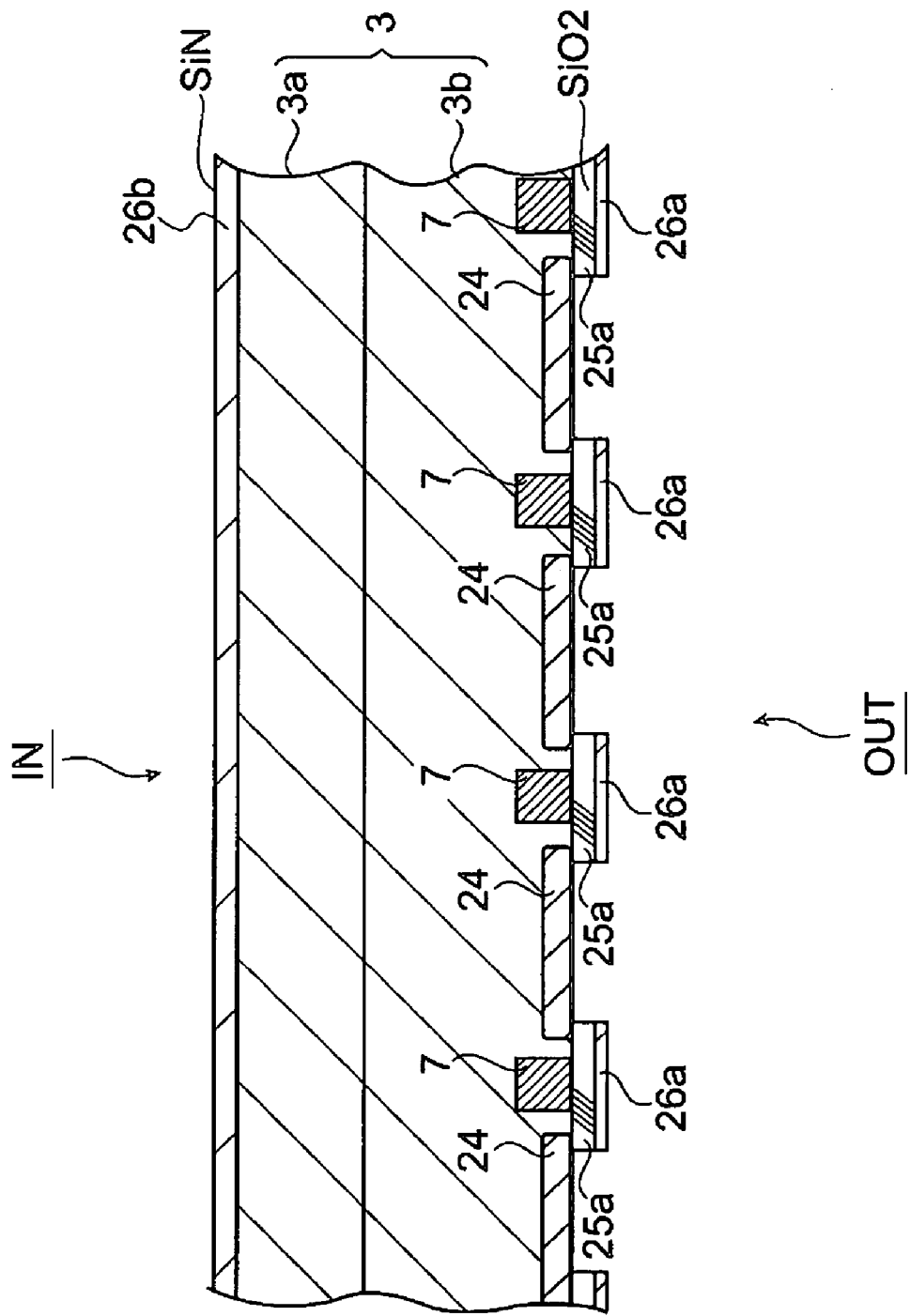
FIG. 22 is a view explaining a manufacturing method for the back illuminated photodiode array according to the third embodiment.

FIG. 22 shows a semiconductor substrate where SiN$_x$ films 26a and 26b are formed.

First, the LP-CVD method is used to form SiN$_x$ films 26a and 26b on the opposite surface OUT of the semiconductor substrate 3 and the light-incident surface IN. Then, the etching process is carried out to remove SiN$_x$ film 26a and SiO$_2$ film 25a at a region which is to be used for forming the recessed portions 4 at a subsequent step (removal step).

(5) Recessed Portion Forming Step

Figure 23:
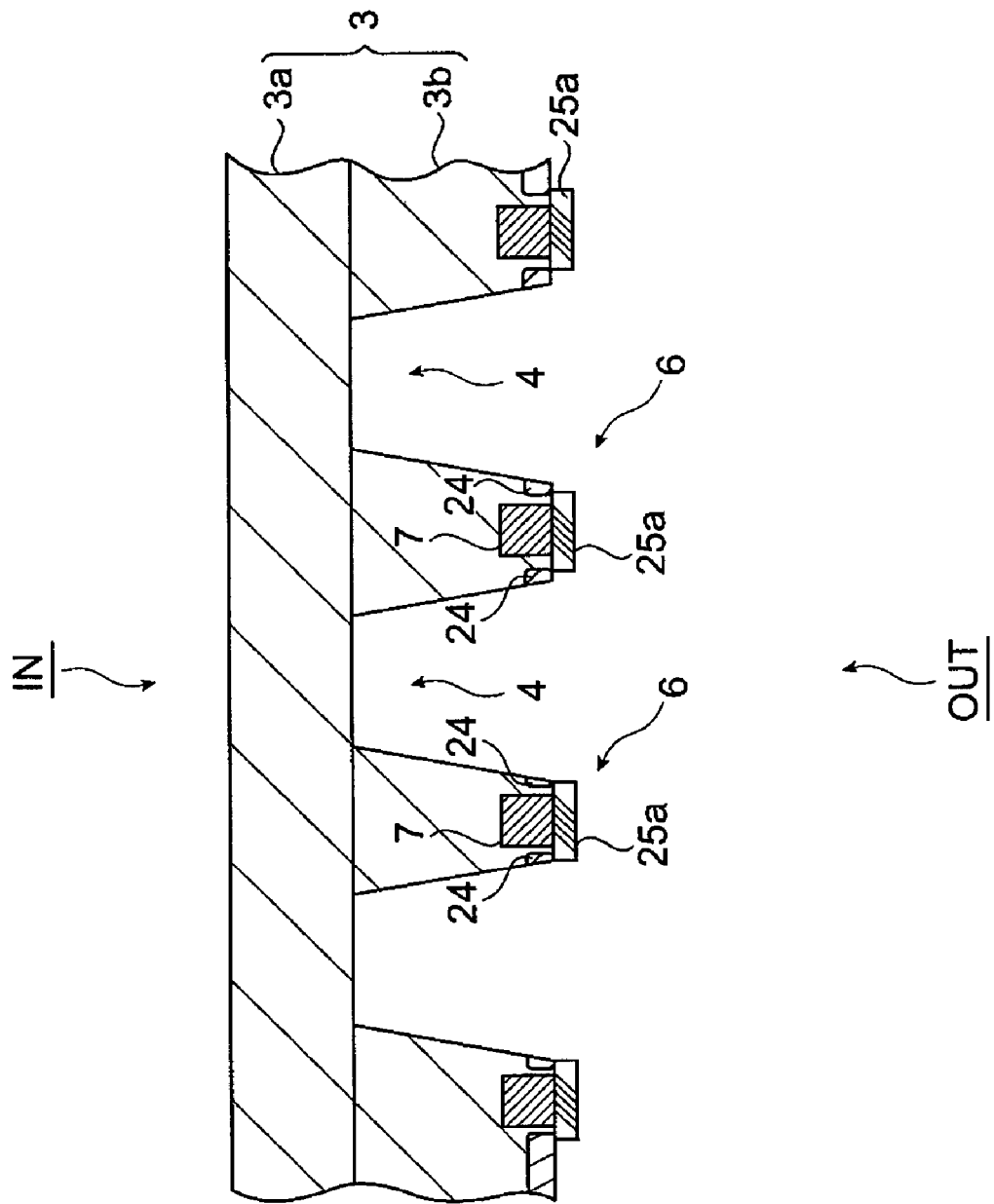
FIG. 23 is a view explaining a manufacturing method for the back illuminated photodiode array according to the third embodiment.

FIG. 23 shows a semiconductor substrate where the recessed portions 4 are formed.

First, anisotropic etching is given by an alkaline etching method using a potassium hydroxide solution or others to a surface region of the semiconductor substrate from which SiN$_x$ film 26a and SiO$_2$ film 25a have been removed by the above step, thus forming the recessed portions 4 and the frame part 6. After etching SiN$_x$ films 26a, 26b are removed.

In this instance, depth by the anisotropic etching is set to be at least 2 μm, by which the recessed portions 4, the opening of which gradually reduces from the opposite surface OUT side to the light-incident surface IN side are formed on the opposite surface OUT side of the semiconductor substrate 3.

(6) Impurity Diffusion Region Forming Step

Figure 24:
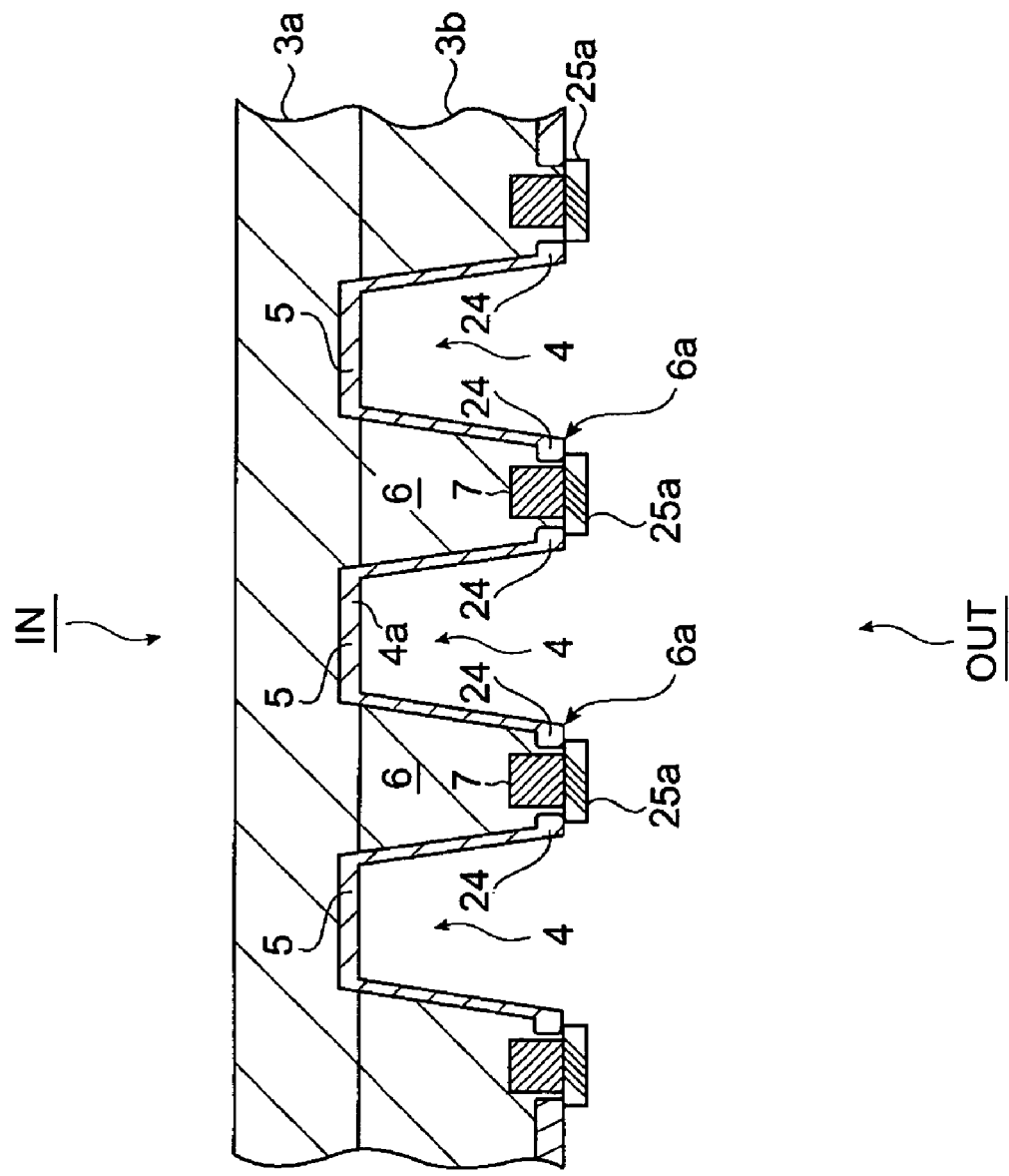
FIG. 24 is a view explaining a manufacturing method for the back illuminated photodiode array according to the third embodiment.

FIG. 24 shows a semiconductor substrate where an impurity diffusion region 5 is formed.

P-type impurities such as boron are doped by thermal diffusion or ion implantation to the bottom 4a and side surface 4b of the recessed portions 4 which have been exposed by the anisotropic etching. This step will form a p$^+$ type impurity diffusion region 5 from the edge part 6a of the frame part 6 through the side surface 4b of the recessed portions 4 to the bottom 4a of the recessed portions 4. The doped impurity is activated by annealing carried out at an appropriate step.

Namely, this step provides a region to be used as photodiodes. Since the p$^+$ type impurity diffusion region 5 is provided in a manner extended from the bottom 4a to the edge part 6a bordering on the recessed portions 4 and the frame part 6, an unnecessary carrier can be trapped to inhibit production of dark current.

(7) Accumulation Layer Forming Step

Figure 25:
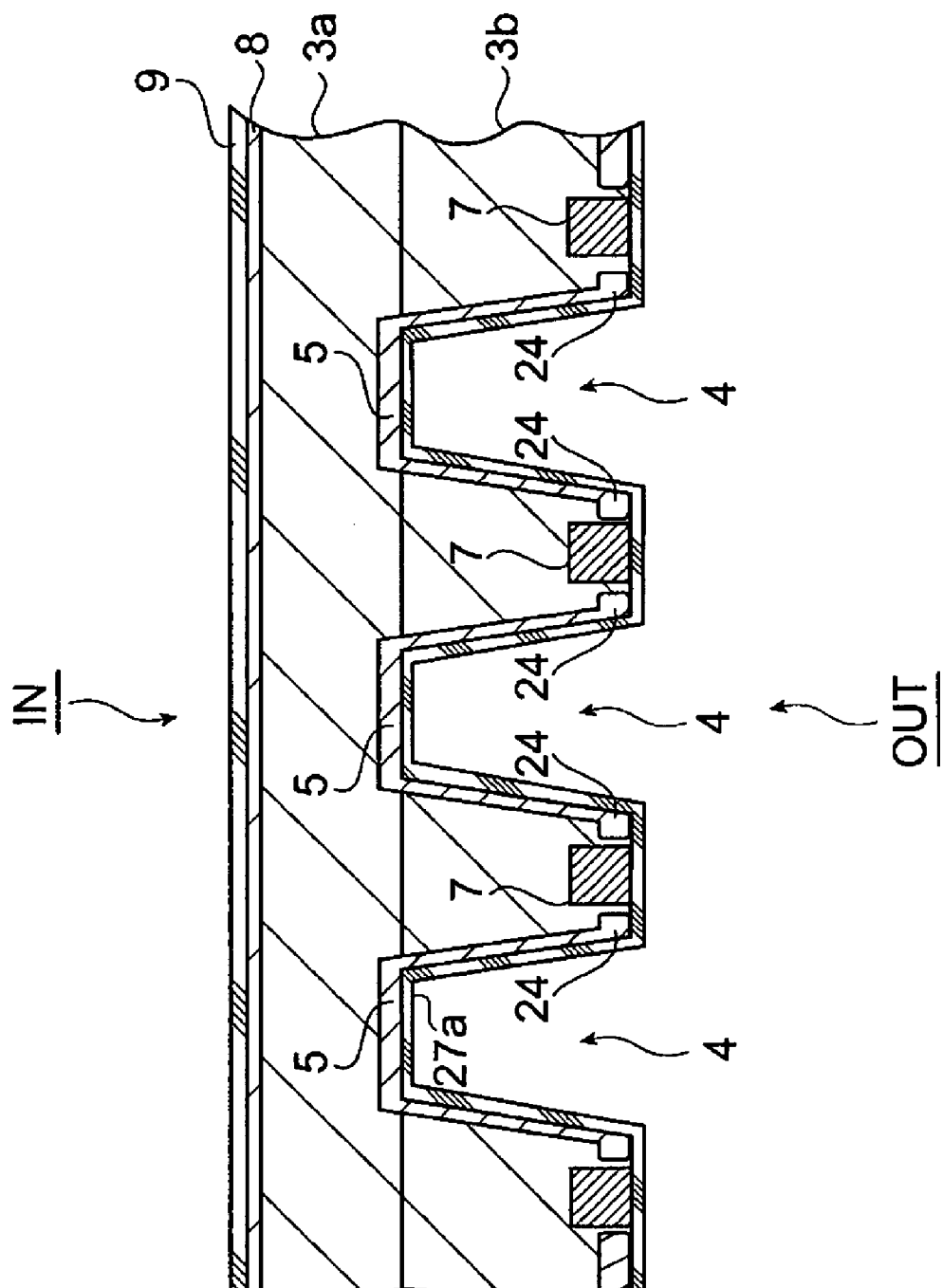
FIG. 25 is a view explaining a manufacturing method for the back illuminated photodiode array according to the third embodiment.

FIG. 25 shows a semiconductor substrate where an accumulation layer a is formed.

Thermal oxidation of the semiconductor substrate 3 results in coating of the front surface with SiO$_2$ film 27a. SiN$_x$ films 26a and 26b (refer to FIG. 22) used as an etching mask have been removed. Thereafter, an oxide film is formed on the light-incident surface IN side of the n-type semiconductor substrate 3 and then arsenic is implanted into the semiconductor substrate 3 through the oxide film and the semiconductor substrate 3 is thermally oxidized. The accumulation layer 8 is formed through these steps.

Then, after the SiO$_2$ film formed by thermal oxidation on the back surface side of the n-type semiconductor substrate 3 is once removed, the light-incident surface IN is again subjected to thermal oxidation to form an AR film 9.

(8) Wiring Step

Figure 26:
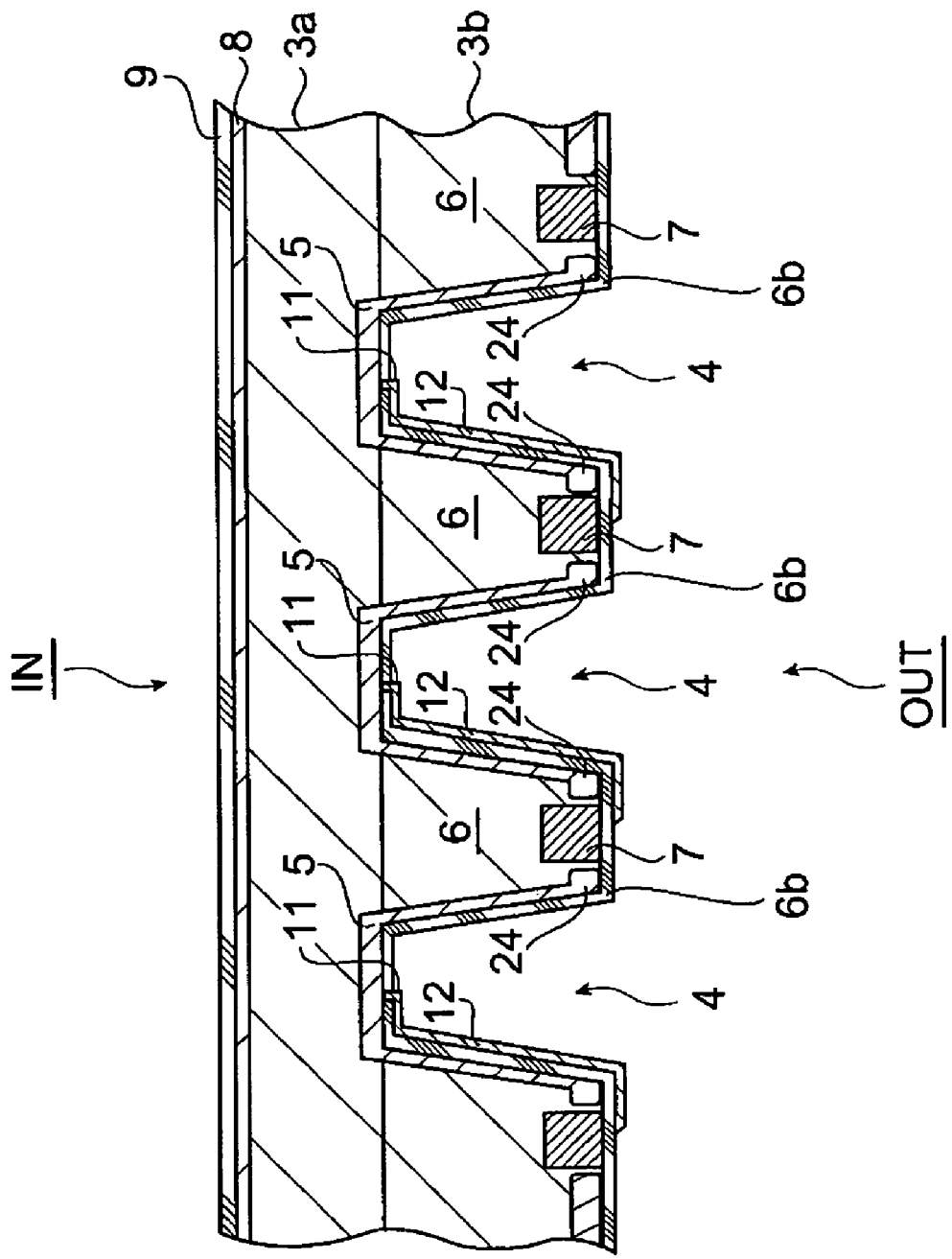
FIG. 26 is a view explaining a manufacturing method for the back illuminated photodiode array according to the third embodiment.

FIG. 26 shows a semiconductor substrate where an aluminum wiring 12 is formed.

First, a contact hole 11 extending to the p$^+$ type impurity diffusion region 5 is formed at the bottom 4a on the SiO$_2$ film 27a. Then, the aluminum wiring 12 is patterned on the frame part 6.

(9) Electrode Forming Step

Finally, as likely as shown in FIG. 2, a passivation film 14 is formed on the opposite surface side of the n-type semiconductor substrate 3 except at a region where a UBM 13a is formed. Then, the UBM 13a is formed on the aluminum wiring 12 made on the frame part 6 and a bump electrode 13b is formed on the UBM 13a to obtain the back illuminated photodiode array 20 according to the third embodiment. A contact hole may be made on an insulation film 27a located at the top surface of the frame part 6 to connect the impurity diffusion region 5 with the bump electrode 13b through this contact hole.

Fourth Embodiment

The back illuminated photodiode array according to the fourth embodiment is provided with an insulation layer (etching stop layer) such as SiO$_2$ between the first semiconductor substrate 3a and the second semiconductor substrate 3b in the back illuminated photodiode array 1 according to the first or the second embodiment. For example, a second semiconductor substrate 3b is to have an insulation layer on the surface, and the semiconductor substrate 3 is constituted through the insulation layer by connecting the second semiconductor substrate 3b to the first semiconductor substrate 3a. In other words, the insulation layer is formed on a bonded surface. The insulation layer may be formed on the bonded surface of the first semiconductor substrate 3a.

In this embodiment, the depth of the recessed portions formed by etching is not controlled by a difference in the above substrate plane orientation, but controlled by an insulation layer (etching stop layer).

In this instance, an SiO$_2$ film, an insulation layer, is not subjected to alkaline etching. In other words, the etching stop layer is resistant to a specific etching agent (for example, KOH aqueous solution). Where the second semiconductor substrate 3b is subjected to alkaline etching at the above recessed portion forming step, etching can be stopped easily by the SiO$_2$ film since the SiO$_2$ film is not subjected to alkaline etching.

According to the fourth embodiment, since the back illuminated photodiode array is provided with the SiO$_2$ film (etching stop layer) at a designated depth from the front surface, the recessed portions 4 can be formed by etching the semiconductor substrate 3 from the front surface side, and after removal of the SiO$_2$ film at the bottom 4a, a similar step can be carried out to provide the back illuminated photodiode array 1.

A manufacturing method for the back illuminated photodiode array wherein the semiconductor substrate used in the back illuminated photodiode array according to the first embodiment is, as described above, constituted with two semiconductor substrates, between which an insulation layer is placed, is to simply allow an insulation layer to exist on a bonded surface of another semiconductor substrate.

Furthermore, a manufacturing method for the back illuminated photodiode array wherein the semiconductor substrate used in the back illuminated photodiode array according to the second embodiment is, as described above, constituted with two semiconductor substrates, between which an insulation layer is placed will be explained by referring to FIG. 27 through FIG. 33. The following steps from (1) through (9) will be carried out sequentially in the manufacturing method.

(1) Substrate Preparing Step

Figure 27:
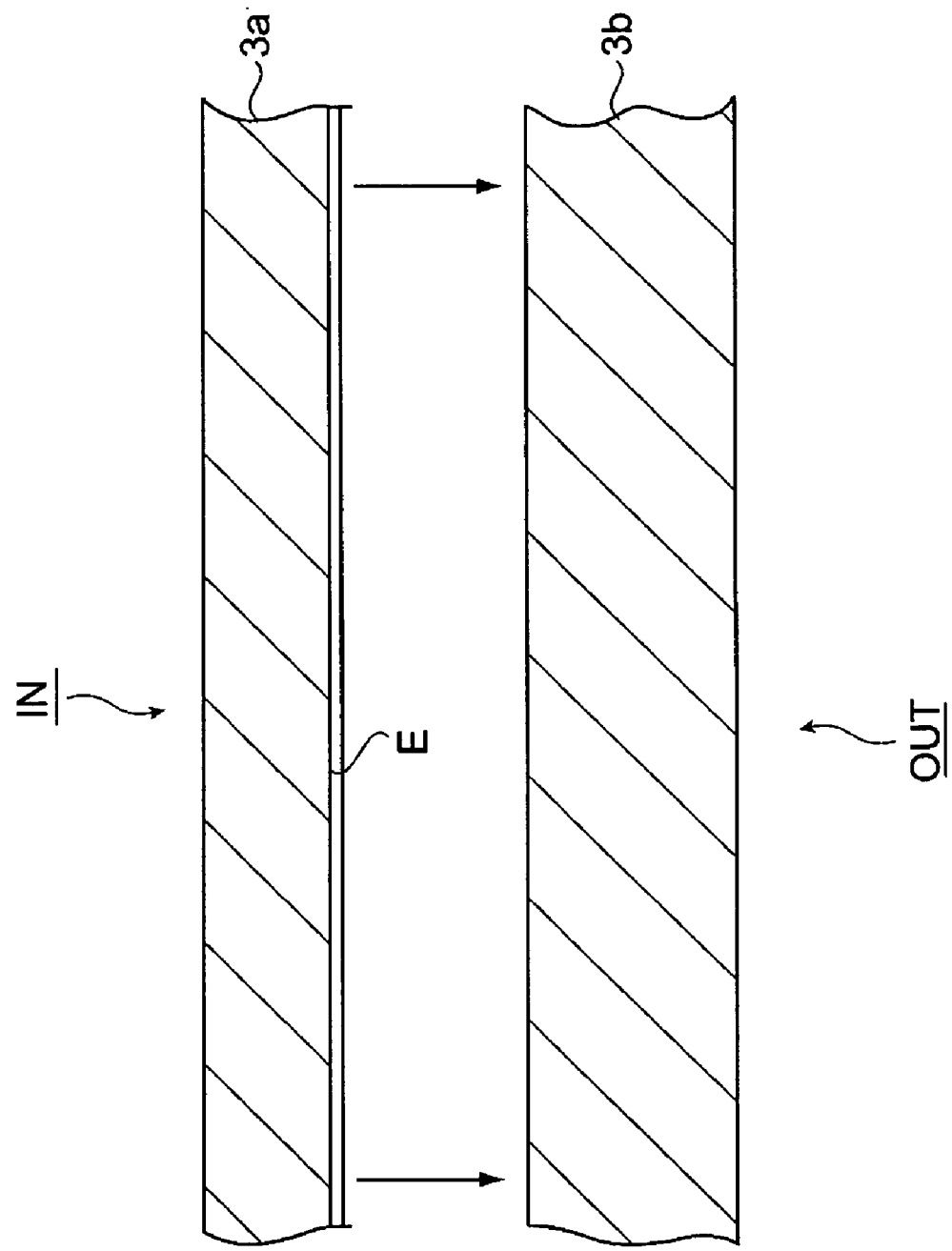
FIG. 27 is a view explaining a manufacturing method for the back illuminated photodiode array according to the fourth embodiment.

FIG. 27 is a view for explaining a manufacturing method for the back illuminated photodiode array according to the fourth embodiment.

First, first and second semiconductor substrates 3a and 3b are prepared. The first semiconductor substrate 3a is an n-type (100) silicon substrate, and the second semiconductor substrate 3b is also an n-type (100) silicon substrate. An insulation layer (etching stop layer) E is formed on the surface opposing the semiconductor substrate 3a. These semiconductor substrates may be made different in the crystal orientation of each opposing surface.

(2) Substrate Bonding Step

Figure 28:
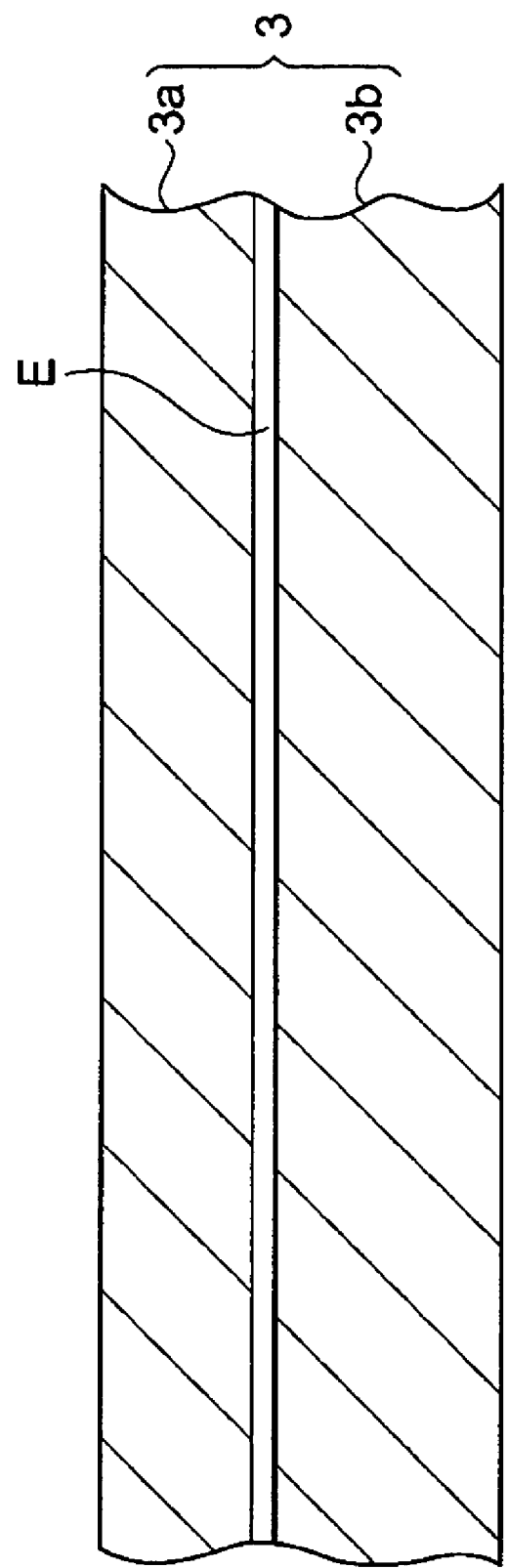
FIG. 28 is a view explaining a manufacturing method for the back illuminated photodiode array according to the fourth embodiment.

FIG. 28 shows a semiconductor substrate 3 composed of semiconductor substrates 3a and 3b.

After the opposing surfaces of the first and second semiconductor substrates 3a and 3b are activated, the first and second semiconductor substrates 3a and 3b are heated, whenever necessary, and bonded together, while pressure is given to the thickness direction. The surface activation is given as described above.

(3) Separation Region and Impurity Diffusion Region Forming Step

Figure 29:
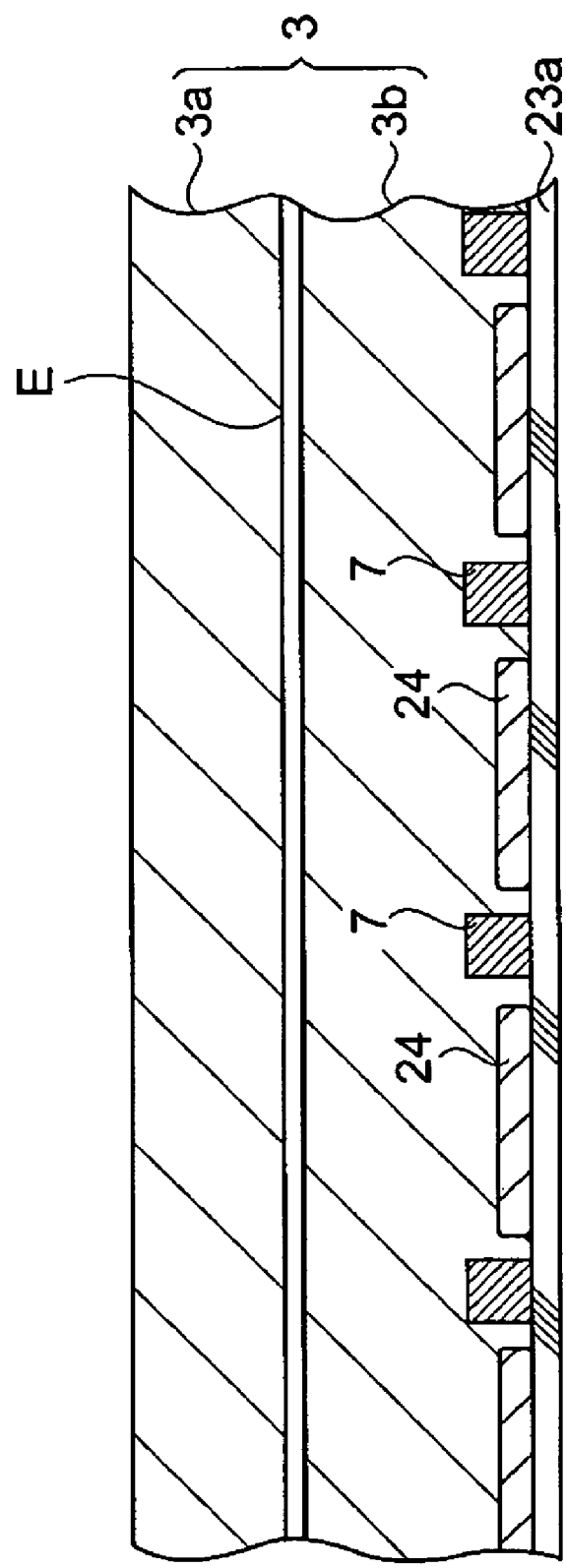
FIG. 29 is a view showing a manufacturing method for the back illuminated photodiode array according to the fourth embodiment.

FIG. 29 shows a semiconductor substrate where a separation region 7 and an impurity diffusion region 24 are formed.

This step is the same as the step for forming the separation region and the impurity diffusion region according to the third embodiment.

(4) SiN$_x$ Film Forming Step

Figure 30:
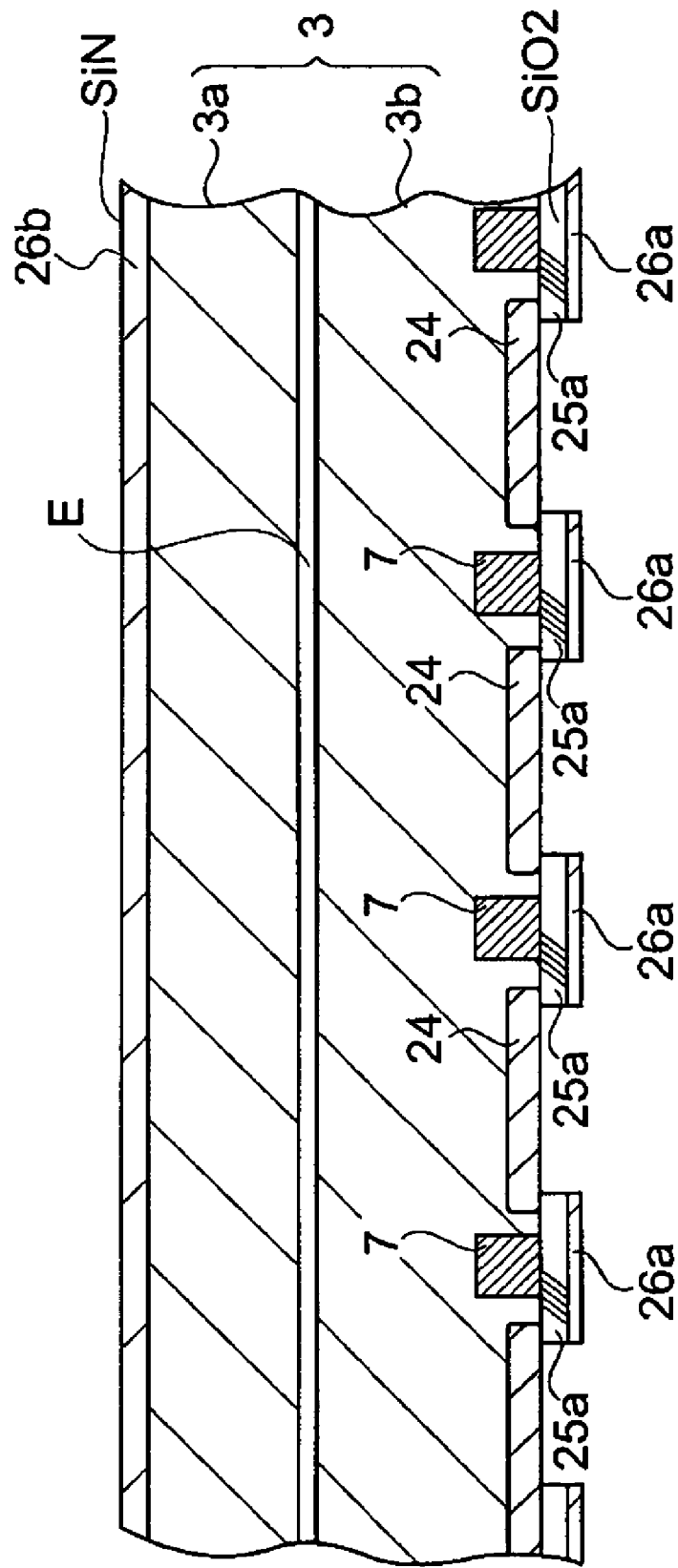
FIG. 30 is a view explaining a manufacturing method for the back illuminated photodiode array according to the fourth embodiment.

FIG. 30 shows a semiconductor substrate where SiN$_x$ films 26a and 26b are formed. This step is the same as the step for forming the separation region and the impurity diffusion region according to the third embodiment, and provided with a step for partially removing SiN$_x$ film 26a and SiO$_2$ film 25a.

(5) Recessed Portion Forming Step

Figure 31:
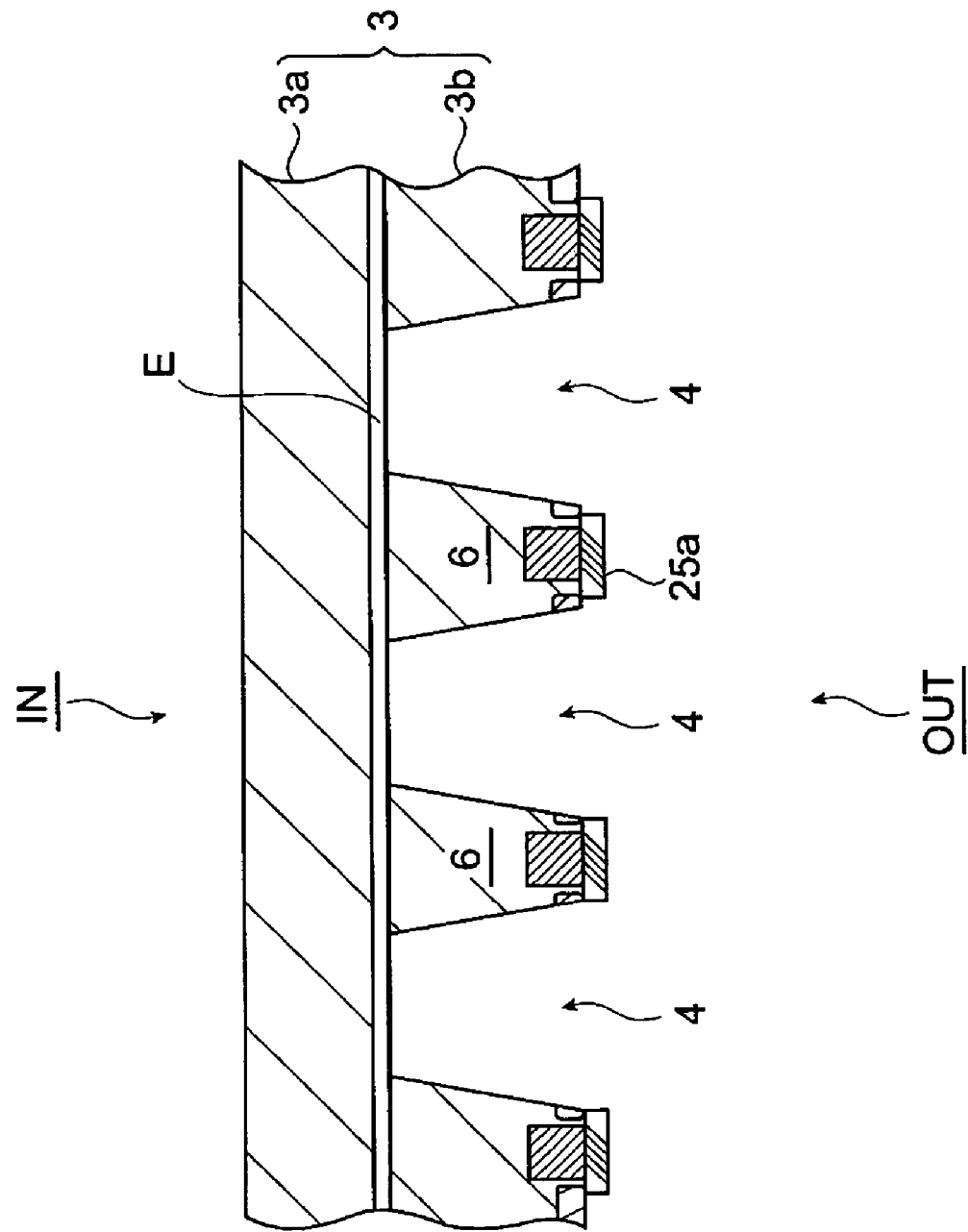
FIG. 31 is a view explaining a manufacturing method for the back illuminated photodiode array according to the fourth embodiment.

FIG. 31 shows a semiconductor substrate where the recessed portions 4 are formed.

First, anisotropic etching is given by an alkaline etching method using a potassium hydroxide solution or others to a surface region of the semiconductor substrate from which SiN$_x$ film 26a and SiO$_2$ film 25a have been removed by the above removing step, thus forming the recessed portions 4 and the frame part 6. The SiN$_x$ film 26a and 26b that has been exposed is all removed. This etching will be stopped at the time when the front surface of insulation layer E is exposed. Herein, depth by the anisotropic etching is set to be as thick as the second semiconductor substrate 3b (at least 2 μm).

This step provides the recessed portions 4 on the opposite surface OUT side of the semiconductor substrate 3, the opening of which gradually reduces from the opposite surface OUT side to the light-incident surface IN side.

(6) Impurity Diffusion Region Forming Step

Figure 32:
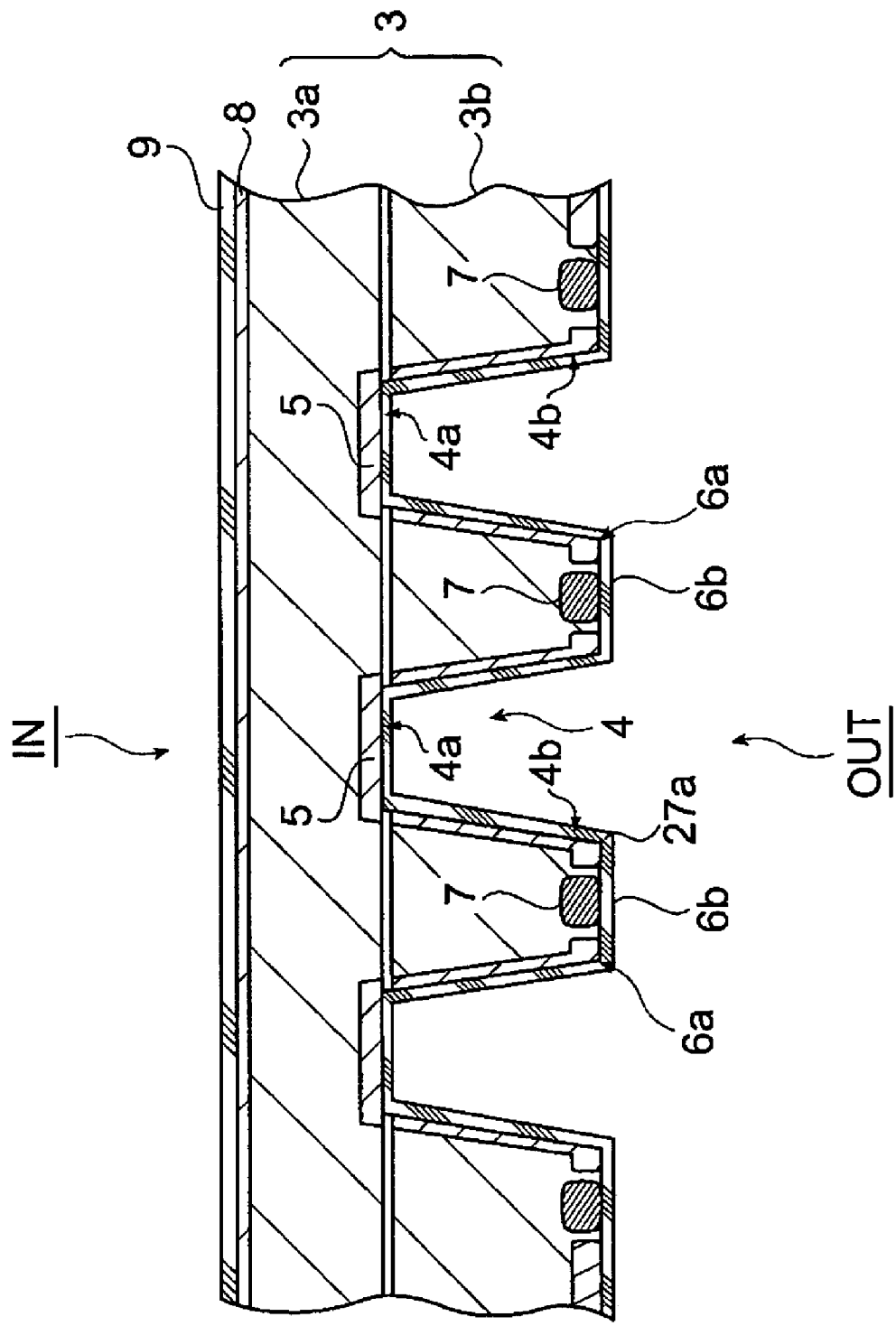
FIG. 32 is a view explaining a manufacturing method for the back illuminated photodiode array according to the fourth embodiment.

FIG. 32 shows a semiconductor substrate where an impurity diffusion region 5 and an accumulation layer 8 are formed before diffusion, the insulation layer E on the bottom 4a of the recessed portion is removed by etching.

P-type impurities such as boron are doped by a diffusion method or ion implantation method to the bottom 4a and side surface 4b of the recessed portions 4 which have been exposed by the anisotropic etching. The doped impurity is activated by annealing carried out at an appropriate step. This step will form the p$^+$ type impurity diffusion region 5 from the edge part 6a of the frame part 6 through the side surface 4b of the recessed portions 4 to the bottom 4a of the recessed portions 4. Namely, this step provides a region to be used as photodiodes. Since the p$^+$ type impurity diffusion region 5 is provided in a manner extended from the bottom 4a to the edge part 6a bordering on the recessed portions 4 and the frame part 6, an unnecessary carrier can be trapped to inhibit production of dark current.

(7) Accumulation Layer Forming Step

Thermal oxidation of the semiconductor substrate 3 results in coating of the front surface with SiO$_2$ film 27a. First, SiN$_x$ films 26a and 26b (refer to FIG. 30) used as an etching mask are removed. After an oxide film is formed on the light-incident surface IN side of the n-type semiconductor substrate 3, arsenic is implanted into the semiconductor substrate 3 through the oxide film, and the semiconductor substrate 3 is then thermally oxidized to form the accumulation layer 8 and AR film 9. This step for forming the accumulation layer is the same as the step for forming the accumulation layer according to the third embodiment.

(8) Wiring Step

Figure 33:
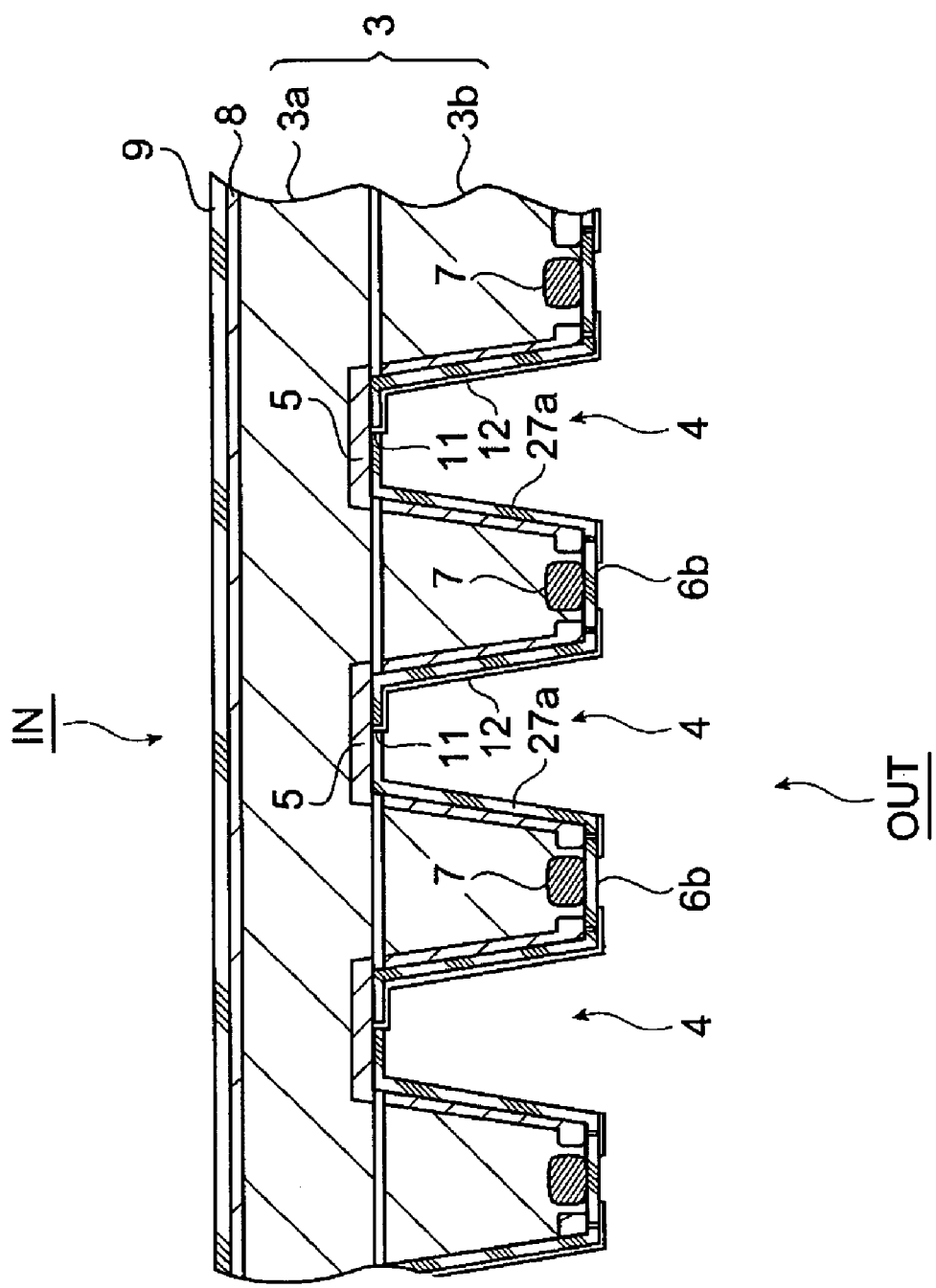
FIG. 33 is a view explaining a manufacturing method for the back illuminated photodiode array according to the fourth embodiment.

FIG. 33 shows a semiconductor substrate where an aluminum wiring 12 is formed. This wiring forming step is the same as the wiring forming step according to the third embodiment.

First, a contact hole 11 extending to the p$^+$ type impurity diffusion region 5 is formed at a site where an impurity diffusion region 5 (or top surface 6b of the frame part 6) of the SiO$_2$ film 27a is present. Then, contact holes are formed on the top of the frame part 6 and the aluminum wiring 12 is patterned on the frame part 6.

(9) Electrode Forming Step

Finally, as likely as shown in FIG. 2, a passivation film 14 is formed on the opposite surface of the n-type semiconductor substrate 3 except for a region where a UBM 13a is formed. Then, the UBM 13a is formed on the aluminum wiring 12 made on the frame part 6 and the bump electrode 13b is formed on the UBM 13a to obtain the back illuminated photodiode array according to the fourth embodiment. Regarding the embodiment, a description of the insulation layer E is omitted and the back illuminated photodiode array is shown in FIG. 2.

When the impurity diffusion region 5 in also on the side wall 4b, a contact hole should be made on an insulation film 27a located at the top surface of the frame part 6, adding at the bottom of the recessed portion to connect the impurity diffusion region 5 with the bump electrode 13b through this contact hole. The impurity diffusion region 5 may be only the bottom 4a, then the contact hole 11 on the top surface is not recessed.

The above etching stop layer E may not be necessarily an insulation layer as long as it is resistant to an etching agent.

The n-type terminal may be made at the position of bump electrode 7 shown in FIG. 1 as known above other embodiments. And in this fourth embodiment, it is necessary for connecting the first semiconductor substrate and the second one to make small recessed portion and wiring.

Fifth Embodiment

Figure 34:
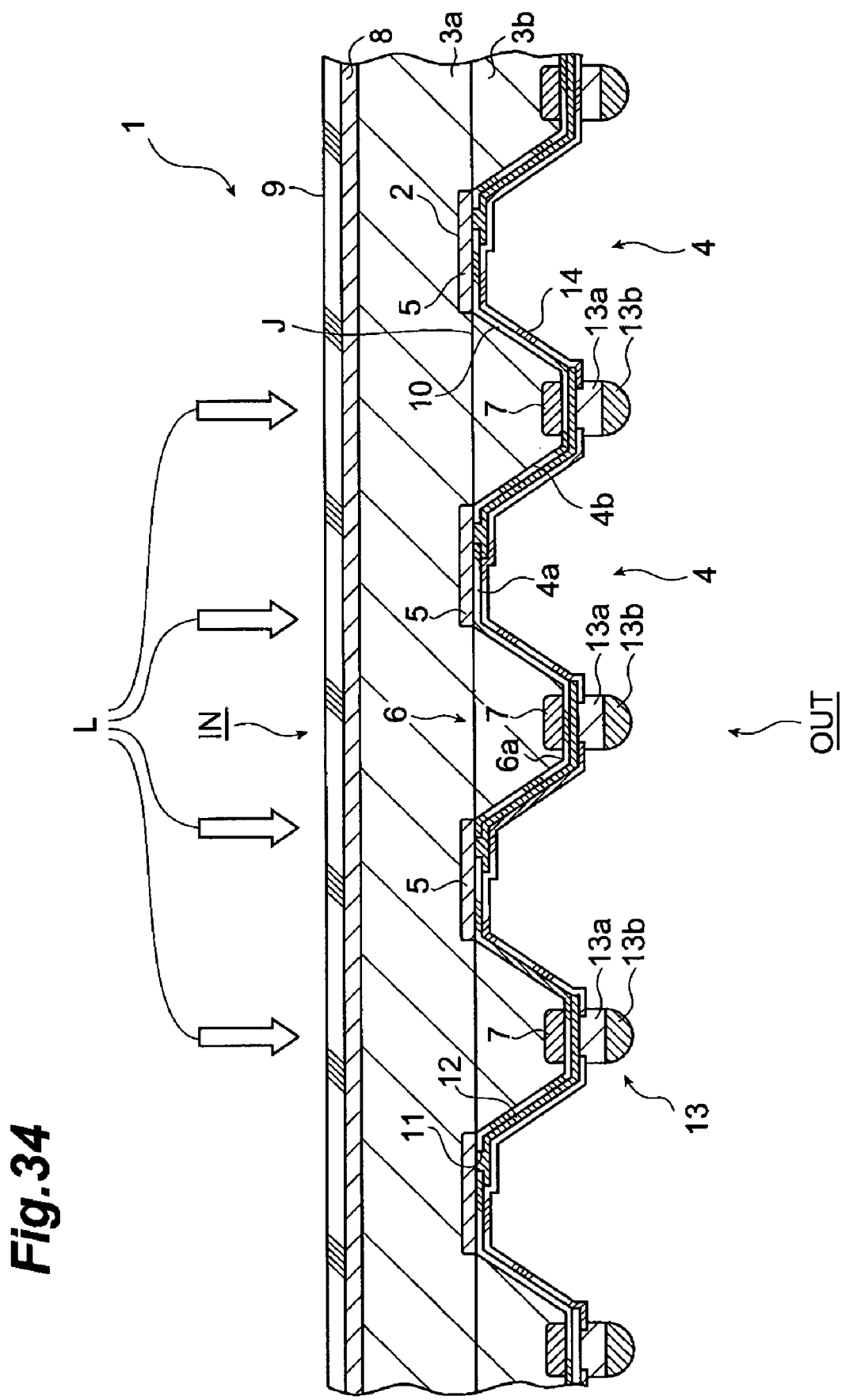
FIG. 34 is a view showing the cross sectional configuration of the back illuminated photodiode array according to the fifth embodiment.

FIG. 34 is a cross sectional configuration of the back illuminated photodiode array according to the fifth embodiment.

This back illuminated photodiode array is constituted by bonding the first and second semiconductor substrates 3a and 3b through a bonded surface J and made smaller in an area of the impurity diffusion region 5, as compared with the photodiode according to the third embodiment given in FIG. 19 through FIG. 26. In this embodiment, the impurity diffusion region 5 is formed only at the bottom 4a of the recessed portions 4. This invention may have such a configuration.

Sixth Embodiment

Figure 35:
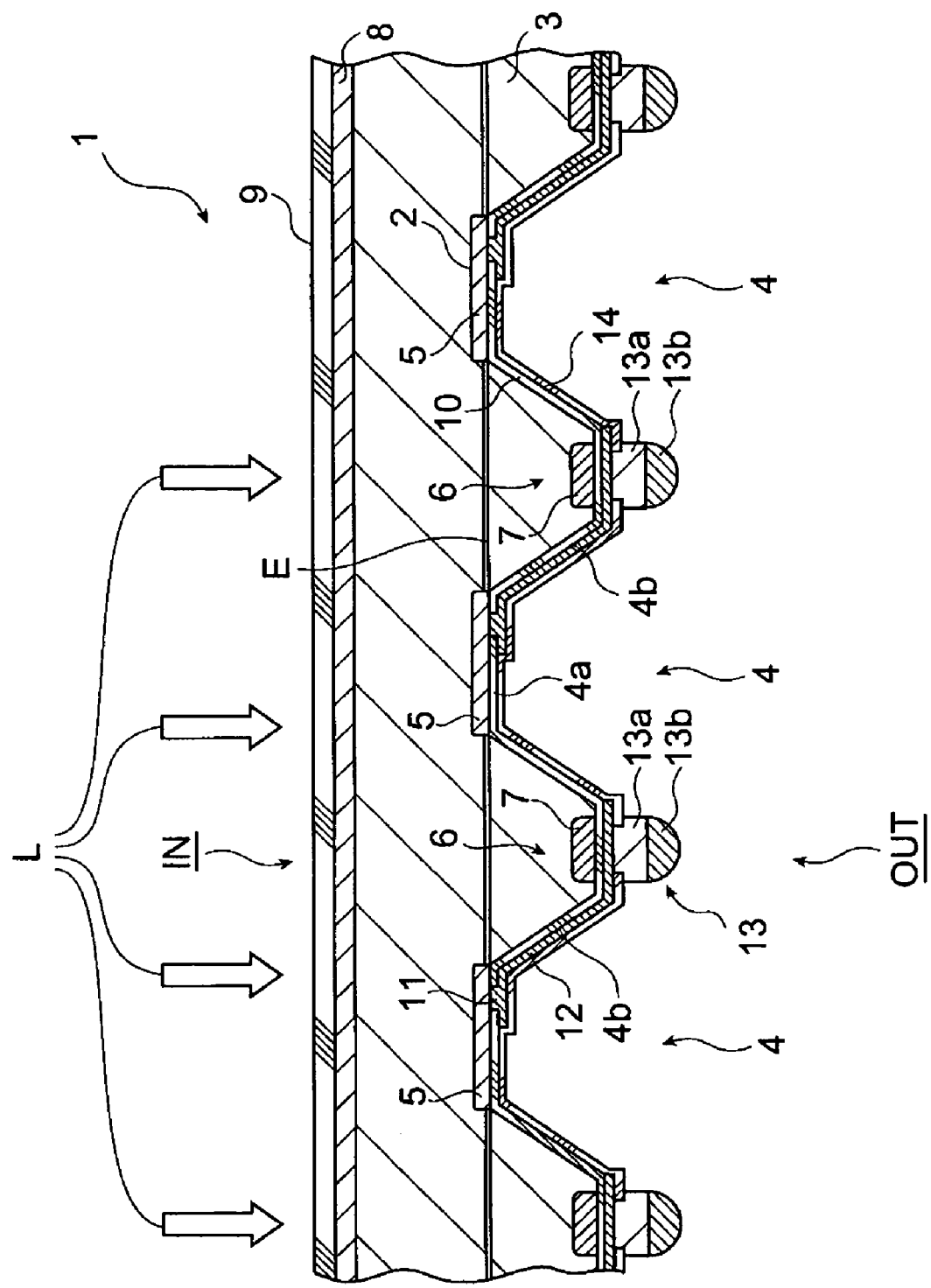
FIG. 35 is a view showing the cross sectional configuration of the back illuminated photodiode array according to the sixth embodiment.

FIG. 35 shows a cross sectional configuration of the back illuminated photodiode array according to the sixth embodiment.

The back illuminated photodiode array is constituted by bonding the first and second semiconductor substrates 3a and 3b together through the etching stop layer (insulation layer) E and made smaller in an area of the impurity diffusion region 5, as compared with the photodiode according to the fourth embodiment as explained in FIG. 27 through FIG. 33. Namely, in this embodiment, the impurity diffusion region 5 is formed only at the bottom of the recessed portions 4. As a matter of course, the invention may have such a configuration.

As described above, semiconductor substrates used in this embodiment may include a semiconductor substrate constituted by bonding two semiconductor substrates whose crystal orientations are different, a semiconductor substrate constituted by bonding two semiconductor substrates through an etching stop layer or a semiconductor substrate constituted by bonding two semiconductor substrates through an insulation layer. Herein, depth of the etching can be controlled easily. Furthermore, as with the first embodiment, after bonding with a semiconductor substrate in which PN junction 2 is previously formed, the recessed portions may be formed. As with the second embodiment, after formation of the recessed portions, PN junction 2 may be formed.

Semiconductor Device

Figure 36:
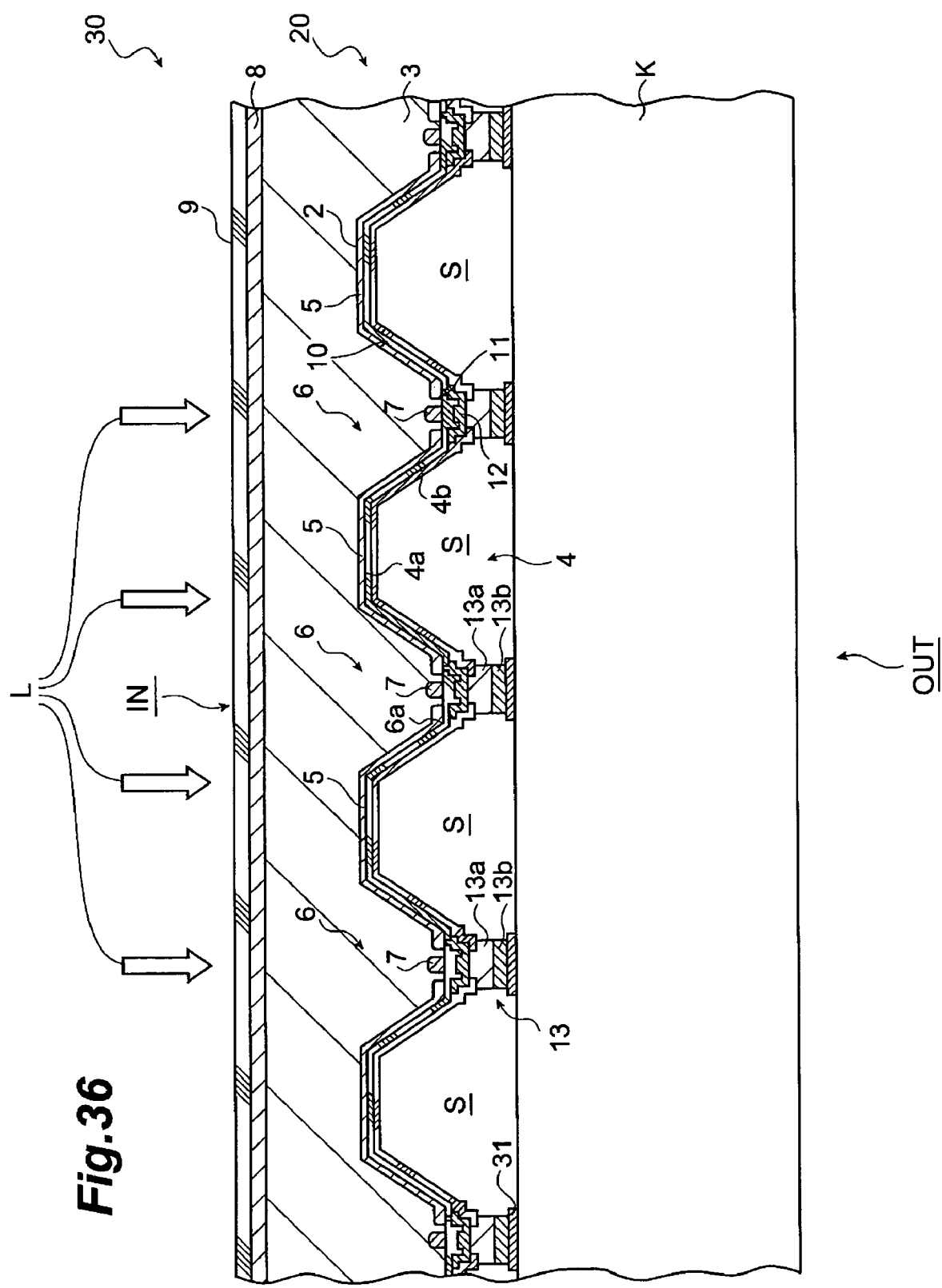
FIG. 36 is a schematic view showing the cross sectional configuration of the semiconductor device.

FIG. 36 is a schematic view showing the cross sectional configuration of a semiconductor device 30.

The semiconductor device 30 is a device in which the back illuminated photodiode array 20 according to the second embodiment is electrically connected to a mounted wiring board K. Namely, in the semiconductor device 30, the mounted wiring board K is provided on the frame part 6 and connected to the back illuminated photodiode array 20 through the bump electrode 13b present on the opposite surface of the n-type semiconductor substrate 3.

Furthermore, in the semiconductor device 30 according to the third embodiment, a space S between the opposite surface of the n-type semiconductor substrate 3 and the mounted wiring board K is given an air.

Connection of a bump electrode 13b with an electrode pad 31 on the wiring board side of the mounted wiring board K is effected by flip chip bonding. The bump electrode 13b used in this instance may include conductive bumps including metals such as solder, gold, nickel and copper, in addition to conductive resins.

In the semiconductor device 30 according to this embodiment, then-type semiconductor substrate 3 is connected to the mounted wiring board K with the bump electrode 13b provided at the frame part 6 (thicker part) superior in mechanical strength. In a mounting step, the n-type semiconductor substrate 3 is less likely to undergo mechanical damage. Therefore, an unnecessary carrier resulting from mechanical damage can be inhibited and consequently dark current is also inhibited.

Furthermore, the space S is constituted with an air, which can increase a thermal insulation efficiency between the mounted wiring board K and the n-type semiconductor substrate 3. In the semiconductor device 30, a signal processing circuit 51 or others may be provided on a surface not connected to the n-type semiconductor substrate 3 of the mounted wiring board K (refer to FIG. 41), and heat generated from the signal processing circuit 51 conducts through the mounted wiring board K at $p^+$ type impurity diffusion region 5 (photodiode) of the n-type semiconductor substrate 3, possibly resulting in deterioration of S/N ratio of the photodiode.

As explained in this embodiment, configuration of the space S with an air can inhibit heat which conducts from the mounted wiring board K into the diffusion region 5 (photodiode) of the $p^+$ type impurity, thus increasing the S/N ratio of the photodiode and inhibiting production of dark current.

First Modification Example of the Semiconductor Device

Figure 37:
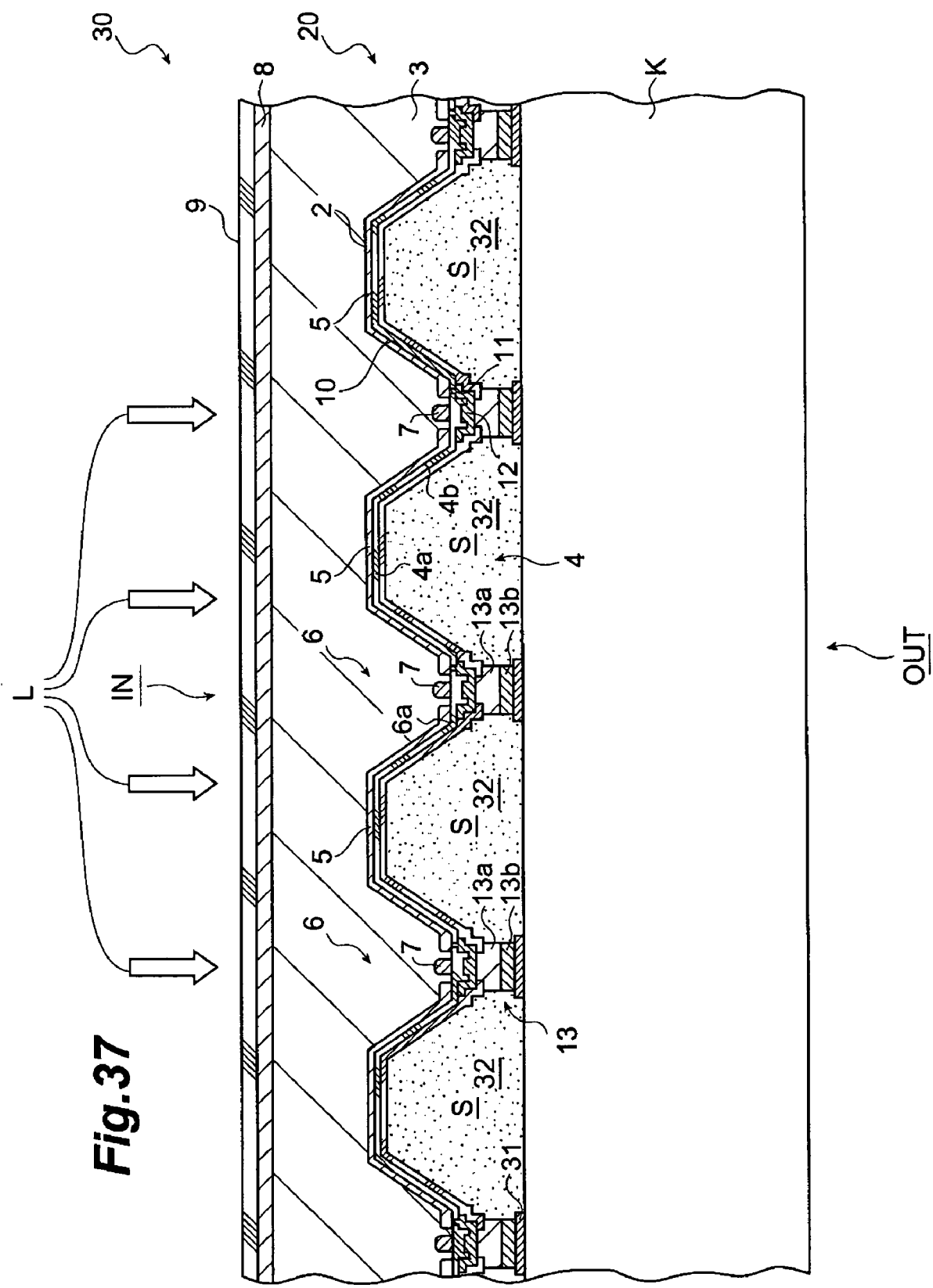
FIG. 37 is a schematic view showing the cross sectional configuration of the first modification example of the semiconductor device.

FIG. 37 shows the first modification example of the above semiconductor device.

In the first modification example of this semiconductor device 30, an under-fill resin 32 composed of epoxy, silicon resin, urethane, acryl or composite material containing them is filled into the space S between the mounted wiring board K and the n-type semiconductor substrate 3. Filling such resin into the space Scan reinforce the n-type semiconductor substrate 3, thus making it possible to bond to the mounted wiring board K in a state superior in mechanical strength. Namely, such a configuration can inhibit warp or distortion of the semiconductor substrate 3.

In place of a step where resin is filled after flip chip bonding, bonding may be carried out by means of anisotropic conductive film (ACF), anisotropic conductive paste (ACP) or non-conductive paste (NCP).

Second Modification Example of the Semiconductor Device

Figure 38:
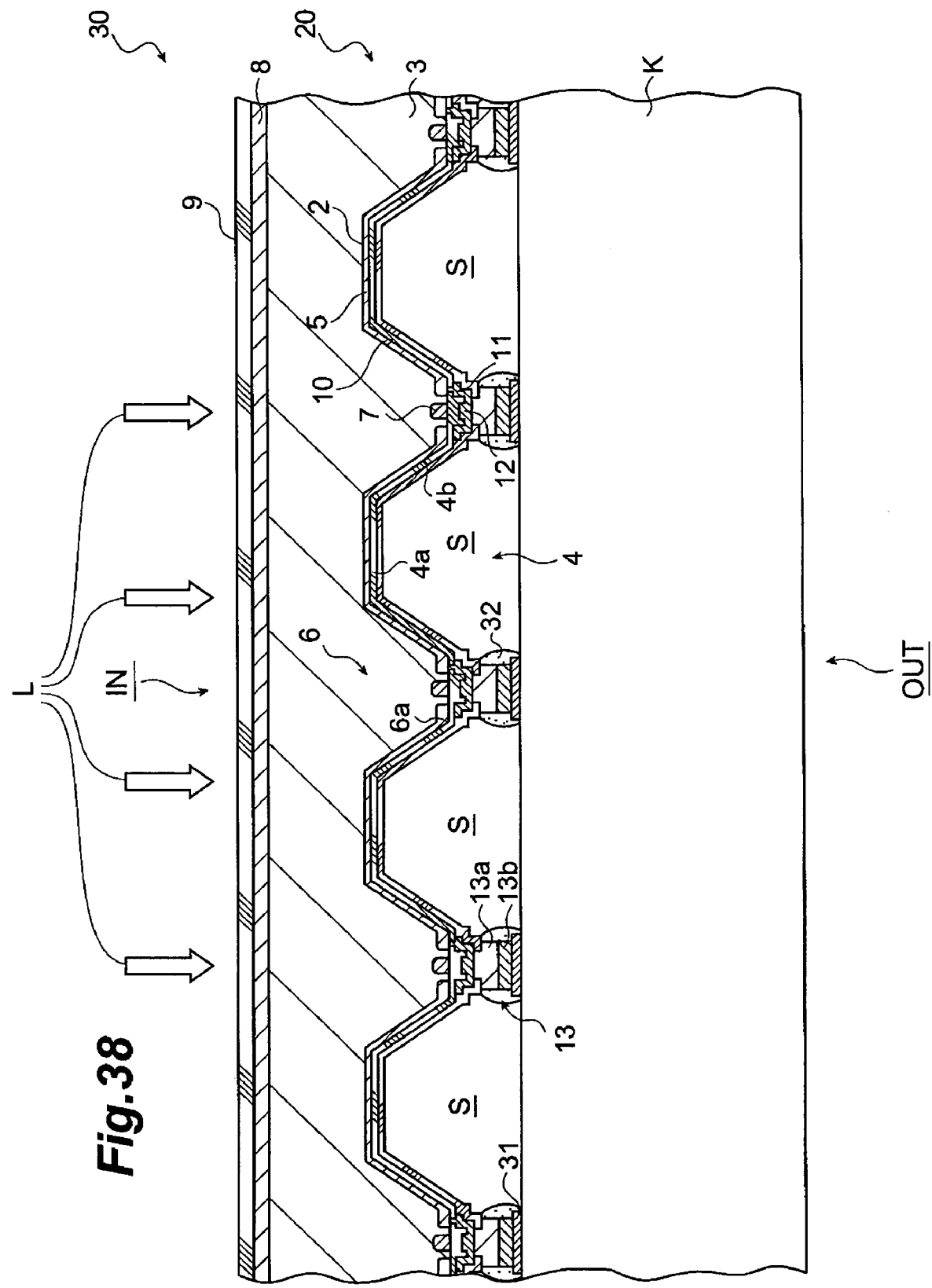
FIG. 38 is a schematic view showing the cross sectional configuration of the second modification example of the semiconductor device.

FIG. 38 shows the second modification example of the above semiconductor device.

In this example, only a connected part of the n-type semiconductor substrate 3 with the mounted wiring board K (connected part of the bump electrode 13b with the electrode pad 31 on the wiring board side) is covered with the under-fill resin 32, and the space S is constituted with air.

Such a configuration makes it possible to reinforce the connected part of the n-type semiconductor substrate 3 with the mounted wiring board K with the under-fill resin 32, thus resulting in improved strength of the connected part.

Furthermore, configuration of the space S with an air layer can inhibit as much heat as possible which coducts into the $p^+$ type impurity diffusion region 5 (photodiode) through the mounted wiring board K.

As described above, the under-fill resin 31 bonding can be carried out by conducting anisotropic conductive film (ACF), anisotropic conductive paste (ACP) or non-conductive paste (NCP).

Radiation Detector

Figure 39:
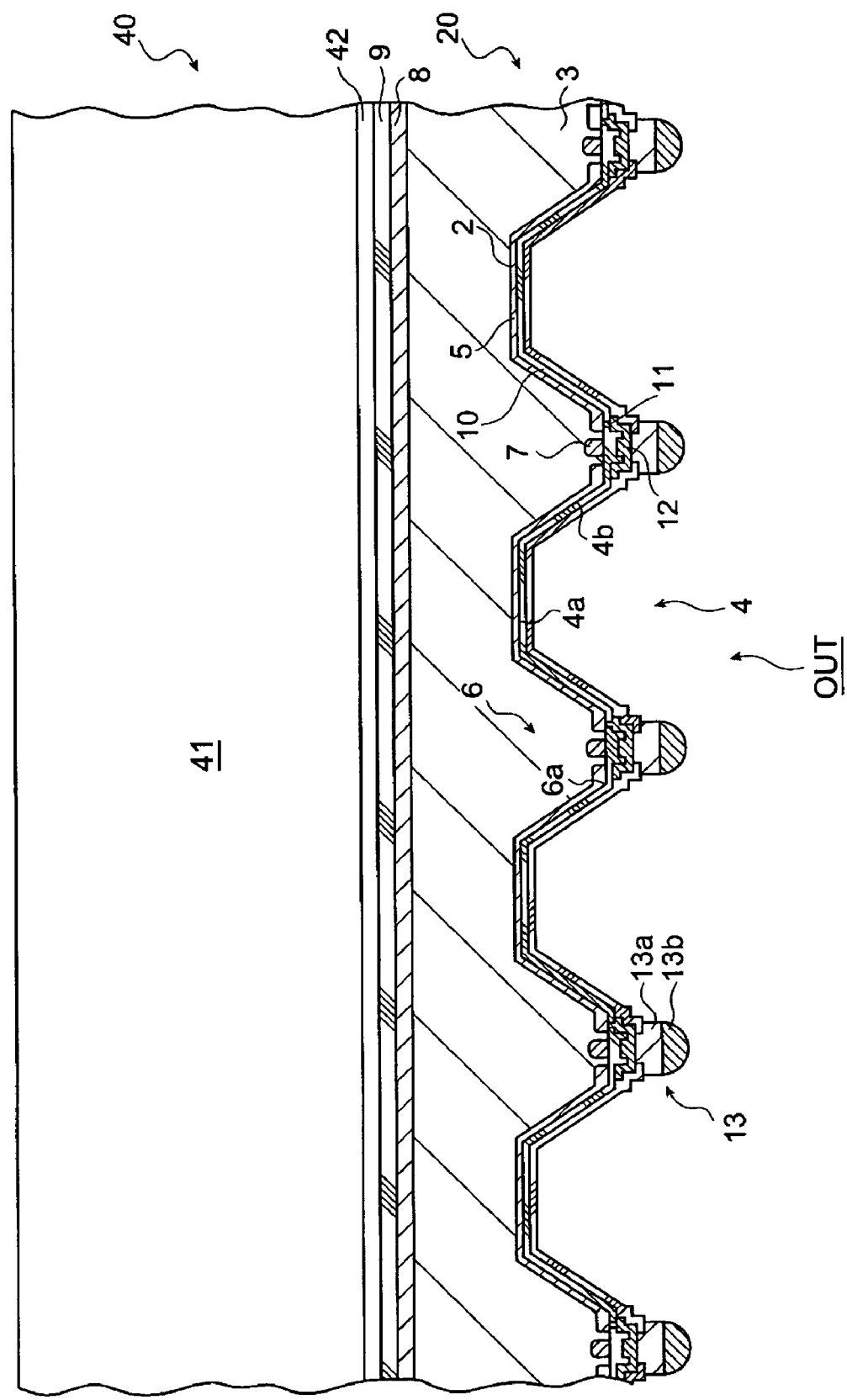
FIG. 39 is a schematic view showing the cross sectional configuration of the radiation detector.

FIG. 39 is a schematic view showing a cross sectional configuration of the radiation detector 40 as a semiconductor device.

This radiation detector 40 is constituted by adhering a scintillator 41 emitting light by incidence of radiation to the light-incident surface IN side of the back illuminated photodiode array 20 according to the second embodiment.

For example, the scintillator 41 is adhered to the back surface of the n-type semiconductor substrate 3 with a coupling resin 42, the refractive index of which is substantially equal to that of the scintillator 41, thus obtaining the radiation detector 40 according to the fourth embodiment.

In general, the scintillator 41 is thicker than the n-type semiconductor substrate 3 and superior in mechanical strength. Adhesion of the n-type semiconductor substrate 3 with the scintillator 41 can mechanically reinforce the n-type semiconductor substrate 3 to inhibit warp or distortion of the n-type silicon substrate. Furthermore, where the scintillator 41 is adhered, the coupling resin 42 can be easily applied due to a flat back surface of the n-type semiconductor substrate 3. Where the scintillator 41 is bonded, there are fewer chances that an adhesive surface may be contaminated with bubbles, etc. In addition, the radiation detector according to this embodiment can be obtained by allowing the scintillator 41 to grow on the light-incident surface of the n-type semiconductor substrate 3.

First Modification Example of the Radiation Detector

Figure 40:
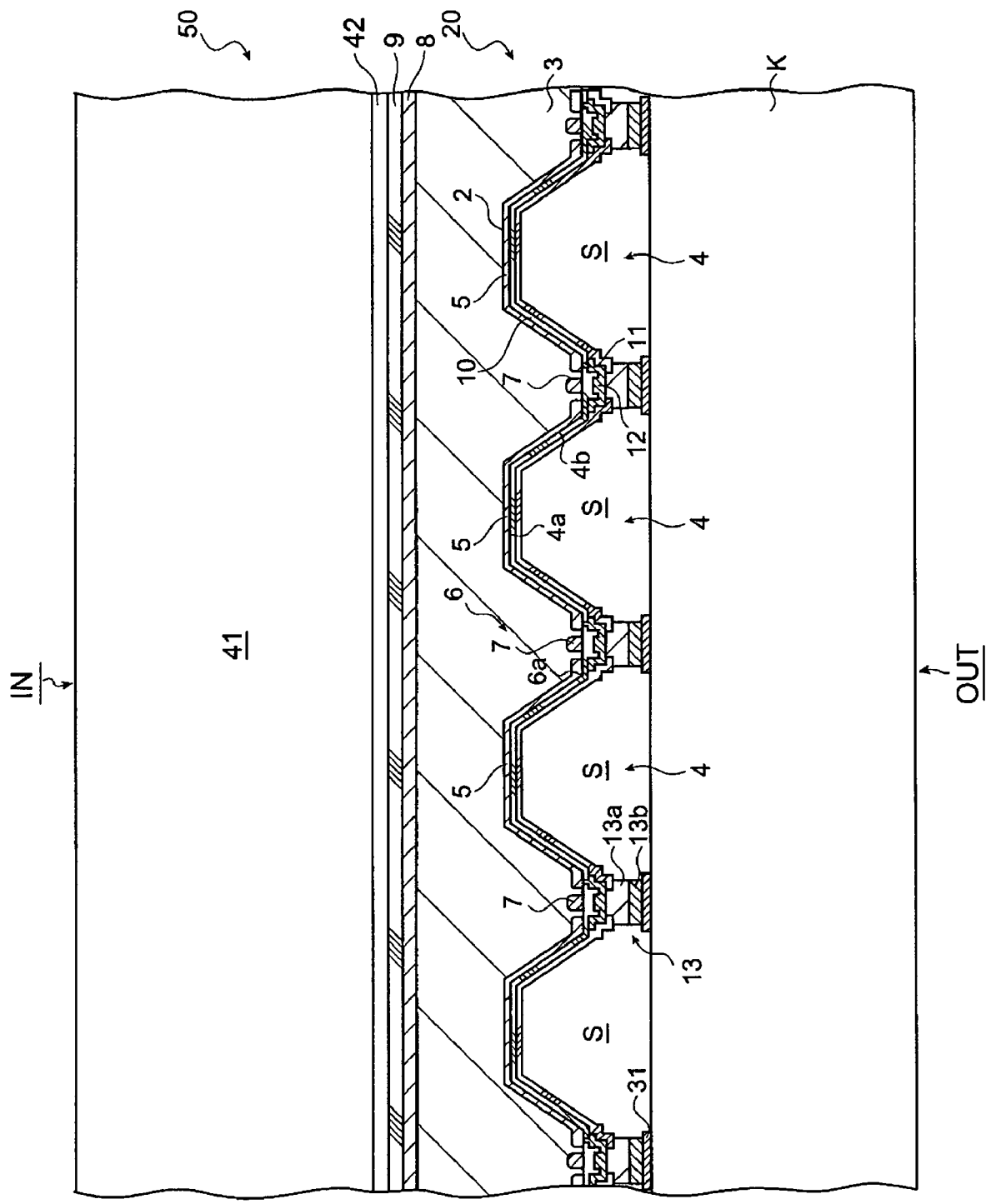
FIG. 40 is a schematic view showing the cross sectional configuration of the radiation detector.

FIG. 40 shows a cross sectional configuration of another radiation detector 50 as a semiconductor device.

A radiation detector 50 is constituted by adhering the scintillator 41 emitting light by incidence of radiation to the light-incident surface IN side of the back illuminated photodiode array 20 according to the second embodiment. The detector is also provided with the mounted wiring board K for supporting the back illuminated photodiode array, and the mounted wiring board K is connected to the back illuminated photodiode array 20 through the bump electrode 13b provided at the frame part 6 existing on the front surface of the n-type semiconductor substrate 3.

In the radiation detector 50 according to this embodiment, the scintillator 41 will emit light when light L such as an X ray is made incident. Fluorescence emitted from the scintillator 41 is made incident on the n-type semiconductor substrate 3 from the light-incident surface side. A carrier will be generated inside the n-type semiconductor substrate 3 depending on the light which is made incident. The generated carrier is detected with the photodiode formed between the $p^+$ type impurity diffusion region 5 and the n-type semiconductor substrate 3. Detected signals are output into the mounted wiring board K through the bump electrode 13b provided on the frame part 6.

This radiation detector 50 is provided with the scintillator 41 adhered on a light-detecting surface of the n-type semiconductor substrate 3, and is superior in mechanical strength. Furthermore, the space S between the mounted wiring board K and then-type semiconductor substrate 3 is given an air, which can inhibit as much heat as possible which conducts into the $p^+$ type impurity diffusion region 5 (photodiode) through the mounted wiring board K.

The under-fill resin 32 can also be filled into the space S (refer to FIG. 37).

In addition, the connected part of the bump electrode 13b with the mounted wiring board K can also be covered with the under-fill resin (refer to FIG. 38). Such a configuration can improve the mechanical strength of the back illuminated photodiode array 20.

Second Modification Example of Radiation Detector

Figure 41:
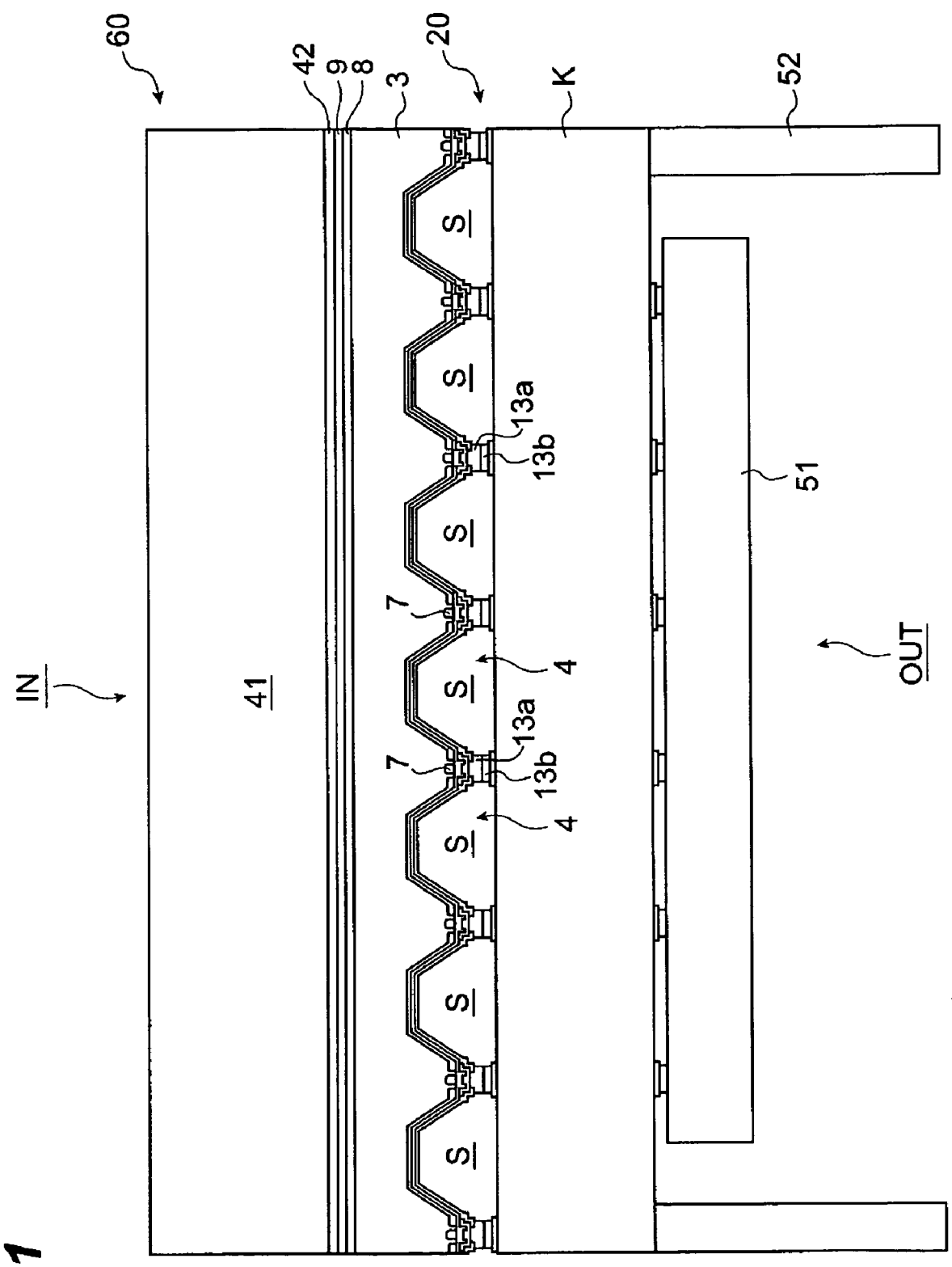
FIG. 41 is a schematic view showing the cross sectional configuration of the radiation detector.
Figure 42:
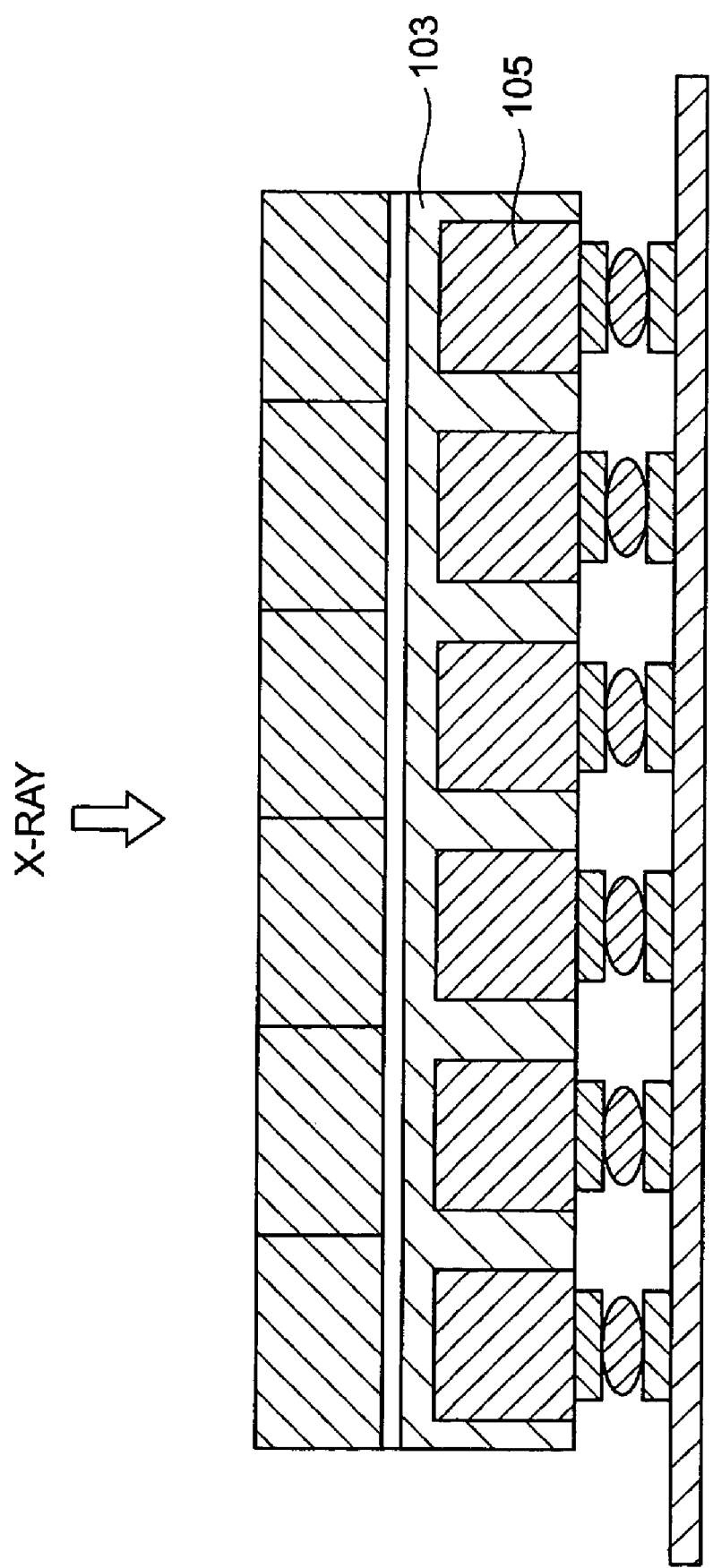
FIG. 42 is a schematic view of the cross sectional configuration of a conventional back illuminated photodiode array.

FIG. 41 is a schematic view showing a cross sectional configuration of another radiation detector 60 as a semiconductor device.

The radiation detector 60 is different from the above radiation detector 50 only in that it is provided with a signal processing circuit 51 and a signal outputting part 52.

The signal processing circuit 51 is provided on the surface which is not connected to the n-type semiconductor substrate 3 of the mounted wiring board K, and connected to the mounted wiring board K with a flip chip or a wire. Also, the signal outputting part 52 may be a pin, lead frame, flexible wiring board or others.

The radiation detector 60 is provided with a scintillator 41 adhered on the light-incident surface of the n-type semiconductor substrate 3 and is superior in mechanical strength. Furthermore, the space S between the mounted wiring board K and the n-type semiconductor substrate 3 is given air, which can inhibit as much heat as possible produced at the signal processing circuit 51 from conducting to the $p^+$ type impurity diffusion region 5 (photodiode) through the mounted wiring board K.

This invention can provide a back illuminated photodiode array which can be easily manufactured, with a high detection sensibility maintained, the manufacturing method, semiconductor device and radiation detector.

As described above, the back illuminated photodiode array according to the invention is provided with a semiconductor substrate 3 of the first conductive type semiconductor, and it is a back illuminated photodiode array wherein a plurality of photodiodes are formed on the opposite surface OUT side of the light-incident surface IN in the semiconductor substrate 3, a plurality of the recessed portions 4 are formed in an array on the opposite surface OUT side of the semiconductor substrate 3, and a second conductive type semiconductor layer 5 composed of second conductive type semiconductors is formed at the bottom 4a of a plurality of the recessed portions 4, thus arranging photodiodes in an array.

What is claimed is:

1. A back illuminated photodiode array comprising:
a first conductive type semiconductor substrate having a light-incident surface and an opposite surface with a plurality of recessed portions located opposite said light-incident surface; and
a plurality of spatially separated second conductive type semiconductor regions, wherein one of said second conductive type regions is located at each bottom of said recessed portions;
wherein said second conductive type semiconductor regions each individually constitute a pn junction together with said first conductive type semiconductor substrate,
wherein said first conductive type semiconductor substrate is thinner in said recessed portions of said first conductive type substrate than in portions of said first conductive type semiconductor substrate located around said recessed portions, and
wherein each of said recessed portions of said first conductive type semiconductor substrate is surrounded by portions of said first conductive type semiconductor substrate that form a frame part, located between a plurality of said recessed portions, which is thicker than and frames the respective recessed portion.

2. A back illuminated photodiode array according to claim 1,
wherein said first conductive type semiconductor substrate is composed of a single semiconductor substrate.

3. A back illuminated photodiode array according to claim 1,
wherein said first conductive type semiconductor substrate is composed of a first semiconductor substrate including said light-incident surface and a second semiconductor substrate bonded to said first semiconductor substrate and including side walls of said recessed portions.

4. A back illuminated photodiode array according to claim 3, further comprising an etching stop layer existing between said first semiconductor substrate and said second semiconductor substrate and having resistance to a specific etching agent to be used for said second semiconductor substrate.

5. A back illuminated photodiode array according to claim 3, further comprising an insulation layer existing between said first semiconductor substrate and said second semiconductor substrate.

6. A back illuminated photodiode array according to claim 1, comprising a plurality of electrode pads each formed on a top surface of each said frame part and individually and electrically connected to each said second conductive type semiconductor region, respectively.

7. A back illuminated photodiode array according to claim 6, further comprising:
an electric insulation layer formed on each said frame part; and
a conductive member formed on said electric insulation layer and electrically connecting said second conductive type semiconductor regions with said electrode pads.

8. A back illuminated photodiode array according to claim 7, wherein said electric insulation layer is provided with a contact hole for connecting an end of said conductive member to said second conductive type semiconductor regions.

9. A back illuminated photodiode array according to claim 1, wherein each said second conductive type semiconductor region extends from the bottom of the respective recessed portion at which it is located to side surfaces of said respective recessed portion.

10. A back illuminated photodiode array according to claim 1, wherein each said second conductive type semiconductor regions extend from the bottom of the respective recessed portion at which it is located over side surfaces of said respective recessed portion to a top surface of the respective frame part framing said respective recessed portion.

11. A back illuminated photodiode array according to claim 10, comprising:
an electric insulation layer formed on each said frame part and having a contact hole opposing the top surface of each said frame part; and
electrode pads electrically connected to said second conductive type semiconductor regions through each said contact hole.

12. A back illuminated photodiode array according to claim 1, wherein each said frame part comprises a first conductive type separation region having a higher impurity concentration than said first conductive type semiconductor substrate.

13. A back illuminated photodiode array according to claim 1 wherein an opening size of said recessed portions decreases with an increase in the depth of said recessed portions.

14. A back illuminated photodiode array according to claim 1, wherein said light-incident surface side of said first conductive type semiconductor substrate is provided with a first conductive type accumulation layer having a higher impurity concentration than said first conductive type semiconductor substrate.

15. A back illuminated photodiode array according to claim 3, wherein mutually opposing surfaces of said first semiconductor substrate and said second semiconductor substrate are different in their crystal plane orientation.

16. A semiconductor device, comprising:
a back illuminated photodiode array according to claim 6; and
a wiring board supporting said back illuminated photodiode array,
wherein said wiring board is electrically connected to said back illuminated photodiode array through said electrode pads.

17. A semiconductor device according to claim 16, comprising a scintillator placed on said light-incident surface of said semiconductor substrate.

18. A semiconductor device according to claim 16, wherein resin or air is filled in a space between said wiring board and said opposite surface of said semiconductor substrate.

19. A manufacturing method for the back illuminated photodiode array according to claim 3, said manufacturing method comprising a step of bonding said second semiconductor substrate to said first semiconductor substrate.

20. A manufacturing method for the back illuminated photodiode array according to claim 19, the manufacturing method comprising a recessed portion forming step of forming a recessed portion by etching for forming a recessed portion corresponding region on said opposite surface of said second semiconductor substrate.

21. A manufacturing method for the back illuminated photodiode array according to claim 20, wherein the etching at said recessed portion forming step is carried out until an etching stop layer or an insulation layer existing between said first semiconductor substrate and said second semiconductor substrate is exposed.

22. A manufacturing method for the back illuminated photodiode array according to claim 20, wherein mutually opposing surfaces of said first semiconductor substrate and said second semiconductor substrate are different in their crystal plane orientation and the etching at said recessed portion forming step is carried out until at least the opposite surface of said first semiconductor substrate is exposed.

23. A manufacturing method for the back illuminated photodiode array according to claim 20,
wherein a step for forming said semiconductor region is provided with either
a post addition step in which, after said recessed portion forming step, impurities are doped to the bottoms of said recessed portions to form said semiconductor regions or
a previous addition step in which, before said recessed portion forming step, impurities are previously doped to the opposite surface of said first semiconductor substrate.

24. A manufacturing method for the back illuminated photodiode array according to claim 14, further comprising
a step for forming said accumulation layer higher in impurity concentration than said semiconductor substrate on said light-incident surface side.

25. A back-illuminated photodiode array comprising a semiconductor substrate, wherein only one side of said semiconductor substrate has a plurality of recesses, and wherein each shape of openings of said recesses is square.

26. A back illuminated photodiode array according to claim 1, wherein each said frame part has a top surface covered by a film on which a wiring layer is present, and a passivation film is present on at least a portion of the wiring layer that covers a portion of the film on the top surface of the frame part, such that the film, wiring layer and passivation film extend along a side of the frame part into the recess framed by the frame part.

27. A back-illuminated photodiode array according to claim 25, further comprising a plurality of frame parts, each framing one of said recesses, wherein each said frame part has a top surface covered by a film on which a wiring layer is present, and a passivation film is present on at least a portion of the wiring layer that covers a portion of the film on the top surface of the frame part, such that the film, wiring layer and passivation film extend along a side of the frame part into the recess framed by the frame part.

* * * * *